United States Patent [19]

Kato et al.

[11] Patent Number: 5,489,505

[45] Date of Patent: *Feb. 6, 1996

[54] SILVER HALIDE PHOTOGRAPHIC MATERIAL

[75] Inventors: Takashi Kato; Takanori Hioki; Tadashi Ikeda, all of Kanagawa, Japan

[73] Assignee: Fuji Photo Film Co., Ltd., Kanagawa, Japan

[ * ] Notice: The term of this patent shall not extend beyond the expiration date of Pat. No. 5,290,675.

[21] Appl. No.: 397,725

[22] Filed: Mar. 2, 1995

Related U.S. Application Data

[63] Continuation of Ser. No. 150,793, Nov. 12, 1993, abandoned, which is a continuation of Ser. No. 943,674, Sep. 11, 1992, abandoned.

[30] Foreign Application Priority Data

Sep. 13, 1991 [JP] Japan ..................... 3-261389

[51] Int. Cl.$^6$ ..................... G03C 1/20; G03C 1/28
[52] U.S. Cl. ..................... 430/584; 430/573; 430/576
[58] Field of Search ..................... 430/573, 576, 430/584

[56] References Cited

U.S. PATENT DOCUMENTS

| | | | |
|---|---|---|---|
| 5,126,235 | 6/1992 | Hioki | 430/584 |
| 5,154,995 | 10/1992 | Kawai | 430/576 |
| 5,290,675 | 3/1994 | Hioki et al. | 430/584 |
| 5,338,657 | 8/1994 | Kato | 430/584 |

FOREIGN PATENT DOCUMENTS 443466  8/1991  European Pat. Off. .

OTHER PUBLICATIONS

Slominskii et al., Zh. Org. Khim., 15(4), 865–8, 1979, English Translation pp. 774–777.

Slominskii et al., Ukr. Khim. Zh., 40(10), 1166–73, 1974, English Translation.

Slominskii et al., Zh. Nowehn. Prikl, Fotogr. Kinematogr., 35(6), 457–62, 1990.

Chemical Abstract 115:94405d with Registry Listing of Compound 135692–32–9.

Lenhard et al., "Electrochemical and Spectroscopic Analyses of the Thermodynamics of the Reversible Dimerization of Cyanine Radical Dications", *Journal of the American Chemical Society*, V. 109, No. 19, pp. 5805–5813.

*Primary Examiner*—Janet C. Baxter
*Attorney, Agent, or Firm*—Sughrue, Mion, Zinn, Macpeak & Seas

[57] ABSTRACT

A silver halide photographic material which contains methine dyes represented by formula (I) to obtain high sensitivity and excellent storage stability:

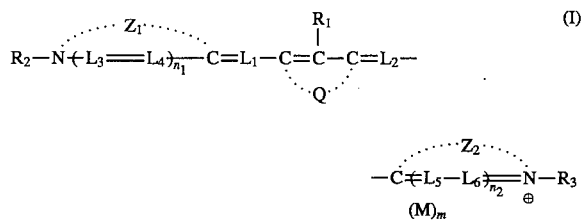

wherein $Z_1$ and $Z_2$ each represents atoms necessary to complete a 5- or 6-membered nitrogen-containing hetero ring; Q represents atoms necessary to complete a 5- or 6-membered ring; $R_1$ represents an alkyl group, an aryl group or a heterocyclyl group; $R_2$ and $R_3$ each represents an alkyl group; $L_1$, $L_2$, $L_3$, $L_4$, $L_5$ and $L_6$ each represents a methine group; $n_1$ and $n_2$ each represents 0 or 1; M represents an ion for neutralizing electric charges; and m is a number necessary for neutralization of electric charges in the dye molecule, including 0.

9 Claims, No Drawings

SILVER HALIDE PHOTOGRAPHIC MATERIAL

This is a continuation of application Ser. No. 08/150,793, filed Nov. 12, 1993, abandoned, which is a continuation of application Ser. No. 07/943,674, filed Sep. 11, 1992 (abandoned).

FIELD OF THE INVENTION

The present invention relates to a silver halide photographic material and, more particularly, to a cyanine dye having a special bridge group on its methine chain and a silver halide photographic material which contains the cyanine dye.

BACKGROUND OF THE INVENTION

The art of spectral sensitization is very important and essential for production of silver halide photographic materials which have high sensitivity and stability. Previously, a wide variety of spectral sensitizers have been developed, and there have also been technical development in the use of these spectral sensitizers, for example, the development of supersensitization combined therewith, methods of adding thereof, and so on.

Sensitizing dyes which have been known to be used for spectral sensitization include, for example, cyanine dyes, merocyanine dyes and rhodacyanine dyes. These spectral sensitizers are used independently or in combination (e.g., for the purpose of supersensitization).

Sensitizing dyes used for photographic materials are not only required to ensure high spectral sensitivities to photographic materials, but also should not cause an increase in fog, should have excellent exposure characteristics (e.g., latent-image stability, reciprocity law characteristic, temperature and humidity dependence upon exposure), should bring about slight changes in sensitivity, gradation and fog generation upon storage prior to exposure, should not remain in a photographic material after photographic processing, and so forth.

In particular, ensuring high spectral sensitivity and high storage stability to photographic materials is an essential requirement of spectral sensitizers, and therefore, numerous efforts have so far been made to fulfill these requirements. The results thereof are described, e.g., in JP-A-60-202436 (The term "JP-A" as used herein means an "unexamined published Japanese patent application"), JP-A-60-220339, JP-A-60-225147, JP-A-61-123834, JP-A-62-87953, JP-A-63-264743, JP-A-01-15534, JP-A-01-177533, JP-A-01-198743, JP-A-01-216342, JP-A-02-42, JP-B-60-57583 (The term "JP-B" as used herein means an "examined Japanese patent publication"), U.S. Pat. No. 4,618,570, and so on. However, the sensitivity and storage stability achieved were not fully satisfactory.

On the other hand, another important technique for silver halide photographic materials is to add various kinds of dyes with the intention of heightening sharpness and color separability.

As for the dyes whose methine chain is substituted by a bridge group at the 2- and 4-positions and further by an alkyl group at the 3-position, 2,2-dimethylpropylene-bridged dye (Dye A illustrated below) is known in *J. Am. Chem. Soc.*, volume 109, pages 5808–5813 (1987), and 2-methylpropylenebridged dye (Dye B illustrated below) in *UKr. Khim. Zh.*, volume 40, number 10, pages 1166 to 1173 (1974).

However, the above-cited dyes have never been examined under the condition of being incorporated in a silver halide emulsion, and their photographic properties in silver halide photographic materials have not been known at all.

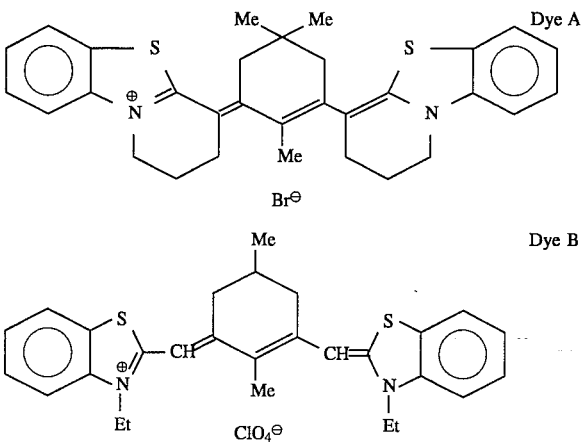

On the other hand, descriptions of supersensitization can be found in *Photographic Science and Engineering*, volume 13, pages 13 to 17 (1969), ibid., volume 18, pages 418 to 430 (1974), T. H. James *The Theory of the Photographic Process*, 4th edition, page 259 (1977), and so on. It is known that high sensitivity is feasible by properly choosing a sensitizing dye and a supersensitizer therefor.

SUMMARY OF THE INVENTION

Therefore, objects of the present invention are to provide a silver halide photographic material having high sensitivity and exhibiting only a slight change in sensitivity upon storage under a high temperature and/or high humidity condition, and to provide a dye-containing silver halide photographic material.

The above-described objects are attained with a silver halide photographic material which contains at least one methine dye represented by the following formula (I):

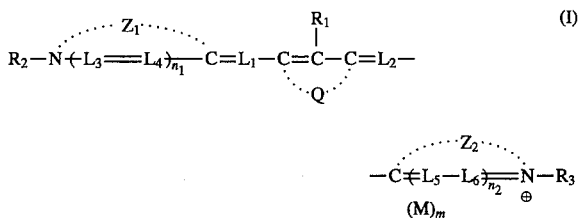

In the above formula (I), $Z_1$ and $Z_2$ each represents atoms necessary to complete a 5- or 6-membered nitrogen-containing hetero ring. Q represents atoms necessary to complete a 5- or 6-membered ring. $R_1$ represents an alkyl group, an aryl group or a heterocyclic group. $R_2$ and $R_3$ each represents an alkyl group. $L_1$, $L_2$, $L_3$, $L_4$, $L_5$ and $L_6$ each represents a methine group. $n_1$ and $n_2$ each represents 0 or 1.

M represents an ion for neutralizing electric charges, and m is a number necessary for neutralizing electric charges in the dye molecule which may include 0.

DETAILED DESCRIPTION OF THE INVENTION

The present invention is described below in detail.

Examples of nuclei completed by $Z_1$ and $Z_2$ respectively include thiazole nuclei (e.g., thiazole, 4-methylthiazole, 4-phenylthiazole, 4,5-dimethylthiazole, 4,5-diphenylthiazole); benzothiazole nuclei (e.g., benzothiazole, 4-chlorobenzothiazole, 5-chlorobenzothiazole, 6-chlorobenzothiazole, 5-nitrobenzothiazole, 4-methylbenzothiazole, 5-methylbenzothiazole, 6-methylbenzothiazole, 5-bromobenzothiazole, 6-bromobenzothiazole, 5-iodobenzothiazole, 5-phenylbenzothiazole, 5-methoxybenzothiazole, 6-methoxybenzothiazole, 5-ethoxybenzothiazole, 5-ethoxycarbonylbenzothiazole, 5-carboxybenzothiazole, 5-phenethylbenzothiazole, 5-fluorobenzothiazole, 5-chloro- 6-methylbenzothiazole, 5,6-dimethylbenzothiazole, 5,6-dimethoxybenzothiazole, 5-hydroxy-6-methylbenzothiazole, 5,6-dimethylthiobenzothiazole, 4-phenylbenzothiazole); and naphthothiazole nuclei (e.g., naphtho [2,1-d]thiazole, naphtho[1,2-d]thiazole, naphtho[ 2,3-d]thiazole, 5-methoxynaphtho[1,2-d]thiazole, 7-ethoxynaphtho[ 2,1-d]thiazole, 8-methoxynaphtho [2,1-d]thiazole, 5-methoxynaphtho[2,3-d]thiazole; thiazoline nuclei (e.g., thiazoline, 4-methylthiazoline, 4-nitrothiazoline); oxazole nuclei (e.g., oxazole, 4-methyloxazole, 4-nitroxazole, 5-methyloxazole, 4-phenyloxazole, 4,5-diphenyloxazole, 4-ethyloxazole); benzoxazole nuclei (e.g., benzoxazole, 5-chlorobenzoxazole, 5-methylbenzoxazole, 5-bromobenzoxazole, 5-fluorobenzoxazole, 5-phenylbenzoxazole, 5-methoxybenzoxazole, 5-nitrobenzoxazole, 5-trifluoromethylbenzoxazole, 5-hydroxybenzoxazole, 5-carboxybenzoxazole, 6-methylbenzoxazole, 6-chlorobenzoxazole, 6-nitrobenzoxazole, 6-methoxybenzoxazole, 6-hydroxybenzoxazole, 5,6-dimethylbenzoxazole, 4,6-dimethylbenzoxazole, 5-ethoxybenzoxazole); naphthoxazole nuclei (e.g., naphtho[2,1-d]-oxazole, naphtho[1,2d] oxazole, naphtho[2,3-d]oxazole, 5-nitronaphtho[2,1d] oxazole, oxazoline nuclei (e.g., 4,4-dimethyloxazoline); selenazole nuclei (e.g., 4-methylselenazole, 4-nitroselenazole, 4-phenylselenazole); benzoselenazole nuclei (e.g., benzoselenazole, 5-chlorobenzoselenazole, 5-nitrobenzoselenazole, 5-methoxybenzoselenazole, 5-hydroxybenzoselenazole, 6-nitrobenzoselenazole, 5-chloro-6-nitrobenzoselenazole, 5,6-dimethylbenzoselenazole); naphthoselenazole nuclei (e.g., naphtho[2,1-d]selenazole, naphtho[1,2-d]selenazole); selenazoline nuclei (e.g., selenazoline, 4-methylselenazoline); quinoline nuclei (e.g., 2-quinoline, 3-methyl-2-quinoline, 5-ethyl-2-quinoline, 6-methyl-2-quinoline, 6-nitro- 2-quinoline, 8-fluoro-2-quinoline, 6-methoxy-2-quinoline, 6-hydroxy-2-quinoline, 8-chloro-2-quinoline, 4-quinoline, 6-ethoxy-4-quinoline, 6-nitro-4-quinoline, 8-chloro-4-quinoline, 8-fluoro-4-quinoline, 8-methyl-4-quinoline, 8-methoxy-4-quinoline, 6-methyl-4-quinoline, 6-methoxy-4-quinoline, 6-chloro-4-quinoline); tellurazole nuclei (e.g., 5,6-dimethylbenzotellurazole); and so on.

The nuclei completed by $Z_1$ and $Z_2$ respectively are preferably benzothiazole, naphthothiazole, benzoxazole and naphthoxazole nuclei.

Q represents atoms necessary to complete a 5- or 6-membered ring, and comprises carbon, nitrogen, oxygen, sulfur, silicon, and selenium. Of these atoms, carbon and nitrogen atoms may have a substituent group. Suitable examples of such substituent groups include halogen atoms, hydroxyl groups, alkyl groups containing no more than 8 carbon atoms (e.g., methyl, ethyl, propyl, butyl), alkoxy groups containing no more than 8 carbon atoms (e.g., methoxy, ethoxy, benzyloxy, phenetyloxy), aryloxy groups containing no more than 15 carbon atoms (e.g., phenoxy), acyloxy groups containing no more than 8 carbon atoms (e.g., acetyloxy), acyl groups containing no more than 8 carbon atoms, sulfamoyl groups, aryl groups containing no more than 15 carbon atoms (e.g., phenyl, 4-methylphenyl, 4-chlorophenyl, 2-naphthyl), and heterocyclic groups containing no more than 15 carbon atoms (e.g., 2-pyridyl, 2-thiazolyl).

Q is preferably carbon atoms completing a 6-membered ring, with specific examples including a propylene group, a 2,2-dimethylpropylene group, a 2-methylpropylene group, a 2-ethylpropylene group, a 2-phenylpropylene group, a 2,2'-pyridylpropylene group, and the like.

Of these propylene groups, those in which only one hydrogen at the 2-position is substituted are preferred over others. As for the substituent group, alkyl and aryl groups are desirable.

$R_1$ preferably represents an alkyl group containing no more than 18 carbon atoms (e.g., methyl, ethyl, propyl, isopropyl, allyl, butyl, isobutyl, hexyl, octyl, dodecyl, octadecyl, etc., which may be substituted, e.g., by a carboxyl group, a sulfo group, a cyano group, a nitro group, a halogen atom, a hydroxy group, an alkoxy group containing no more than 8 carbon atoms (e.g., methoxy, ethoxy, benzyloxy, phenethyloxy), an aryloxy group containing no more than 15 carbon atoms (e.g., phenoxy), an acyloxy group containing no more than 8 carbon atoms (e.g., acetyloxy), an acyl group containing no more than 8 carbon atoms, a sulfamoyl group, a carbamoyl group, an aryl group containing no more than 15 carbon atoms (e.g., phenyl, 4-methylphenyl, 4-chlorophenyl, α-naphthyl)), an aryl group containing no more than 18 carbon atoms (e.g., phenyl, 2-naphthyl, 1-naphthyl, etc., which may be substituted, e.g., by a carboxyl group, a sulfo group, a cyano group, a nitro group, a halogen atom, a hydroxy group, an alkyl group containing no more than 8 carbon atoms (e.g., methyl, ethyl), an alkoxy group containing no more than 8 carbon atoms (e.g., methoxy, ethoxy), an aryloxy group containing no more than 15 carbon atoms (e.g., phenoxy), an acyloxy group containing no more than 8 carbon atoms (e.g., acetyloxy), an acyl group containing no more than 8 carbon atoms, a sulfamoyl group, a carbamoyl group, an aryl group containing no more than 15 carbon atoms (e.g., phenyl), or a heterocyclic group containing no more than 18 carbon atoms (e.g., 2-pyridyl, 2-thiazolyl, 2-furyl, etc., which may be substituted).

$R_1$ is preferably an unsubstituted alkyl group (e.g., methyl, ethyl, propyl, butyl) or an unsubstituted aryl group (e.g., phenyl, 1-naphthyl). In particular, methyl, ethyl and phenyl are favored as $R_1$.

$R_2$ and $R_3$ each preferably represents an alkyl group containing no more than 18 carbon atoms (e.g., methyl, ethyl, propyl, isopropyl, allyl, butyl, isobutyl, hexyl, octyl, dodecyl, octadecyl, etc., which may have the same substituent groups as those given as examples in the description of alkyl groups represented by $R_1$), and the total of carbon atoms contained in each of $R_2$ and $R_3$, including a substituent group they each have, is preferably 8 or less.

It is more preferable that $R_2$ and $R_3$ each should be an unsubstituted alkyl group (e.g., methyl, ethyl, propyl) or a sulfoalkyl group (e.g., sulfopropyl, sulfobutyl).

$L_1$, $L_2$, $L_3$, $L_4$, $L_5$ and $L_6$ each represents a methine group (which may be substituted, e.g., by an alkyl group (e.g., methyl, ethyl, 2-carboxyethyl), an aryl group (e.g., phenyl), a halogen atom (e.g., chlorine), an alkoxy group (e.g., methoxy, ethoxy), an amino group (e.g., N,N-diphenylamino, N-methyl-N-phenylamino, N-methylpiperazino)), and each may form a ring together with another methine group. Also, each methine group may combine with $R_2$ or $R_3$ to complete a ring.

$n_1$ and $n_2$ each represents 0 or 1.

The case $n_1=n_2=0$ is preferable.

M and m indicate the presence or absence of a cation or anion when it is necessary to render ionic charges in the dye neutral. Whether a dye is a cation or an anion, or whether or not it has a net ionic charge depends on an auxochrome and substituent groups contained therein.

Typical examples of cations include ammonium and alkali metal ions, although it does not matter whether an anion is inorganic or organic. Specific examples include halide anions (e.g., fluoride ion, chloride ion, bromide ion, iodide ion), substituted arylsulfonate ions (e.g., p-toluenesulfonate ion, p-chlorobenzenesulfonate ion), aryldisulfonate ions (e.g., 1,3-benzenedisulfonate ion, 1,5-naphthalenedisulfonate ion, 2,6-naphthalenedisulfonate ion), alkylsulfate ions (e.g., methylsulfate ion), sulfate ion, thiocyanate ion, perchlorate ion, tetrafluoroborate ion, picrate ion, acetate ion and trifluoromethanesulfonate ion. M may comprise at least two different kinds of ions for neutralization of charges.

Preferable anions are a perchlorate ion, iodide ion and substituted arylsulfonates (e.g., p-toluenesulfonate ion).

Of the compounds represented by formula (I) illustrated above, those represented by the following formula (II) are advantageous in particular.

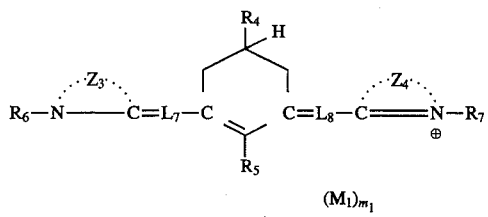

(II)

$(M_1)_{m_1}$

In the foregoing formula, $Z_3$ and $Z_4$ each represents atoms necessary to complete a benzothiazole or naphthothiazole ring. $R_4$ and $R_5$ each represents an alkyl group, an aryl group or a heterocyclic group. $R_6$ and $R_7$ each represents an alkyl group. $L_7$ and $L_8$ each represents a methine group. $M_1$ represents an ion for neutralizing electric charges, and $m_1$ is the necessary number ionic charges, which may include 0, for neutralizing electric charges in a dye molecule.

Formula (II) is described below in further detail.

The benzothiazole or naphthothiazole ring represented by $Z_3$ and $Z_4$ respectively may have substituent groups. Suitable examples of such substituent groups include those given for $Z_1$ and $Z_2$ in formula (I) above. In particular, electron donating groups such as methyl, methoxy, ethoxy and the like are preferred as the substituent groups. As for the position of substitution, the 5- and 6-positions of a benzothiazole ring and the 5-, 6- and 7-positions of a naphthothiazole ring are favorable.

$R_4$ and $R_5$ each represents an alkyl group, an aryl group or a heterocyclic group which have the same groups described above for $R_1$. As for $R_4$, an aryl group is preferred in particular, especially a phenyl group.

$R_6$ and $R_7$ each represents an alkyl group, which have the same meaning as $R_2$ and $R_3$ respectively, discussed above.

$L_7$ and $L_8$ each represents a methine group, which have the same substituents as $L_1$ to $L_6$ discussed above and each may combine with $R_6$ and $R_7$ to form a ring.

$M_1$ represents an ion for neutralizing electric charges and $m_1$ is the necessary number of charges, which may include 0, for neutralizing electric charges in the dye molecule, which have the same definition as M and m respectively, in formula (I) discussed above.

Specific examples of the present compound represented by formula (I) are illustrated below. However, the invention should not be construed as being limited to these examples.

| Compound No. | $R_a$ | $R_b$ | $R_c$ | X |
|---|---|---|---|---|

[Structure diagram with substituents $R_a$, $R_b$, $R_c$, X and Me group]

| | | | | |
|---|---|---|---|---|
| I-1 | H | H | Et | $I^\ominus$ |
| I-2 | Me | H | Et | $ClO_4^\ominus$ |
| I-3 | OEt | H | Et | $ClO_4^\ominus$ |
| I-4 | H | Cl | $(CH_3)_3SO_3^\ominus$ | $Na^\oplus$ |
| I-5 | $SO_3^\ominus$ | H | Et | $Na^\oplus$ |

-continued

| Compound No. | $R_a$ | $R_b$ | $R_c$ | X |
|---|---|---|---|---|

I-6

[Structure: bis-benzothiazolium cyclohexene dye with 4-pyridyl substituent, N-Et groups, I⁻ counterion, Me substituent]

I-7

[Structure: bis(6-chlorobenzothiazolium) cyclohexene dye with phenyl substituents, N-Me and N-(CH₂)₃SO₃⁻ groups]

[Structure for I-8 through I-12: bis-benzothiazolium gem-dimethyl cyclohexene dye with Me substituent, $R_a$, $R_b$ on benzo ring, $R_c$ on N]     X

| | | | | |
|---|---|---|---|---|
| I-8 | H | H | (CH₃)₃SO₃⁻— | Na⊕ |
| I-9 | Me | H | Et | ClO₄⁻ |
| I-10 | H | Cl | n-Pr | Br⁻ |
| I-11 | SMe | SMe | Et | I⁻ |
| I-12 | OEt | H | Et | ClO₄⁻ |

I-13

[Structure: bis-naphthothiazolium gem-dimethyl cyclohexene dye with Et substituent, N-Et groups, I⁻ counterion]

[Structure for I-14 through I-19: bis-benzothiazolium cyclohexene dye with Me substituents, $R_a$, $R_b$, $R_c$ as indicated]     X

| | | | | |
|---|---|---|---|---|
| I-14 | H | H | Me | ClO₄⁻ |
| I-15 | Me | H | Et | ClO₄⁻ |
| I-16 | OMe | H | Et | ClO₄⁻ |
| I-17 | SMe | SMe | Et | I⁻ |
| I-18 | OEt | H | Et | ClO₄⁻ |
| I-19 | SO₃⁻ | H | (CH₃)₃SO₃⁻ | Na⊕ |

-continued

| Compound No. | $R_a$ | $R_b$ | $R_c$ | X |
|---|---|---|---|---|
| I-21 | OMe | H | Et | $ClO_4^\ominus$ |
| I-22 | $SO_3^\ominus$ | H | $(CH_3)_4SO_3^\ominus$ | $Na^\oplus$ |
| I-23 | OEt | H | Et | $ClO_4^\ominus$ |
| I-24 | OMe | OMe | Et | $ClO_4^\ominus$ |
| I-25 | H | Cl | $(CH_3)_3SO_3^\ominus$ | $H^\oplus N(C_2H_5)_3$ |

I-20, I-26, I-27, I-28, I-29, I-30 shown as structural diagrams.

| Compound No. | $R_a$ | $R_b$ | $R_c$ | X |
|---|---|---|---|---|

I-31 [structure]

I-32 [structure]

I-33 [structure]

I-34 [structure]

I-35 [structure]

The polymethine dyes used in the present invention, which are represented by formula (I), can be synthesized according to methods described in the references cited below:

a) F. M. HAMER, *Heterocyclic Compounds-Cyanine Dyes and Related Compounds-*, John Wiley & Sons, New York and London (1964), b) D. M. STURMER, *Heterocyclic Compounds-Special Topics in Heterocyclic Chemistry-*, paragraph 4, chapter 8, pages 482–515, John Wiley & Sons, New York and London (1977), c) *Zh. Org. Khim.*, vol. 17, No. 1, pages 167–169 (1981); ibid., vol. 15, No. 2, pages 400 to 407 (1979); ibid., vol. 14, No. 10, pages 2214 to 2221 (1978); ibid., vol. 13, No. 11, pages 2440 to 2443 (1977); ibid., vol. 19, No. 10, pages 2134 to 2142 (1983); *UKr. Khim. Zh.*, vol. 40, No. 6, pages 625 to 629 (1974); *Khim. Geterotsikl. Soedin.*, No. 2, pages 175 to 178 (1976): Russian Patents 420,643 and 341,823; JP-A-59- 217761; U.S. Patents 4,334,000, 3,671,648, 3,623, 881 and 3,573,921; EP-A1-0288261, EP-A2-0102781, EP-A2- 0102781; JP-B-48-46930.

The time to add sensitizing dyes used in the present invention to silver halide emulsions may be at any stage of the emulsion-making process which has so far been recognized to be effective. More specifically, the addition may be carried out at any stage prior to the step of coating an emulsion, for instance, the stage of forming silver halide grains and/or prior to a desalting step, a desalting stage and/or a period between the end of desalting and the start of chemical ripening, as disclosed, e.g., in U.S. Pat. Nos. 2,735,766, 3,628,960, 4,183,756 and 4,225,666, JP-A-58- 184142 and JP-A-60-196749, or just before the start or during chemical ripening or between the conclusion of chemical ripening and the start of emulsion-coating, as disclosed in JP-A-58-113920 and so on.

Also, the addition may be carried out in other ways. For instance, one sensitizing dye alone, or together with another sensitizing dye differing in structure therefrom, is divided into portions and the portions are added in separate stages, for instance, during grain formation stage and during chemical ripening stage or after the conclusion of chemical ripening stage, or before the start or during chemical ripening stage and after the conclusion of chemical ripening stage.

The spectral sensitizing dyes represented by formula (I) are used in the present invention in an amount depending on the crystal form and the size of silver halide grains to be sensitized therewith. The amount thereof ranges from $4 \times 10^{-6}$ to $8 \times 10^{-3}$ mole per mole of silver halide. For instance, when the size of silver halide grains is within the range of 0.2 to 1.3 µm, it is desirable that the amount of sensitizing dyes added should range from $2 \times 10^{-8}$ to $3.5 \times 10^{-6}$ mole, particularly from $7.5 \times 10^{-8}$ to $1.5 \times 10^{-6}$ mole, per $m^2$ of surface area of the silver halide grains.

The sensitizing dyes used in the present invention can be dispersed directly into an emulsion. Also, they can be firstly dissolved in an appropriate solvent, such as methyl alcohol, ethyl alcohol, methyl cellosolve, acetone, water, pyridine or a mixture of at least two thereof, and then added to an emulsion. In dissolving the sensitizing dyes, ultrasonic waves can be used.

Further, there are many other processes which can be adopted in adding the sensitizing dyes. Examples thereof include one process disclosed, e.g., in U.S. Pat. No. 3,469,987, which comprises dissolving a sensitizing dye in a volatile organic solvent, dispersing the resulting solution into a hydrophilic colloid, and adding the thus obtained dispersion to an emulsion; another process as disclosed, e.g., in JP-B- 46-24185, which comprises dispersing a water-insoluble dye into an aqueous solvent without dissolving it, and adding the resulting dispersion to an emulsion; a further process as disclosed in U.S. Pat. No. 3,822,135, which comprises dissolving a sensitizing dye into a surface active agent, and adding the resulting solution to an emulsion; still another process as disclosed in JP-A-51-74624, which comprises dissolving a sensitizing dye with the aid of a red shift compound, and adding the resulting solution to an emulsion; and another process as disclosed in JP-A-50-80826, which comprises dissolving a sensitizing dye into a substantially water-free acid, and adding the resulting solution to an emulsion. Furthermore, processes as disclosed in U.S. Pat. Nos. 2,912,343, 3,342,605, 2,996,287 and 3,429,835 can be also employed for the addition of sensitizing dyes to an emulsion.

Moreover, the methine dyes of the present invention can be used in a variety of ways, including as filter dyes, irradiation inhibiting dyes or antihalation dyes for heightening sharpness, color separability and so on.

These methine dyes can be incorporated using a conventional manner into coating solutions for forming silver halide photographic layers, a filter layer and/or an antihalation layer. They are used in a sufficient amount to color the photographic layers. One skilled in the art can easily determine proper amounts depending on the purpose for which the dyes are used. In general it is preferable to use the dyes in such an amount as to impart an optical density ranging from 0.05 to 3.0 to the photographic material.

The dyes may be added at any step prior to the coating step.

In addition, the layer in which the dye ion is incorporated can contain, as a mordant, a polymer having an electric charge opposite in polarity to the dye ion, and the dye ion can be localized in a particular layer through interaction with the polymer.

Examples of such a mordant include those disclosed in U.S. Pat. Nos. 2,548,564, 4,124,386, 3,625,694, 3,958,995, 4,168,976 and 3,445,231.

When the polymethine dyes of the present invention are used to spectrally sensitize silver halide grains in the red or infrared region through M-band type sensitization, supersensitizing such dyes with a compound represented by the following formula (IV), (V), (VI), (VII), (VIIIa) or (VIIIb) can be used to advantage.

The supersensitizers represented by formula (IV), shown below, can especially enhance their supersensitizing effect by combining the supersensitizers of formula (IV) the supersensitizers represented by formula (V), (VI), (VII), (VIIIa), (VIIIb) or (VIIIc).

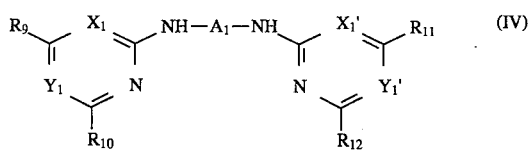

In the above formula (IV), $A_1$ represents a divalent aromatic group, and $R_9$, $R_{10}$, $R_{11}$ and $R_{12}$ each represents a hydrogen atom, a hydroxyl group, an alkyl group, an alkoxy group, an aryloxy group, a halogen atom, a hetero ring nucleus, an alkylthio group, a heterocyclylthio group, an arylthio group, an amino group, an alkylamino group, an arylamino group, a heterocyclylamino group, an aralkylamino group, an aryl group or a mercapto group. These groups each may be substituted. However, it is necessary for at least one of $A_1$, $R_9$, $R_{10}$, $R_{11}$ and $R_{12}$ to contain a sulfo group.

$X_1$, $Y_1$, $X_1'$ and $Y_1'$ each represents —CH= or —N=, provided that at least either $X_1$ or $Y_1$ and at least either $X_1'$ or $Y_1'$ represent —N=.

More specifically, it is desirable that $A_1$ in formula (VI) should be a divalent aromatic residue containing an —$SO_3M$ group (wherein M represents a hydrogen atom or a cation capable of rendering the compound soluble in water (e.g., $Na^+$, $K^+$)).

As the group —$A_1$—, one selected from the following —$A_2$— or —$A_3$— is advantageous. However, $A_1$ is selected from the class —$A_2$— when the group —$SO_3M$ is not contained in $R_9$, $R_{10}$, $R_{11}$ or $R_{12}$.

A₂-1: 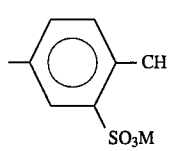
A₂-2: 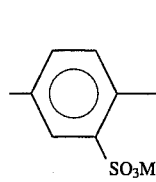
A₂-3: 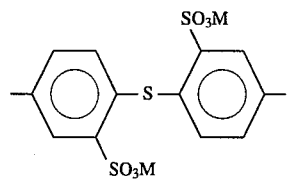

A₂-4: 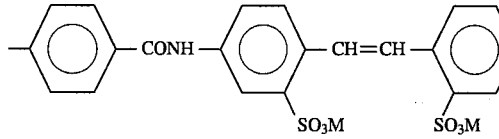
A₂-5: 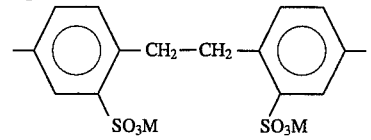

A₂-6: 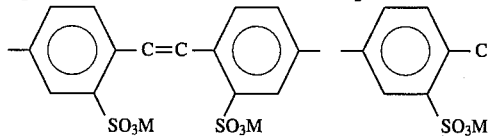
A₂-7: 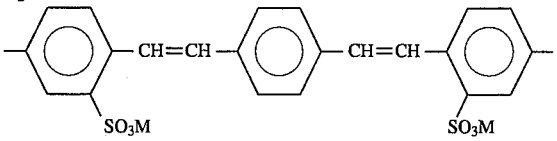

A₂-8: 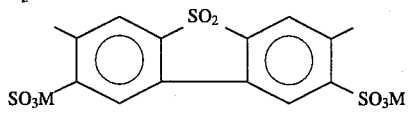
A₂-9: 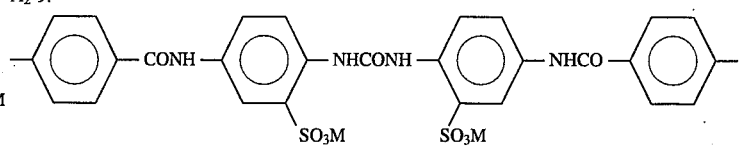

In the above, M represents a hydrogen atom or a cation capable of rendering the compound soluble in water.

-A₃-:

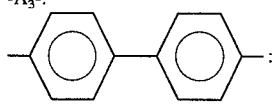 :

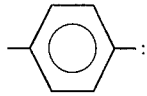 :

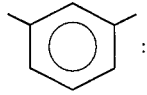 :

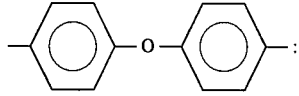 :

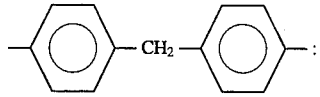 :

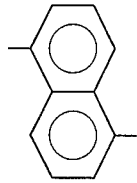 :

-continued

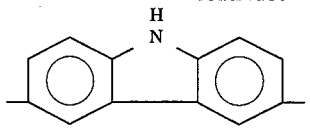

$R_9$, $R_{10}$, $R_{11}$ and $R_{12}$ each represents a hydrogen atom, a hydroxyl group, an alkyl group (preferably containing from 1 to 8 carbon atoms, with specific examples including methyl, ethyl, n-propyl and n-butyl), an alkoxy group (preferably containing from 1 to 8 carbon atoms, with specific examples including methoxy, ethoxy, propoxy and butoxy), an aryloxy group (e.g., phenoxy, naphthoxy, o-tolyloxy, p-sulfophenoxy), a halogen atom (e.g., Cl, Br), a hetero ring nucleus (e.g., morpholino, piperidyl), an alkylthio group (e.g., methylthio, ethylthio), a heterocyclylthio group (e.g., benzothiazolylthio, benzimidazolylthio, phenyltetrazolylthio), an arylthio group (e.g., phenylthio, tolylthio), an amino group, an alkylamino or substituted alkylamino group (e.g., methylamino, ethylamino, propylamino, dimethylamino, diethylamino, dodecylamino, cyclohexylamino, β-hydroxyethylamino, di-(β-hydroxyethyl)amino, β-sulfoethylamino), an arylamino or substituted arylamino group (e.g., anilino, o-sulfoanilino, m-sulfoanilino, p-sulfoanilino, o-toluidino, m-toluidino, p-toluidino, o-carboxyanilino, m-carboxyanilino, p-carboxyanilino, o-chloroanilino, m-chloroanilino, p-chloroanilino, p-aminoanilino, o-anisidino, m-anisidino, p-anisidino, o-acetaminoanilino, hydroxyanilino, disulfophenylamino, naphthylamino, sulfonaphthylamino), a heterocyclylamino group (e.g., 2-benzothiazolylamino, 2-pyridyl-amino), a substituted or unsubstituted aralkylamino group (e.g., benzylamino, o-anisylamino, m-anisylamino, p-anisylamino), an aryl group (e.g., phenyl), or a mercapto group.

$R_9$, $R_{10}$, $R_{11}$ and $R_{12}$ may be the same or different from one another. When —A₁— is selected from the class —A3—, it is necessary for at least one among $R_9$, $R_{10}$, $R_{11}$ and $R_{12}$ to contain at least one sulfo group (which may take the form of a free acid or salt, namely —$SO_3M$).

$X_1$, $Y_1$, $X_1'$ and $Y_1'$ each represents —CH= or —N=, but the case in which both $X_1$ and $X_1'$ are —CH= and both $Y_1$ and $Y_1'$ are —N= is preferable.

Specific examples of compounds represented by formula (IV) are set forth below. However, the invention should not be construed as being limited to these compounds.

(IV-1) Disodium 4,4'-bis[2,6-di(2-naphthoxy)pyrimidine-4-ylamino]stilbene-2,2'-disulfonate (IV-2) Disodium 4,4'-bis[2,6-di(2-naphthylamino)pyrimidine- 4-ylamino]stilbene-2,2'-disulfonate (IV-3) Disodium 4,4'-bis(2,6-dianilinopyrimidine-4-ylamino)stilbene-2,2'-disulfonate (IV-4) Disodium 4,4'-bis[2-(2-naphthylamino)-6-anilinopyrimidine- 4-ylamino]stilbene-2,2'-disulfonate (IV-5) Diethylammonium 4,4'-bis(2,6-diphenoxypyrimidine- 4-ylamino)stilbene-2,2'-disulfonate (IV-6) Disodium 4,4'-bis[2,6-di(benzimidazolyl- 2-thio)pyrimidine-4-ylamino]stilbene-2,2'-disulfonate (IV-7) Disodium 4,4'-bis[4,6-di(benzothiazolyl- 2-thio)pyrimidine-2-ylamino]stilbene-2,2'-disulfonate (IV-8) Disodium 4,4'-bis[4,6-di(benzothiazolyl- 2-amino)pyrimidine-2-ylamino]stilbene-2,2'-disulfonate (IV-9) Disodium 4,4'-bis[4,6-di(naphthyl-2-oxy)pyrimidine- 2-ylamino]stilbene-2,2'-disulfonate (IV-10) Disodium 4,4'-bis(4,6-diphenoxypyrimidine-2-ylamino)stilbene-2,2'-disulfonate (IV-11) Disodium 4,4'-bis(4,6-diphenylthiopyrimidine-2-ylamino)stilbene-2,2'-disulfonate (IV-12) Disodium 4,4'-bis(4,6-dimercaptopyrimidine-2-ylamino)biphenyl-2,2'-disulfonate (IV-13) Disodium 4,4'-bis(4,6-dianilinotriazine- 2-ylamino)stilbene-2,2'-disulfonate (IV-14) Disodium 4,4'-bis(4-anilino-6-hydroxytriazine-2-ylamino)stilbene-2,2'-disulfonate (IV-15) Disodium 4,4'-bis[4,6-di(naphthyl-2-oxy)pyrimidine- 2-ylamino]bibenzyl-2,2'-disulfonate (IV-16) Disodium 4,4'-bis(4,6-dianilinopyrimidine-2-ylamino)stilbene-2,2'-disulfonate (IV-17) Disodium 4,4'-bis[4-chloro-6-(2-naphthyloxy)pyrimidine- 2-ylamino]biphenyl-2,2'-disulfonate (IV-18) Disodium 4,4'-bis[4,6-di(1-phenyltetrazolyl-5-thio)pyrimidine-2-ylamino]stilbene-2,2'-disulfonate (IV-19) Disodium 4,4'-bis[4,6-di(benzimidazolyl- 2-thio)pyrimidine-2-ylamino]stilbene-2,2'-disulfonate (IV-20) Disodium 4,4'-bis(4-naphthylamino-6-anilinotriazine- 2-ylamino)stilbene-2,2'-disulfonate Of these specific examples, (IV-1) to (IV-6) are preferred over others, and (IV-I), (IV-2), and (IV-5) are advantageous in particular.

The compounds represented by formula (IV) are used in an amount of from 0.01 to 5 g per mole of silver halide, and an effective ratio of the amount thereof to the amount of a sensitizing dye used in combination therewith is within the range of 1/1 to 100/1, preferably 2/1 to 50/1, by equivalent. The combined use with the compound of formula (V) is preferred.

Compounds represented by formula (V) are described below.

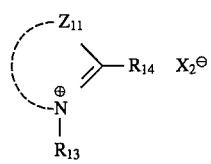
(V)

In the above formula (V), $Z_{11}$ represents a group of nonmetal atoms necessary to complete a 5- or 6-membered nitrogen-containing heterocyclic ring, which may be fused together with a benzene or naphthalene ring. Examples of such heterocyclic rings include thiazoliums {e.g., thiazolium, 4-methylthiazolium, benzothiazolium, 5-methylbenzothiazolium, 5-chlorobenzothiazolium, 5-methoxybenzothiazolium, 6-methylbenzothiazolium, 6-methoxybenzothiazolium, naphtho[1,2-d]thiazolium, naphtho[1,2-d]thiazolium}, oxazoliums {e.g., oxazolium, 4-methyloxazolium, benzoxazolium, 5-chlorobenzoxazolium, 5-phenylbenzoxazolium, 5-methylbenzoxazolium, naphtho[1,2-d] oxazolium}, imidazoliums (e.g., 1-methylbenzimidazolium, 1-propyl-5-chlorobenzimidazolium, 1-ethyl-5,6-dichlorobenzimidazolium, 1-allyl-5-trifluoromethyl-6-chloro-benzimidazolium), selenazoliums (e.g., benzoselenazolium, 5-chlorobenzoselenazolium, 5-methylbenzoselenazolium, 5-methoxybenzoselenazolium, naphtho[1,2-d] selenazolium), and so on.

$R_{13}$ represents a hydrogen atom, an alkyl group (preferably containing less than 8 carbon atoms, with specific examples including methyl, ethyl, propyl, butyl, pentyl), or an alkenyl group (e.g., allyl).

$R_{14}$ represents a hydrogen atom or a lower alkyl group (e.g., methyl, ethyl). Also, $R_{13}$ and $R_{14}$ may be a substituted alkyl group.

$X_2^-$ represents an acid anion (e.g., $Cl^-$, $Br^-$, $I^-$, $ClO_4^-$).

Of the above-cited heterocyclic rings, thiazoliums are advantageously used as $Z_{11}$. In particular, substituted or unsubstituted benzothiazoliums and naphthothiazoliums are preferred over others.

Additionally, the above-cited $Z_{11}$ groups may be substituted ones.

Specific examples of the compounds represented by formula (V) are illustrated below. However, the invention should not be construed as being limited to these compounds.

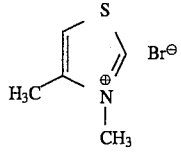
(V-1)

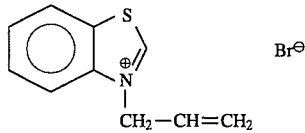
(V-2)

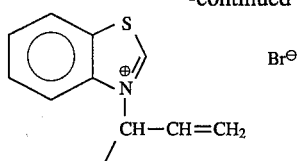 (V-3)

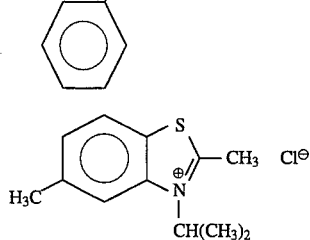 (V-4)

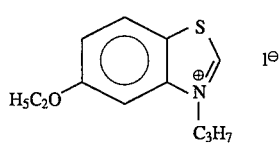 (V-5)

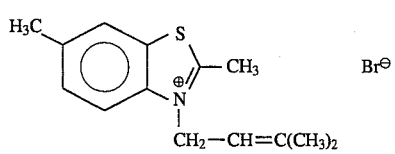 (V-6)

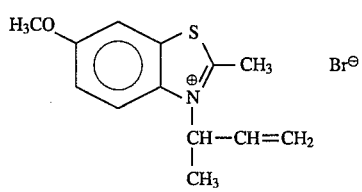 (V-7)

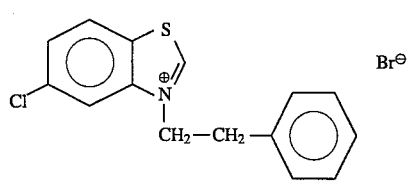 (V-8)

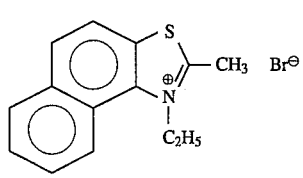 (V-9)

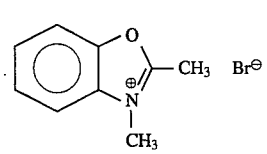 (V-10)

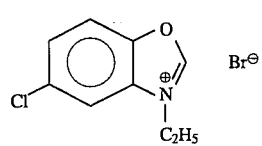 (V-11)

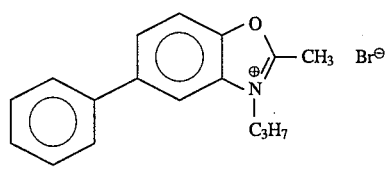 (V-12)

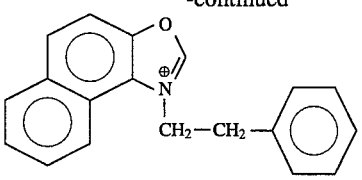 (V-13)

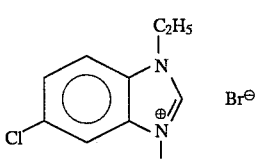 (V-14)

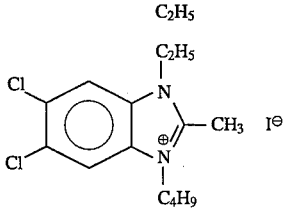 (V-15)

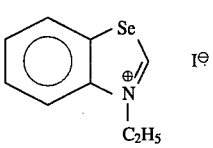 (V-16)

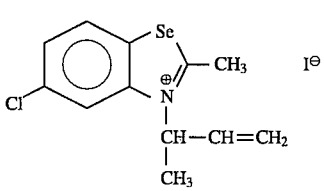 (V-17)

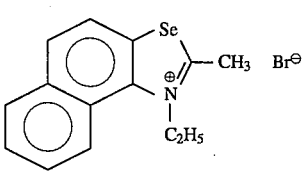 (V-18)

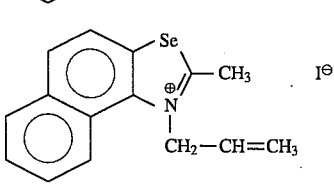 (V-19)

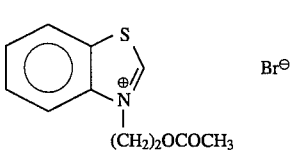 (V-20)

The compounds represented by formula (V) are advantageously used in an amount of from 0.01 to 5 g per mole of silver halide in the emulsion, and an effective ratio between the amount of the polymethine dye used, which is represented by formula (I), and that of the compound of formula (V) is within the range of 1:1 to 1:300, particularly 1:2 to 1:50, by weight.

The compounds represented by formula (V), which can be used in the present invention, can be dispersed into an emulsion directly or can be added to an emulsion after they are dissolved in an appropriate solvent (e.g., water, methyl alcohol, ethyl alcohol, propanol, methyl cellosolve, acetone) or a mixture of at least two thereof. Also, they can be added to an emulsion in the form of a solution or a dispersion in a colloid according to conventional methods for addition of sensitizing dyes.

The compounds represented by formula (V) may be added to an emulsion before or after the addition of the sensitizing dyes represented by formula (I). The compound of formula (V) and the sensitizing dye of formula (I) may be dissolved separately, and the separate solutions obtained may be added to an emulsion at the same time or after they are mixed together.

It is more advantageous to further combine the foregoing compound of formula (IV) with the combination of the present sensitizing dye represented by formula (I) and the compound of formula (V).

When a silver halide emulsion has a high chloride content and is spectrally sensitized in the infrared region, heterocyclic mercapto compounds used therein together with the supersensitizers represented by formula (IV) or (V) can contribute not only to an increase in sensitivity and prevention of fog but also stabilization of latent image and a marked improvement in the development dependence of the linearity gradient.

Such heterocyclic mercapto compounds are intended to include those which contain as a heterocyclic ring, e.g., a thiazole, oxazole, oxazine, thiazoline, selenazole, imidazole, indoline, pyrrolidine, tetrazole, thiadiazole, quinoline or oxadiazole ring and are substituted by a mercapto group. In particular, it is advantageous to further introduce a carboxyl, sulfo, carbamoyl, sulfamoyl or hydroxyl group into the foregoing compounds. Using mercaptoheterocyclic compounds as supersensitizers is already disclosed in JP-B-43-22883. In the present invention, heterocyclic mercapto compounds can produce considerable effects in prevention of fog and supersensitization, especially when used in combination with the compounds represented by formula (V). Of the mercapto compounds described above, those represented by the following formulae (VI) and (VII) are preferred in particular.

In the above formula, $R_{15}$ represents an alkyl group, an alkenyl group or an aryl group.

$X_3$ represents a hydrogen atom, an alkali metal atom, an ammonio group or a precursor thereof. Suitable examples of an alkali metal atom include a sodium atom and a potassium atom, and those of an ammonio group include a tetramethylammonio group and a trimethylbenzylammonio group. The term "a precursor thereof" refers to a group which can be converted to $X_3$=H or an alkali metal under an alkaline condition, with specific examples including an acetyl group, a cyanoethyl group and a methanesulfonylethyl group.

Alkyl and alkenyl groups represented by $R_{15}$ include unsubstituted ones, substituted ones and alicyclic ones. Specific examples of substituent groups which can be present in the substituted alkyl group include a halogen atom, nitro group, cyano group, hydroxyl group, an alkoxy group, an aryl group, an acylamino group, an alkoxycarbonylamino group, an ureido group, an amino group, a heterocyclic group, an acyl group, a sulfamoyl group, a sulfonamido group, a thioureido group, a carbamoyl group, an alkylthio group, a heterocyclylthio group, a carboxyl or its salt, and a sulfo or its salt.

The above-mentioned ureido, thioureido, sulfamoyl, carbamoyl and amino groups each include unsubstituted ones and those substituted by an alkyl or aryl group at the N-position. Suitable examples of an aryl group include unsubstituted and substituted phenyl groups. The phenyl group can be substituted with alkyl groups and the substituent groups given above as examples of those present in the substituted alkyl groups for $R_{15}$.

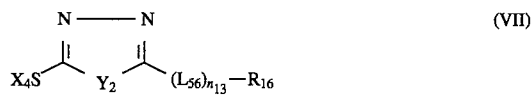

In the above formula, $Y_2$ represents an oxygen atom, a sulfur atom, >NH, or >N-$(L_{57})_{n14}$—$R_{17}$; $L_{56}$ and $L_{57}$ each represents a divalent linkage group; and $R_{16}$ and $R_{17}$ each represents a hydrogen atom, an alkyl group, an alkenyl group or an aryl group and have the same meanings as those represented by $R_{15}$ in formula (VI), respectively. $X_4$ has the same meaning as $X_3$ in formula (VI). $n_{13}$ and $n_{14}$ each represents 0 or 1.

Specific examples of a divalent linkage group represented by $L_{56}$ and $L_{57}$ in the foregoing formula include —$NR_{18}$—, —$NR_{19}CO$—, —$NR_{20}OSO_2$—, —$NR_{21}CONR_{22}$—, —$NR_{23}CSNR_{24}$—, —S—, —$CR_{25}H$—, —$CR_{26}R_{27}$—, and combinations of at least two thereof. $R_{18}$, $R_{19}$, $R_{20}$, $R_{21}$, $R_{22}$, $R_{23}$, $R_{24}$, $R_{25}$, $R_{26}$ and $R_{27}$ each represents a hydrogen atom, an alkyl group or an aralkyl group.

The compounds represented by formula (VI) or (VII) may be incorporated in any constituent layer of a silver halide photographic material, that is to say, in both light-sensitive and light-insensitive hydrophilic colloid layers.

The compounds represented by formula (VI) or (VII) are incorporated in a silver halide photographic material in an amount ranging from $1\times10^{-5}$ to $5\times10^{-2}$ mole, preferably from $1\times10^{-4}$ to $1\times10^{-2}$ mole, per more of silver halide. Also, they can be added, as an antifoggant, to a color developer, wherein they are used in an amount ranging from $1\times10^{-6}$ to $1\times10^{-3}$ mole/l, preferably from about $5\times10^{-6}$ to about $5\times10^{-4}$ mole/l.

Specific examples of the compounds represented by formulae (VI) and (VII) include the compounds illustrated at pages 4 to 8 of JP-A-62-269957. Of such compounds, those illustrated below are preferred in particular. Of course, the invention should not be construed as being limited to the following compounds.

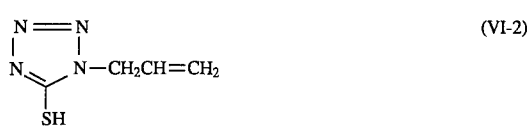

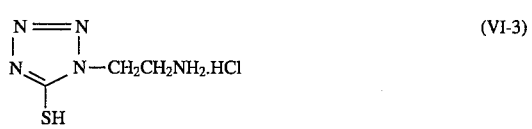

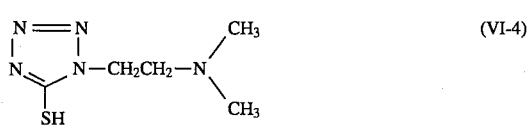

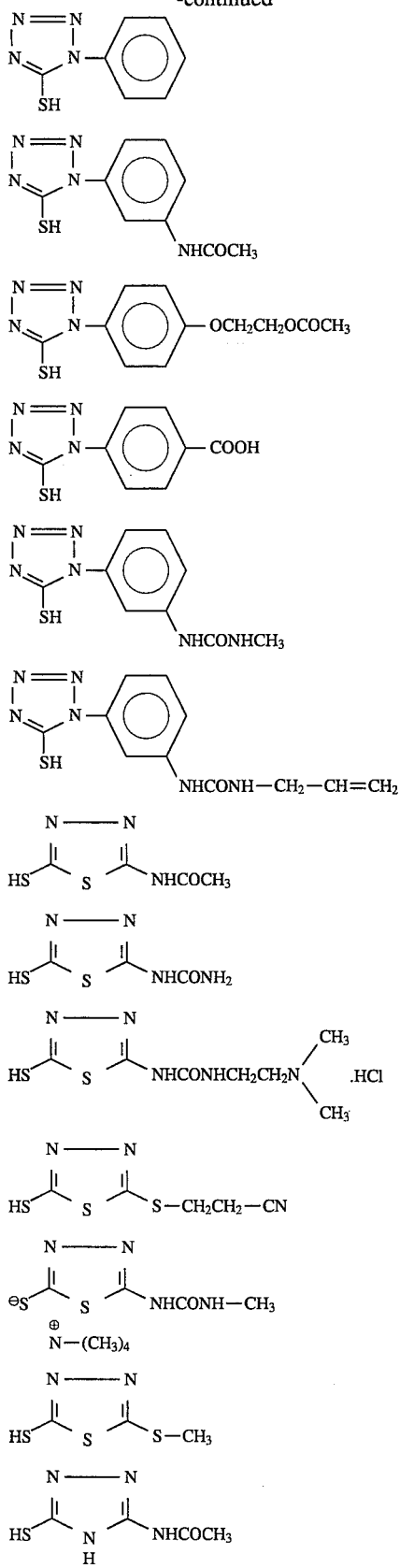
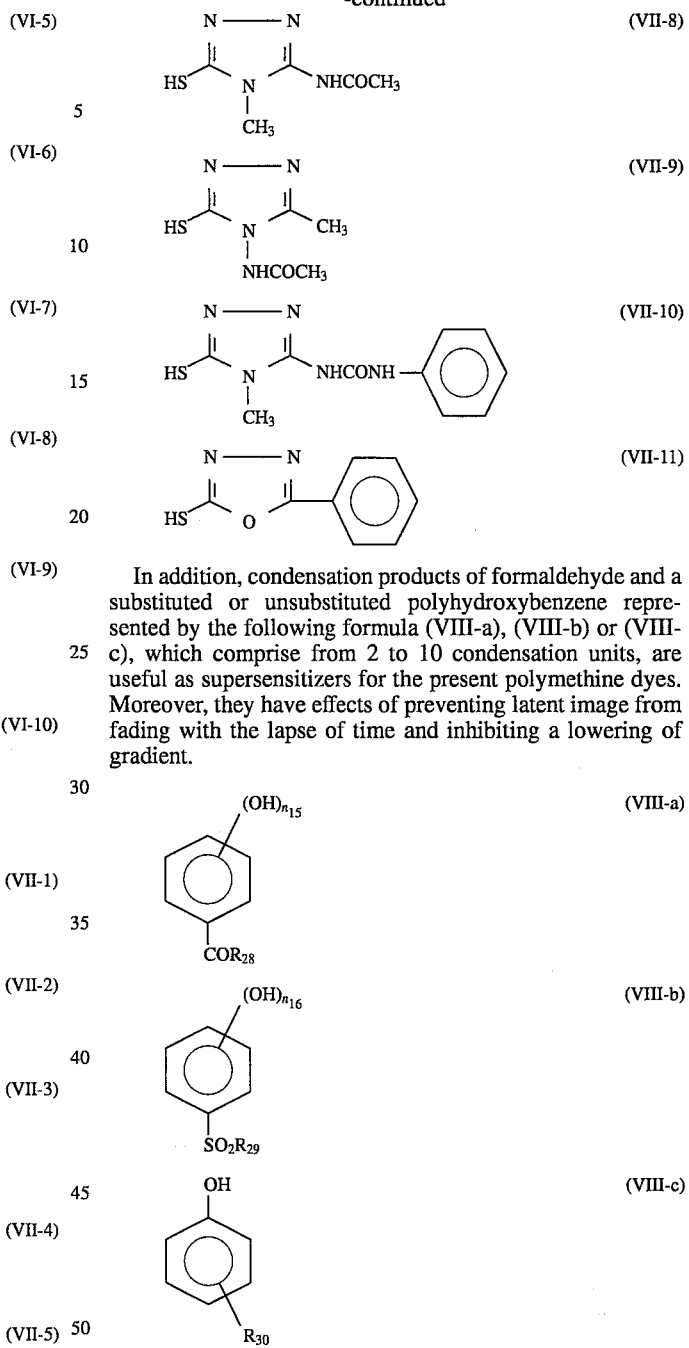

In addition, condensation products of formaldehyde and a substituted or unsubstituted polyhydroxybenzene represented by the following formula (VIII-a), (VIII-b) or (VIII-c), which comprise from 2 to 10 condensation units, are useful as supersensitizers for the present polymethine dyes. Moreover, they have effects of preventing latent image from fading with the lapse of time and inhibiting a lowering of gradient.

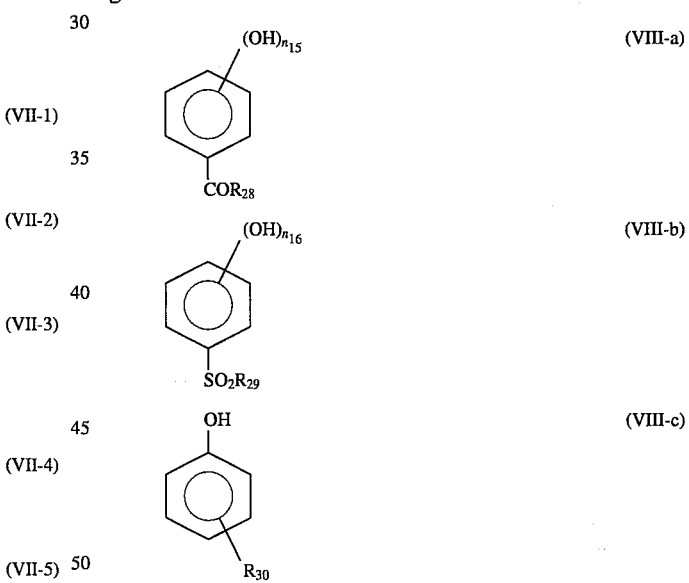

In the foregoing formulae, $R_{28}$ and $R_{29}$ each represents —OH, —OM', —OR$_{31}$, —NH$_2$, —NHR$_3$, —N(R$_{31}$)$_2$, —NHNH$_2$ or —NHNHR$_{31}$, wherein $R_{31}$ represents an alkyl group (containing 1 to 8 carbon atoms), an aryl group or aralkyl group. M' represents an alkali metal or an alkaline earth metal atom. $R_{30}$ represents OH or a halogen atom. $n_{15}$ and $n_{16}$ each represents 1, 2 or 3.

Specific examples of a substituted or unsubstituted polyhydroxybenzene which is a condensation component of the aldehyde condensates used in the present invention are given below. However, the invention should not be construed as being limited to these examples.

(VIII-1) β-resorcylic acid (VIII-2) γ-resorcylic acid
(VIII-3) 4-hydroxybenzoic acid hydrazide
(VIII-4) 3,5-dihydroxybenzoic acid hydrazide
(VIII-5) p-chlorophenol
(VIII-6) sodium hydroxybenzenesulfonate
(VIII-7) p-hydroxybenzoic acid
(VIII-8) o-hydroxybenzoic acid
(VIII-9) m-hydroxybenzoic acid
(VIII-10) p-dihydroxybenzene
(VIII-11) gallic acid
(VIII-12) p-hydroxybenzoic acid methylester
(VIII-13) o-hydroxybenzenesulfonic acid amide
(VIII-14) N-ethyl-o-hydroxybenzoic acid amide
(VIII-15) N-diethyl-o-hydroxybenzoic acid amide
(VIII-16) o-hydroxybenzoic acid 2-methylhydrazide More specifically, polyhydroxybenzenes as described above can be chosen from derivatives from the compounds represented by formulae (IIa), (IIb) and (IIc) disclosed in JP-B-49-49504.

The aldehyde condensates of the present invention are added in an amount ranging from $5\times10^{-5}$ to $5\times10^{-2}$ mole, preferably from $1\times10^{-4}$ to $1\times10^{-2}$ mole, per mole of silver halide.

Silver halide which can be used in the silver halide photographic material of the present invention may be any of silver bromide, silver iodobromide, silver chlorobromide and silver chloride. Those preferred in the present invention are silver bromide, silver chlorobromide, silver iodobromide, silver iodochlorobromide and the silver halides having a high chloride content as described in JP-A-02-42.

Further, constitutions which the photographic material of the present invention can have and photographic processing methods which can be used therefor are described below. The constitutions and photographic processing disclosed in JP-A-02-42 are applied advantageously to photographic materials comprising silver halides having a high chloride content. On the other hand, the constitutions and photographic processing disclosed in JP-A-63-264743 are used to advantage for photographic materials comprising silver chlorobromide.

Silver halide grains contained in the photographic material of the present invention may have a regular crystal form, such as that of a cube, a tetradecahedron or a rhombic dodecahedron; an irregular crystal form, such as that of a sphere, a tablet or so on; or a composite form thereof. Also, they may be a mixture of silver halide grains having various crystal forms.

As for the tabular grains used in the present invention, it is desirable that a proportion of grains having a thickness of below 0.5 micron, preferably below 0.3 micron, a diameter of preferably at least 0.6 micron and an average aspect ratio of at least 5 should be at least 50%, based on the projected area, to the whole grains present in an emulsion. In addition, monodispersed silver halide grains in which the number of 95% or more of the total grains has a grain size falling within the range of the average grain size ±40% may be used.

The interior and the surface of the silver halide grains may differ, or the silver halide grains may be uniform throughout. Further, not only grains of the kind which form latent images predominantly at the surface of the grains (e.g., for negative photographic materials) but also grains of the kind which mainly form latent image inside the grains (e.g., for internal latent-image photographic materials) and prefogged grains (e.g., for direct positive photographic materials) may be used in the present invention.

Various kinds of silver halide grains described above, which differ in halide composition, crystal habit, internal structure, shape and size distribution, are used in light-sensitive photographic materials (elements) depending upon the end-use.

The methine dyes of the present invention can be used as a sensitizer, sensitizing dye or filter dye, or for the purpose of antihalation, prevention of irradiation in light-sensitive materials and many other uses as described below. These dyes can be incorporated in not only light-sensitive emulsion layers but also interlayers, protective layers and backing layers, if desired.

The methine dyes of the present invention can be applied to various kinds of color and black-and-white silver halide photographic materials.

More specifically, the present methine dyes can be used for color positive photosensitive materials, color paper photosensitive materials, color negative photosensitive materials, color reversal photosensitive materials (with or without couplers), direct-positive silver halide photographic materials, graphic arts photographic materials (e.g., lith films, lith dupe films), photosensitive materials for recording a cathode-ray tube display, X-ray recording photosensitive materials (for radiography or fluorography, particularly using a screen), photosensitive materials for a silver salt diffusion transfer process, photosensitive materials for a color diffusion transfer process, photosensitive materials for a dye transfer process (imhibition process), photosensitive materials for a silver dye bleach process, heat developable photosensitive materials, and so on.

The silver halide photographic emulsions to be used in this invention can be prepared using methods as described in, for example, P. Glafkides, *Chemie et Phisique Photographique*, Paul Montel, Paris (1967); G. F. Duffin, *Photographic Emulsion Chemistry*, The Focal Press, London (1966); V. L. Zelikman et al., *Making and Coating Photographic Emulsion*, The Focal Press, London (1964); and so on.

In forming silver halide grains, a silver halide solvent such as ammonia, potassium thiocyanate, ammonium thiocyanate, thioethers (disclosed, e.g., in U.S. Pat. Nos. 3,271,157, 3,574,628, 3,704,130, 4,297,439 and 4,276,374), thione compounds (disclosed, e.g., in JP-A- 53-144319, JP-A-53-82408 and JP-A-55-77737), amine compounds (disclosed, e.g., in JP-A-54-100717), and so on may be employed.

In a process of producing silver halide grains or allowing the produced silver halide grains to ripen physically, cadmium salts, zinc salts, thallium salts, iridium salts or complexes, rhodium salts or complexes, iron salts or complexes and/or the like may be present.

Suitable examples of internal latent-image type silver halide emulsions which can be used in the present invention include conversion type silver halide emulsions, core/shell type silver halide emulsions and silver halide emulsions which contain foreign metals inside the grains, as disclosed, e.g., in U.S. Pat. Nos. 2,592,250, 3,206,313, 3,447,927, 3,761,276 and 3,935,014.

In general, the silver halide emulsions are chemically sensitized. Chemical sensitization can be carried out using processes described, e.g., in H. Friser, *Die Grundlagen der Photographischen Prozesse mit Silberhalogeniden*, pages 675 to 734, Akademische Verlagsgesellschaft (1968).

More specifically, a sulfur sensitization process using a compound containing sulfur capable of reacting with silver ions (e.g., thiosulfates, thioureas, mercapto compounds, rhodanines), or active gelatin; a selenium sensitization process; a reduction sensitization process using a reducing material (e.g., stannous salts, amines, hydrazine derivatives, formamidinesulfinic acid, silane compounds); and a sensitization process utilizing a noble metal compound (e.g., gold complexes, Group VIII metal complexes such as those of Pt, Ir, Pd, etc.) can be used individually or in combination.

The photographic emulsion used in this invention can contain a wide variety of compounds for the purpose of preventing fog or stabilizing photographic functions during production, storage, or photographic processing. Specifically, a great number of compounds known as antifoggants or stabilizers, including azoles such as benzothiazolium salts disclosed, e.g., in U.S. Pat. Nos. 3,954,478 and 4,942,721 and JP-A-59-191032, the ring cleavage products thereof disclosed in JP-B-59-26731, nitroindazoles, triazoles, benzotriazoles and benzimidazoles (especially nitro- or halogen-substituted ones); heterocyclic mercapto compounds such as mercaptothiazoles, mercaptobenzothiazoles, mercaptobenzimidazoles, mercaptothiadiazoles, mercaptotetrazoles (especially 1-phenyl-5-mercaptotetrazole) and mercaptopyrimidines; the above-mentioned heterocyclic mercapto compounds which further contain a water-soluble group such as carboxyl group, sulfo group or the like; thioketone compounds such as oxazolinethione; azaindenes such as tetraazaindenes (especially 4-hydroxy substituted 1,3,3a,7-tetraazaindene); benzenethiosulfonic acids; benzenesulfinic acid; acetylene compounds described in JP-A-62-87957 and so on, can be added for the foregoing purpose.

The silver halide photographic material of the present invention can contain color couplers, such as cyan, magenta and yellow couplers, and compounds for dispersing couplers.

Namely, the photographic material can contain compounds capable of forming colors by oxidative coupling with an aromatic primary amine developer (e.g., phenylenediamine derivatives, aminophenol derivatives) in color-development processing. For instance, the photographic material can contain a magenta coupler of 5-pyrazolone, pyrazolobenzimidazole, cyanoacetylcumarone or open-chain acylacetonitrile type, a yellow coupler of acylacetamide type (e.g., benzoylacetanilides, pivaroylacetanilides) and a cyan coupler of naphthol or phenol type. These couplers are preferably rendered nondiffusible by introducing a hydrophobic group functioning as a ballast group into a molecule. However, it does not matter whether they are two-equivalent or four-equivalent to silver ions. Further, colored couplers having a color correction effect or couplers capable of releasing a development inhibitor as development proceeds (so-called DIR couplers) may be incorporated in the photographic material.

In addition to DIR couplers, colorless DIR coupling compounds which can yield colorless products and release a development inhibitor upon coupling reaction may also be incorporated.

The photographic material of the present invention may contain, e.g., polyalkylene oxides and derivatives thereof, such as the ethers, the esters and the amines thereof, thioether compounds, thiomorpholines, quaternary ammonium salt compounds, urethane derivatives, urea derivatives, imidazole derivatives, 3-pyrazolidone derivatives and so on in order to increase the sensitivity and the contrast thereof, or in order to accelerate the developing rate thereof.

Besides the compounds represented by the foregoing formula (I), the silver halide photographic material of the present invention may contain various kinds of dyes as a filter dye, as an anti-irradiation dye or for other various purposes.

Specific examples of such dyes include oxonol dyes having a pyrazolone or barbituric acid nucleus as disclosed in British Patents 506,385, 1,177,429, 1,311,884, 1,338,799, 1,385,371, 1,467,214, 1,433,102 and 1,553,513, JP-A-48-85130, JP-A-49-114420, JP-A-52-117123, JP-A-55-161233, JP-A-59-111640, JP-B-39-22069, JP-B-43-13168, JP-B-62-273527, and U.S. Pat. Nos. 3,247,127, 3,469,985 and 4,078,933; other oxonol dyes as disclosed in U.S. Patents 2,533,427 and 3,379,533, British Patent 1,278,621, JP-A-01-134447 and JP-A-01-183652; azo dyes as disclosed in British Patents 575,691, 680,631, 599,623, 786, 907, 907,125 and 1,045,609, U.S. Pat. No. 4,255,326, and JP-A-59-211043; azomethine dyes as disclosed in JP-A-50-100116, JP-A-54-118247, and British Patents 2,014,598 and 750,031; anthraquinone dyes disclosed in U.S. Pat. No. 2,865,752; arylidene dyes as disclosed in U.S. Pat. Nos. 2,538,009, 2,688,541 and 2,538,008, British Patents 584, 609 and 1,210,252, JP-A-50-40625, JP-A-51-3623, JP-A-51-10927, JP-A-54-118247, JP-B-48-3286, and JP-B-59-37303; styryl dyes as disclosed in JP-B-28-3082, JP-B-44-16594, and JP-B-59-28898; triarylmethane dyes as disclosed in British Patents 446,583 and 1,335,422, and JP-A-59-228250; merocyanine dyes as disclosed in British Patents 1,075,653, 1,153,341, 1,284,730, 1,475,228 and 1,542,807; cyanine dyes as disclosed in U.S. Pat. Nos. 2,843,486 and 3,294,539, and JP-A-01-291247; and so on.

In order to inhibit the diffusion of such dyes, various methods described below can be used.

For instance, one method consists of incorporating as a mordant a hydrophilic polymer, having an electric charge opposite in polarity to dissociated anionic dyes, into the layer containing the anionic dyes, in order to confine them to the intended layer through the interaction between the mordant and the dyes, as disclosed in U.S. Pat. Nos. 2,548, 564, 4,124,386, 3,625,694, and so on.

Another method consists in dyeing a desired layer alone with a water-insoluble solid dye, as disclosed, e.g., in JP-A-56-12639, JP-A-55-155350, JP-A-55-155351, JP-A-63-27838, JP-A-63-197943 and European Patent 15,601.

Still another method consists in dyeing a desired layer alone with dye-adsorbed fine grains of a metal salt, as disclosed, e.g., in U.S. Pat. Nos. 2,719,088, 2,496,841, 2,496,843 and JP-A-60-45237.

The photographic material of the present invention may contain various kinds of surface active agents for a wide variety of purposes, e.g., as coating aids, and for prevention of electrification, improvement of slipping properties, emulsification and dispersion, prevention of adhesion and improvement of photographic characteristics (such as acceleration of development, increase in contrast, sensitization, etc.).

In an embodiment of the present invention, other additives can be used together with silver halide emulsions and other hydrophilic colloids. Examples of such additives include discoloration inhibitors, inorganic or organic hardeners, color fog inhibitors, ultraviolet absorbents, mordants, plasticizers, latex polymers and matting agents. Details of such additives are described, e.g., in *Research Disclosure*, vol. 176 (1978, XI), D-17643.

Hydrophilic polymers including gelatin are used as protective colloid in the photographic material of the present invention.

Finished silver halide emulsions and so on are coated on an appropriate support, such as baryta paper, resin-coated paper, synthetic paper, triacetate film, polyethylene terephthalate film, other plastic films or glass plate.

The exposure for obtaining photographic images may be carried out in a conventional manner. Any various known light sources including natural light (sun light), a tungsten lamp, a fluorescent lamp, a mercury lamp, a xenon arc lamp, a carbon arc lamp, a xenon flash lamp, cathode-ray tube flying spot and so on can be employed for the exposure.

Suitable exposure times which can be used include not only exposure times used commonly in cameras ranging from about $1/1000$ to about 1 sec., but also exposure times shorter than $1/1000$ sec., for example, about $1/10^4$ to about $1/10^6$ sec. as used with xenon flash lamps and cathode-ray tubes.

The spectral composition of the light employed for the exposure can be controlled using color filters, if desired. Laser beams can also be employed for the exposure. Moreover, the photographic material of the present invention may also be exposed to light emitted from phosphors excited by electron beams, X-rays, γ-rays, α-rays and the like.

The photographic processing for the photosensitive material of the present invention can be effected using any known processing method and any known processing solution as described in *Research Disclosure*, No. 176, pages 28 to 30 (RD-17643). This photographic processing may be either a photographic processing for forming a silver image (black and white photographic processing) or a color photographic processing comprising the development-processing to form dye images.

The processing temperature is generally in the range of about 18° C. to about 50° C. Of course, temperatures higher than about 50° C. or lower than 18° C. may be employed.

In another preferred embodiment, the photographic material of the present invention is used as a heat developable photosensitive material.

A heat developable photosensitive material applicable to the present invention has basically light-sensitive silver halide and a binder on a support. Further, it can optionally have a metal salt of an organic acid as an oxidizing agent, dye-providing compounds (which can also include reducing agents as described hereinafter) and so on.

These constituents are incorporated in the same layer in many cases, but can also be incorporated in separate layers as long as they can react with one another in such a condition. For instance, a colored dye-providing compound is incorporated into a layer disposed under a silver halide emulsion layer to prevent a lowering of sensitivity. As for the reducer, incorporation thereof into a heat developable photosensitive material is preferred, but it may be supplied from the outside, e.g., through diffusion from a dye-fixing material as described hereinafter.

In order to obtain various colors within the range of a chromaticity diagram using three primary colors, namely yellow, magenta and cyan colors, at least three silver halide emulsion layers which have their respective sensitivities in different spectral regions are used in combination. For example, a combination of a blue-sensitive layer, a green-sensitive layer and a red-sensitive layer, and a combination of a green-sensitive layer, a red-sensitive layer and an infrared-sensitive layer can be used. As for the arranging order of these sensitive layers, various orders known to be embodied in ordinary color photographic materials may be adopted. Those sensitive layers each may be divided into two or more constituent layers, if desired.

The heat-developable photosensitive material can include various auxiliary layers, such as a protective layer, a subbing layer, an interlayer, a yellow filter layer, an antihalation layer, a backing layer and so on.

Coverage of light-sensitive silver halides used in the present invention ranges from 1 mg/m$^2$ to 10 g/m$^2$ as silver.

In the heat-developable photosensitive material, metal salts of organic acids can be used as an oxidizing agent together with light-sensitive silver halides. Of the metal salts of organic acids, silver salts of organic acids are favored in particular.

Examples of organic compounds which can be used for producing silver salts functioning as an oxidizing agent include benzotriazoles, fatty acids and other compounds as described in U.S. Pat. No. 4,500,626, at columns 52–53. Also, silver salts of alkinyl group-containing carboxylic acids, such as silver phenylpropionate, disclosed in JP-A-60-113235, and silver acetylide disclosed in JP-A-61-249044 are useful. Such silver salts of organic acids may be used in combination with at least two thereof.

The above-described silver salts of organic acids can be used in an amount of from 0.01 to 10 moles, preferably from 0.01 to 1 mole, per mole of light-sensitive silver halide. An appropriate coverage of light-sensitive silver halides and that of silver salts of organic acids amount to from 50 mg/m$^2$ to 10 g/m$^2$ as silver in total.

As for the binders which can be used for constituent layers of the heat-developable photosensitive material and a dye-fixing material, hydrophilic ones are desirable. Suitable examples of such binders include those disclosed in JP-A-62-253159, at pages 26 to 28. More specifically, examples include transparent or translucent hydrophilic binders, with examples including natural compounds such as proteins, e.g., gelatin, gelatin derivatives and the like, and polysaccharides, e.g., cellulose derivatives, starch, gum arabic, dextran, pullutan and the like, and synthetic macromolecular compounds such as polyvinyl alcohol, polyvinyl pyrrolidone, acrylamide polymers and so on. In addition, polymers having high water-absorbing power as disclosed in JP-A-62-245260 and so on, namely a homopolymer of one vinyl monomer of the kind which contains —COOM or —SO$_3$M (wherein M represents a hydrogen or alkali metal atom), a copolymer of at least two vinyl monomers of the foregoing kind, and a copolymer of at least one vinyl monomer of the foregoing kind and other vinyl monomers (e.g., a copolymer of sodium methacrylate and ammonium methacrylate, such as Sumica Gel L-5H, produced by Sumitomo Chemical Co., Ltd.), can be used. These binders can, also be used in combination.

When adopting a system in which heat development is effected by supplying a slight amount of water, the use of the above-described highly water-absorbing polymers makes it feasible to achieve rapid absorption of water. Moreover, using highly water-absorbing polymers in a dye-fixing layer or other protective layers enables the prevention of retransfer of the transferred dyes from the dye-fixing element to other elements.

A suitable coverage of binders used in the present invention is 20 g/m$^2$ at most, preferably 10 g/m$^2$ at most, and particularly preferably 7 g/m$^2$ at most.

In constituent layers of the photosensitive material or the dye-fixing material (including a backing layer), various polymer latexes can be contained for the purposes of making improvements in physical properties as a film, e.g., for dimensional stabilization, prevention of curling, prevention of adhesion, prevention of cracking, prevention of sensitization or desensitization due to pressure, and so on. Specifically, any of the polymer latexes disclosed in JP-A-62-

245258, JP-A-62- 136648, JP-A-62-110066, and so on can be used. In particular, using polymer latexes having a low glass transition point (40° C. at the highest) in a mordanting layer can prevent the layer from cracking and, on the other hand, using polymer latexes having a high glass transition point in a backing layer can achieve excellent prevention of curling.

As for the reducing agent, those known in the field of heat developable photosensitive materials can be used. Therein, dye-providing compounds having reducing power, as described hereinafter, are included, too. In this case, such compounds can also be used together with other reducing agents. In addition, precursors of reducing agents, which themselves have no reducing power, but can exhibit reducing power through interaction with a nucleophilic reagent or heat in the course of development, can be used.

Specific examples of reducing agents which can be used in the present invention include the reducing agents and the precursors thereof disclosed in U.S. Pat. No. 4,500,626 (at columns 49-50), U.S. Pat. No. 4,483,914 (at columns 30-31), U.S. Pat. No. 4,330,617, U.S. Pat. No. 4,590,152, JP-A-60-140335 (at pages 17–18), JP-A-57-40245, JP-A-56-138736, JP-A-59-178458, JP-A-59- 53831, JP-A-59-182449, JP-A-59-182450, JP-A-60-119555, from JP-A-60-128436 to JP-A-60-128439, JP-A-60-198540, JP-A-60-181742, JP-A-61-259253, JP-A-62-244044, from JP-A-62-131253 to JP-A-62-131256, EP-A2-0220746 (at pages 78–96), and so on.

Also, combinations of various reducing agents disclosed in U.S. Pat. No. 3,039,869 can be used.

When reducing agents used are nondiffusible, they can be used in combination with electron transferrers and/or precursors thereof, if needed, in order to promote the electron transfer between the nondiffusible reducing agent and the developable silver halide.

Such electron transferrers or precursors thereof can be chosen from the above-cited reducing agents and their precursors. It is to be desired that the electron transferrers should have greater mobility than nondiffusible reducing agents (electron donors). Especially useful electron transferrers are 1-phenyl-3-pyrazolidones and aminophenols. As for the nondiffusible reducing agent (electron donor) used in combination with an electron transferrer, any of the above-cited ones can be employed as far as they are substantially immobile in constituent layers of the photosensitive material. Preferred reducing agents include hydroquinones, sulfonamidophenols, sulfonamidonaphthols, the compounds disclosed as electron donors in JP-A-53- 110827, and such dye-providing compounds as to be described below which are nondiffusible and have reducing power.

A suitable amount of the reducing agent added ranges from 0.01 to 20 moles, particularly from 0.1 to 10 moles, per mole of silver.

In the present invention, silver can be used as an image forming material. Also, there can be used dye-providing compounds, or compounds of the kind which form or release a diffusible dye corresponding or counter-corresponding to the progress of reduction from silver ion to silver under a high temperature condition.

There are many examples of dye-providing compounds which can be used in this invention. Firstly, compounds capable of forming dyes through oxidative coupling reaction (couplers) can be used. Such couplers may be either four-equivalent or two-equivalent, those of the two-equivalent type which contain a nondiffusible group as an eliminable group and form a diffusible dye through oxidative coupling reaction are preferred. Such a nondiffusible group may take the form of polymer chain.

Examples of color developers and couplers are described in detail, e.g., in T. H. James, *The Theory of The Photographic Process*, 4th edition, pp. 291–334 and pp. 354–361; JP-A-58-123533, JP-A-58-149046, JP-A-58- 149047, JP-A-59-111148, JP-A-59-124399, JP-A-59-174835, JP-A-59-231539, JP-A-59-231540, JP-A-60-2950, JP-A-60- 2951, JP-A-60-14242, JP-A-60-23474, JP-A-60-66249; and so on.

Examples of another type of dye-providing compounds are compounds which release imagewise a diffusible dye or which become imagewise diffusible. The compounds of this type can be represented by the following formula [LI]:

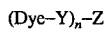

$$(\text{Dye}-\text{Y})_n-\text{Z} \qquad [\text{LI}]$$

(wherein Dye represents a dye moiety, a temporarily blue-shifted dye moiety, or a dye precursor moiety. Y represents a bond or a linkage group. Z represents a group with a property corresponding or counter-corresponding to a latent image present in the light-sensitive silver salt grains, and it can cause an imagewise change in diffusibility of the compound represented by $(\text{Dye}-\text{Y})_n-\text{Z}$, or can release imagewise the moiety Dye to produce a difference between the diffusibility of the released Dye and that of the compound $(\text{Dye}-\text{Y})_n-\text{Z}$. n represents 1 or 2, and when n is 2, two (Dye–Y)'s may be the same or different).

Specific examples of dye-providing compounds represented by formula (LI) are described in detail below by dividing them into the following classes from (1) to (5). Additionally, the compounds belonging to the following classes (1) to (3) form diffusible dye images, counter-corresponding to the distribution of developed silver halide (positive dye image) and, on the other hand, those belonging to the classes (4) and (5) form diffusible dye images corresponding to the distribution of developed silver halide (negative dye image).

(1) Developer dyes in which a hydroquinone type developing agent and a dye component are connected to each other, as disclosed in U.S. Pat. Nos. 3,134,764, 3,362,819, 3,597,200, 3,544,545 and 3,482,972, and so on. These developer dyes are diffusible under alkaline conditions, but become nondiffusible by reaction with silver halide.

(2) As disclosed in U.S. Pat. No. 4,503,137 nondiffusible compounds which can release a diffusible dye under alkaline conditions, but lose this ability when undergoing reaction with silver halide, can be used. Examples of such compounds include compounds disclosed in U.S. Pat. No. 3,980,479, which can release a diffusible dye by intramolecular nucleophilic substitution reaction; and compounds disclosed in U.S. Pat. No. 4,199,354, which can release a diffusible dye by the intramolecular rewinding reaction of an isooxazolone ring.

(3) Nondiffusible compounds which can release a diffusible dye by reaction with a reducing agent and remain unoxidized upon development, as disclosed in U.S. Pat. No. 4,559,290, European Patent 220,746A2, U.S. Pat. No. 4,783, 396, Japanese Published Technical Report (Kokai Giho) 87-6199, and so on.

Specific examples thereof include compounds which can release a diffusible dye through the intramolecular nucleophilic substitution reaction which takes place after they are reduced, as disclosed, e.g., in U.S. Pat. Nos. 4,139,389 and 4,139,379, JP-A-59-185333, and JP-A-57-84453; compounds which can release a diffusible dye through the intramolecular electron-transfer reaction which takes place after they are reduced, as disclosed, e.g., in U.S. Pat. No.

4,232,107, JP-A-59-101649, JP-A-61-88257, and RD 24025 (1984); compounds which can release a diffusible dye through single bond fission which takes place after they are reduced, as disclosed, e.g., in West German Patent 3,008, 588A, JP-A-56-142530, U.S. Pat. Nos. 4,343,893 and 4,619, 884; nitro compounds which can release a diffusible dye after electron acceptance, as disclosed, e.g., in U.S. Pat. No. 4,450,223; and compounds which can release a diffusible dye after electron acceptance, as disclosed, e.g., in U.S. Pat. No. 4,609,610.

More preferred examples of compounds belonging to class (3), include compounds having both an N-X bonding (X = an oxygen, sulfur or nitrogen atom) and an electron attracting group in a molecule, as disclosed in EP-A2-0220746, Japanese Published Technical Report (Kokai Giho) 87-6199, U.S. Pat. No. 4,783,396, JP-A-63- 201653, JP-A-63-201654, and so on; compounds having both a $SO_2$-X moiety (X=the same as described above) and an electron attracting group in a molecule, as disclosed in JP-A-1-26842; compounds having both a PO-X bonding (X=the same as described above) and electron attracting group in a molecule, as disclosed in JP-A-63- 27134; and compounds having both a C-X' bonding (X'= the same as X, or —$SO_2$—) and an electron attracting group in a molecule, as disclosed in JP-A-63-271341. In addition, the compounds disclosed in JP-A-1-161237 and JP-A-1-161342, which can release a diffusible dye by single bond fission which takes place after reduction due to the π-bond coupled to an electron accepting group, can be utilized.

Of the above-cited compounds, the compounds having both an N-X bond and an electron attracting group in a molecule are preferred in particular. Specific examples of such compounds include those exemplified as the compounds (1) to (3), (7) to (10), (12), (13), (15), (23) to (26), (31), (32), (35), (36), (40), (41), (44), (53) to (59), (64) and (70) in European Patent 220,746A2 or U.S. Pat. No. 4,783, 396; and those exemplified as the compounds (11)–(23) in Japanese Published Technical Report (Kokai Giho) 87-6199.

(4) Compounds which contain a diffusible dye moiety in their respective splitting-off groups and can release the diffusible dye through reaction with the oxidation product of a reducing agent (DDR couplers), with specific examples including those disclosed in British Patent 1,330,524, JP-B-48-39165, U.S. Pat. Nos. 3,443,940, 4,474,867 and 4,483, 914, and so on.

(5) Compounds which can reduce silver halide or organic silver salts and release a diffusible dye upon reduction (DRR compounds), which have an advantage in that they are free from image-staining trouble attributable to oxidative decomposition products of reducing agents because they require no other reducing agent. Typical representatives of such compounds are disclosed in U.S. Pat. No. 3,928,312, 4,053,312, 4,055,428 and 4,336,322, JP-A-59-65839, JP-A-59-69839, JP-A-53-3819, JP-A-51-104343, RD 17465, U.S. Pat. Nos. 3,725,062, 3,728,113 and 3,443,939, JP-A-58-116537, JP-A- 57-179840, U.S. Pat. No. 4,500,626, and so on. Specific examples of DRR compounds include those illustrated on columns 22 to 44 of the above-cited U.S. Pat. No. 4,500,626. In particular, compounds ( 1 ) to (3), (10) to (13), (16) to (19), (28) to (30), (33) to (35), (38) to (40), and (42) to (64) of U.S. Pat. No. 4,500,626 are preferred over others. Also, the compounds disclosed in U.S. Pat. No. 4,639,408, columns 37 to 39, are useful.

In addition to the above-described dye-providing compounds, including couplers and compounds represented by formula (LI), dye-silver compounds in which an organic silver salt is bound to a dye (as described in *Research Disclosure,* pp. 54–58 (May 1978)), azo dyes used for heat-developable silver dye bleach process (as disclosed, e.g., in U.S. Pat. No. 4,235,957, and *Research Disclosure,* pp. 30–32 (April 1976)), and leuco dyes (as disclosed, e.g., in U.S. Pat. Nos. 3,985, 565 and 4,022,617) can be used.

Hydrophobic additives such as dye-providing compounds, nondiffusible reducing agents and so on can be introduced into constituent layers of the photosensitive material using known methods, e.g., the method disclosed in U.S. Pat. No. 2,322,027. Therein, high boiling organic solvents as disclosed in JP-A-59-83154, JP-A-59-178451, JP-A-59-178452, JP-A-59-178453, JP-A-59- 178454, JP-A-59-178455, JP-A-59-178457 and so on can be used, if necessary, together with low boiling organic solvents having a boiling point of from 50° C. to 160° C.

High boiling organic solvents are used in an amount of 10 g at most, preferably 5 g at most, per 1 g of the dye-providing compounds used. On the other hand, they are used in an amount of 1 ml at most, preferably 0.5 ml at most, and particularly preferably 0.3 ml at most, per 1 g of binders used.

The dispersion methods utilizing polymers, which are disclosed in JP-B-51-39853 and JP-A-51-59943, can also be employed.

When compounds used as additives are substantially insoluble in water, they can be dispersed into a binder in the form of fine particles, besides using the above-described methods.

In dispersing hydrophobic compounds into a hydrophilic colloid, various kinds of surface active agents can be used. For instance, those cited as surface active agents in JP-A-59-157636, pages 37 to 38, can be used.

Compounds capable of activating development and stabilizing an image at the same time can be present in the photosensitive material of the present invention. Examples of such compounds are disclosed in U.S. Pat. No. 4,500,626, columns 51 to 52.

In the system wherein images are formed by diffusion transfer of dyes, a dye-fixing material is used in combination with a photosensitive material. The dye-fixing material and the photosensitive material may have the same or different supports. The relationship between the photosensitive material and the dye-fixing material, the relationship to a support and the relationship to a white reflecting layer, can be as described in U.S. Pat. No. 4,500,626, column 57.

A dye-fixing material which can be preferably used in this invention has at least one layer containing a mordant and a binder. The mordant can be appropriately selected from those known in the field of photography. Specific examples thereof include those disclosed in U.S. Pat. No. 4,500,629 (columns 58 to 59), JP-A-61-88256 (pages 32 to 41), JP-A-62-244043, JP-A-62- 244036, and so on. Also, dye-accepting high molecular compounds as disclosed in U.S. Pat. No. 4,463,079 may be used.

The dye-fixing material can be provided with auxiliary layers, including a protective layer, a peel-apart layer, an anti-curling layer and so on, if desired. In particular, it is of great advantage to provide a protective layer.

In the constituent layers of the photosensitive material and the dye-fixing material, a plasticizer, a slipping agent, or a high boiling organic solvent to facilitate the peeling of the dye-fixing element from the photosensitive element can be used. Specific examples of such agents include those disclosed in JP-A- 62-253159 (at page 25), JP-A-62-245253, and so on.

For the above-described purpose, every kind of silicone oil (including dimethylsilicone oil and modified silicone oils obtained by introducing various kinds of organic groups into dimethylsiloxane) can be used. For instance, various modified silicone oils described in *Gijutsu Siryo P6 to 18B*, entitled "Modified Silicone Oils", published by Shin-Etsu Silicone, Co., Ltd., especially carboxyl-modified silicone (X-22-3710, trade name), can be employed effectively.

Also, silicone oils disclosed in JP-A-62-215953 and JP-A-63-46449 are effective for that purpose.

Known discoloration inhibitors may be used in both the photosensitive material and the dye-fixing material. They include, e.g., antioxidants, ultraviolet absorbents, and certain metal complexes.

Suitable examples of antioxidants which can be used include chroman compounds, coumaran compounds, phenol compounds (e.g., hindered phenols), hydroquinone derivatives, hindered amine derivatives and spiroindane compounds. In addition, the compounds disclosed in JP-A-61-159644 are also effective.

Suitable examples of ultraviolet absorbents which can be used include benzotriazoles compounds (e.g., those disclosed in U.S. Pat. No. 3,533,794), 4-thiazolidone compounds (e.g., those disclosed in U.S. Pat. No. 3,352,681), benzophenone compounds (e.g., those disclosed in JP-A-46-2784), and the compounds disclosed in JP-A-54-38535, JP-A-62-136641 and JP-A-61-88256. In addition, the ultraviolet absorbing polymers disclosed in JP-A-62-260152 are used to advantage.

Suitable examples of metal complexes which can be used include the compounds disclosed in U.S. Pat. Nos. 4,241,155, 4,245,018 (columns 3 to 36), 4,254,195 (columns 3 to 8), JP-A-62-174741, JP-A-61-88256 (pages 27 to 29), JP-A-63-199248, JP-A-01-175568, JP-A-01-74272, and so on.

Other useful discoloration inhibitors are disclosed in JP-A-62-215272, from (125) to (137).

A discoloration inhibitor for preventing the dyes transferred into a dye-fixing material from discoloring may be incorporated in advance in the dye-fixing material, or may be supplied to the dye-fixing material from the outside, e.g., from a light-sensitive material.

The above-cited antioxidants, ultraviolet absorbents and metal complexes may be used in combination.

A brightening agent may be contained in the photosensitive material and the dye-fixing material. In particular, it is desirable that the brightening agent be incorporated in the dye-fixing material or should be supplied externally, e.g., from the photosensitive material. Suitable examples of such a brightening agent include compounds described, e.g., in K. Veenkataraman, *The Chemistry of Synthetic Dyes*, vol. V, chap. 8, JP-A- 61-143752, and so on. More specifically, stilbene compounds, coumarin compounds, biphenyl compound, benzoxazolyl compounds, naphthalimide compounds, pyrazoline compounds and carbostyryl compounds can be given as examples.

Such a brightening agent can be used in combination with discoloration inhibitors.

Examples of the hardener which can be used in constituent layers of the photosensitive material and the dye-fixing material include those disclosed in U.S. Pat. No. 4,678,739 (column 41), JP-A-59-116655, JP-A-62- 245261, JP-A-61-18942, and so on. More specifically, aldehyde hardeners (e.g., formaldehyde), aziridine hardeners, epoxy hardeners, vinylsulfone hardeners (e.g., N,N'-ethylenebis(vinylsulfonylacetamido)ethane), N-methylol hardeners (e.g., dimethylolurea), or polymeric hardeners (as disclosed in JP-A-62-234157) can be used.

In constituent layers of the photosensitive material and the dye-fixing material, various kinds of surface active agents can be used for many purposes, e.g., as coating aids, for improvements on peelability and slippability, for prevention of electrification, for acceleration of development, and so on. Specific examples of surface active agents are disclosed, e.g., in JP-A-62-173463 and JP-A-62-183457.

Also, organic fluorine-containing compounds may be contained in the photosensitive material or the dye-fixing material for the purpose of improvements upon slippability, antistatic property and peelability. Typical examples of organic fluorine-containing compounds include fluorine-containing surfactants as disclosed in JP-B-57-9053 (columns 8 to 17), JP-A-61- 20944, JP-A-62-135826 and so on, and hydrophobic fluorine compounds including oily fluorine compounds such as fluorocarbon oil, and solid fluorine compound resins such as tetrafluoroethylene resin, etc.

A matting agent can be used in the photosensitive material and the dye-fixing material. Specific examples of usable matting agents include silicon dioxide, the compounds disclosed in JP-A-61- 88256 (page 29), such as polyolefins, polymethacrylates, etc., and the compounds disclosed in JP-A-63-274944 and JP-A-63-274952, such as benzoguanamine resin beads, polycarbonate resin beads, AS resin beads, etc.

In addition to the above-described additives, thermal solvents, defoaming agents, antibacterial and antifungal agents, colloidal silica and so on may be contained in constituent layers of the photosensitive material and dye-fixing material. Concrete examples of such additives are described in JP-A-61-88256, pages 26 to 32.

In a preferred embodiment of the present invention, the photosensitive material and/or the dye-fixing material can contain accelerators for image formation. The image-formation accelerators have a function of accelerating the redox reaction between a reducing agent and silver salts as an oxidizing agent, a function of accelerating various reactions such as formation of dyes, the decomposition of dyes, the release of diffusible dyes from dye-providing substances and so on, a function of accelerating the transfer of dyes from light-sensitive layers into dye-fixing layers, and so on. From the viewpoint of physical chemistry, the image-formation accelerators can be classified into several groups, namely bases including precursors thereof, nucleophilic compounds, high boiling organic solvents (oils), thermal solvents, surfactants, compounds capable of interacting with silver or silver ion, and so on. However, substances classified into these groups generally have a multi-function, or have some of the above-described accelerating effects in combination. Details of these accelerators are described in U.S. Pat. No. 4,678,739, at columns 38–40.

The precursors of bases can be adopted from salts formed by bases and organic acids capable of undergoing decarboxylation upon heating, and from compounds capable of releasing amines through intramolecular nucleophilic substitution reaction, Lossen rearrangement or Beckmann rearrangement. Specific examples of such precursors are disclosed in U.S. Pat. No. 4,511,493, and JP-A-62-65038.

In a system of performing heat development and dye transfer at the same time in the presence of a small amount of water, it is desirable for heightening the stability of the photosensitive material that a base and/or a precursor thereof should be incorporated in the dye-fixing material.

In addition to the above-cited compounds, slightly soluble metal compounds and the combinations of slightly soluble metal compounds with compounds capable of forming a complex with metal ions constituting these slightly soluble metal compounds (called complexing compounds) disclosed in unexamined published European Patent 210,660 and U.S.

Pat. No. 4,740,445, and the compounds capable of producing bases by electrolysis disclosed in JP-A-61-232451 can be used as precursors of bases. In particular, the former method can produce a good effect. Therein, it is advantageous to add a slightly soluble metal compound and a complexing compound separately to the photosensitive material and the dye-fixing material.

In the photosensitive material and/or the dye-fixing material, various development stoppers can be used for the purpose of always providing images consistent in quality without being influenced by fluctuations in processing temperature and processing time upon development.

The term "development stopper" as used herein is intended to include compounds capable of stopping the development by quickly neutralizing or reacting with a base after correct development to lower the base concentration in the film, and compounds capable of restraining development through interaction with silver and silver salts. Specific examples of such compounds include acid precursors capable of releasing acids by heating, electrophilic compounds capable of undergoing a substitution reaction with a base by heating, nitrogen-containing heterocyclic compounds, and mercapto compounds and precursors thereof. Details of these compounds are described in JP-A-62-253159, pages 31 to 32.

Materials which can withstand processing temperatures are used in the present invention as the support for the photosensitive material and the dye-fixing material. In general, paper and synthetic polymer films can be used. More specifically, films of polyethylene terephthalate, polycarbonate, polyvinyl chloride, polystyrene, polypropylene, polyimide, celluloses (e.g., triacetyl cellulose), these films in which a pigment such as titanium oxide is dispersed, film process synthetic papers made, e.g., from polypropylene, paper made from a mixture of synthetic resin pulp (e.g., polyethylene pulp) and natural pulp, Yankee paper, baryta paper, coated paper (especially cast-coated paper), metals, cloths, glass and so on can be employed.

Those materials each can be used alone, or as a substrate which is laminated with a synthetic polymer film, such as a polyethylene film, on either side or both sides thereof.

In addition to the above-cited materials, the supports disclosed in JP-A-62-253159, pages 29 to 31, can also be used.

On the surface of a support as described above, a hydrophilic binder and an antistatic agent, e.g., a semiconductive metallic oxide such as alumina sol or tin oxide, and carbon black may be coated.

The photosensitive material and/or the dye-fixing material may assume such a form as to have a heat-evolving conductive layer as a heating means for heat development or diffusion transfer of dyes. Therein, transparent or opaque heat-evolving elements as disclosed, e.g., in JP-A-61-145544 can be used. Such a conductive layer can also function as an antistatic layer.

As for the heating temperature in the step of heat development, temperatures at which the development can be achieved are within the range of about 50° C. to about 250° C., but those ranging from about 80° C. to about 180° C. are used to advantage. The step of diffusion transfer of dyes may be carried out simultaneously with heat development, or subsequently to the conclusion of heat development. In the latter case, heating temperature in the transfer step may be within the range of the temperature of the heat development to room temperature, but preferably ranges from 50° C. to a temperature lower than the temperature used in the heat development step by about 10° C.

Although transfer of dyes can be caused by heating alone, a solvent may be used for promoting the transfer of dyes. In addition, as described in detail in JP-A-59-218443 and JP-A-61-238056, a method of carrying out the development and the transfer in the presence of a small amount of solvent (especially water) simultaneously or successively is also useful. In this form, heating temperature is preferably no lower than 50° C., and no higher than the boiling point of the solvent used. Temperatures ranging from 50° C. to 100° C. are desirable in the case of using water as solvent, for instance.

Examples of a solvent which can be used for accelerating development and/or transferring diffusible dyes into a dye-fixing layer include water, alkaline aqueous solutions containing inorganic alkali metal salts or organic bases (specific examples thereof include those cited as bases in the paragraph describing image formation accelerators). Also, low boiling solvents, or solvent mixtures of low boiling solvents with water or alkaline aqueous solutions can be used. Further, surfactants, antifoggants, slightly soluble metal salts, complexing compounds and so on may be contained in such solvents.

Those solvents can be used in either or both of the dye-fixing material and the photosensitive material. They can be effectively used in such a small amount as to be less than the weight of the solvent corresponding to the maximum swelling volume of the whole coated layers (especially, less than the amount remaining after deducting the weight of the whole coated layers from the weight of solvent corresponding to the maximum swelling volume of the whole coated layers).

A method of adding solvents to the photosensitive layer or the dye-fixing layer is disclosed in JP-A-61-147244 (at page 26). Also, solvents can be incorporated in advance in the photosensitive material and/or the dye-fixing material in the form of microcapsules.

Further, a method of incorporating a hydrophilic thermal solvent, which is a solid at ordinary temperature but melts at high temperatures, into the photosensitive material or the dye-fixing material can be adopted for the purpose of accelerating dye transfer. Such hydrophilic thermal solvents may be incorporated in either or both of the sensitive material and the dye-fixing material. A layer in which such solvents are incorporated may be an emulsion layer, an interlayer, a protective layer or a dye-fixing layer. In particular, it is preferred to incorporate them into a dye-fixing layer and/or an adjacent layer thereof.

Specific examples of a hydrophilic thermal solvent which can be used include ureas, pyridines, amides, sulfonamides, imides, alcohols, oximes, and other heterocyclic compounds.

Furthermore, high boiling organic solvents may be incorporated in advance in the photosensitive material and/or the dye-fixing material for the purpose of accelerating dye transfer.

Heating in the development step and/or the transfer step can be performed, e.g., by putting the material(s) on a heated block or plate, by bringing the material(s) into contact with a hot plate, a hot presser, a hot roller, a halogen lamp heater, an infrared or far infrared lamp heater or so on, or by making the material(s) pass through a high temperature atmosphere.

In superposing the dye-fixing material on the photosensitive material and bringing them into close contact with each other, the pressure-applying conditions and means disclosed in JP-A-61-147244 (at page 27) can be adopted.

Any of various heat development apparatuses may be used in the processing of the photographic elements relating to the present invention. For instance, those disclosed in JP-A-59-75247, JP-A-59-177547, JP-A-59-181353, JP-A-60-18951, and JP-A-U-62-25944 (The term "JP-A-U" as used herein means an "unexamined published Japanese utility model application) are used to advantage.

The present invention will now be illustrated in more detail by reference to the following examples, which should in no way be construed as limiting the invention, unless otherwise indicated, amounts are by weight.

EXAMPLE 1

Synthesis of Compound (I-3):

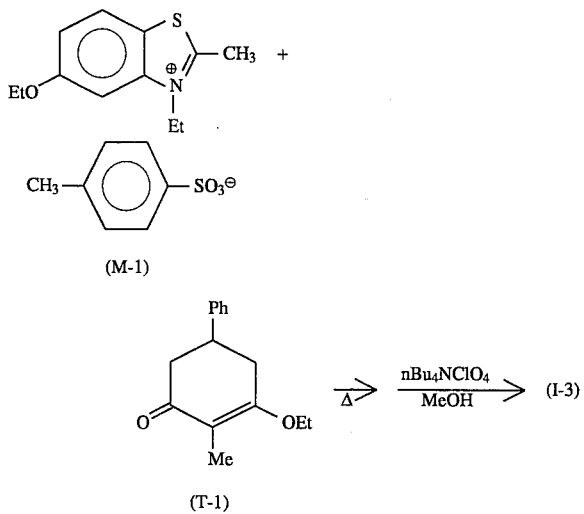

1.0 g of Compound (M-i) and 0.4 g of Compound (T-1) were heated to 140° C., and stirred for 4 hours. After cooling, the reaction mixture was purified by silica gel chromatography (eluent: chloroform/methanol mixture) to yield paratoluenesulfonate of the desired compound (I-3). Thereto, 30 ml of a methanol solution containing 0.4 g of tetra-n-butylammonium perchlorate was added to precipitate crystals. These crystals were filtered off to give 0.10 g of the desired compound (I- 3) Yield 11%, $\lambda_{max}$=666.1 nm (MeOH), $\epsilon$=2.26×10$^5$.

EXAMPLE 2

Synthesis of Compound (I-7):

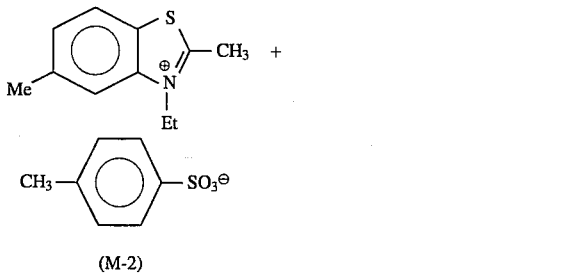

-continued
Synthesis of Compound (I-7):

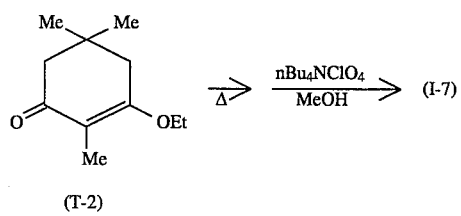

From 4.0 g of Compound (M-2) and 1.0 g of Compound (T-2), 0.15 g of the desired compound (I-7) was obtained according to the same procedures as used in Example 1. Yield 5%, $\lambda_{max}$=661.8 nm (MeOH), $\epsilon$= 2.39×10$^5$, m.pt. 269° C. (decomposed).

EXAMPLE 3

Synthesis of Compound (I-10):

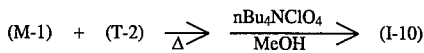

From 4.0 g of Compound (M-1) and 1.0 g of Compound (T-2), 0.20 g of the desired compound (I-10) was obtained according to the same procedures as used in Example 1 Yield 6%, $\lambda_{max}$=670.8 nm (MeOH), $\epsilon$= 2.65×10$^5$, m.pt. 272° C. (decomposed).

EXAMPLE 4

Synthesis of Compound (I-13):

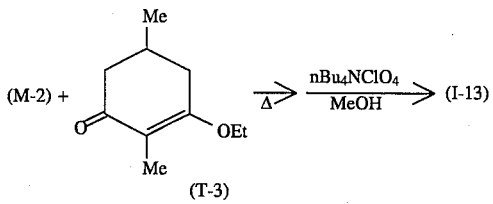

From 4.4 g of Compound (M-2) and 1.2 g of Compound (T-3), 0.20 g of the desired compound (1-13) was obtained according to the same procedures as used

EXAMPLE 6

Synthesis of Compound (I-16):

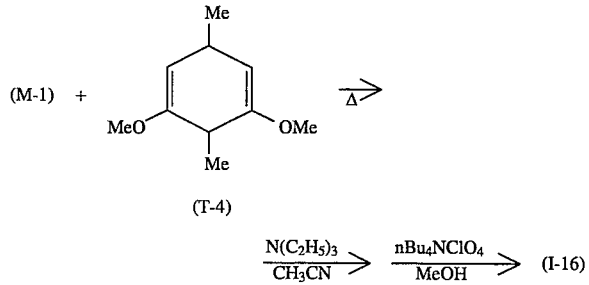

2.2 g of Compound (M-1) and 1.0 g of Compound (T-4) were heated to 140° C., and stirred for 30 seconds. After cooling, the reaction solution was admixed with 5 ml of acetonitrile and 1.0 g of Compound (M-1), and further with 1 ml of triethylamine, and the resulting mixture was stirred for 2 hours. The reaction mixture obtained was purified by silica gel chromatography (eluent: chloroform-methanol mixture) to yield paratoluenesulfonate of the desired compound (I-16). Thereto, 100 ml of a methanol solution containing 4.0 g of tetra-n-butylammonium perchlorate was added to precipitate crystals. These crystals were filtered off to give 1.2 g of the desired compound (I-16). Yield 46%, $\lambda_{max}$= 664.3 nm (MeOH), $\epsilon$=2.79×10$^5$, m.pt. 270° C. (decomposed). in Example 1. Yield 6%, $\lambda_{max}$=656.8 nm (MeOH), $\epsilon$= 2.53×10$^5$ m.pt. 243° C. (decomposed).

EXAMPLE 5

Synthesis of Compound (I-14):

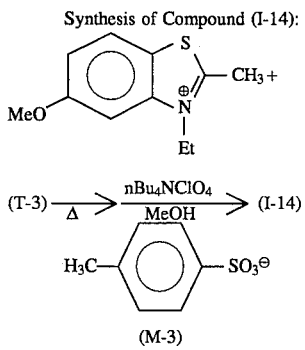

From 2.0 g of Compound (M-3) and 0.5 g of Compound (T-3), 0.11 g of the desired compound (I-14) was obtained according to the same procedures as used in Example 1. Yield 10%, $\lambda_{max}$=664.4 (MeOH), $\epsilon$= 2.53×10$^5$, m.pt. 272° C. (decomposed).

EXAMPLE 7

Synthesis of Compound (I-19):

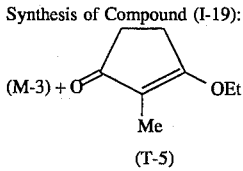

From 6.0 g of Compound (M-3) and 1.7 g of Compound (T-5), 0.6 g of the desired compound (I-19) was obtained according to the same procedures as used in Example 1. Yield 13%, $\lambda_{max}$=621.6 nm (MeOH), $\epsilon$= 2.92×10$^5$, m.pt. 289° C. (decomposed).

EXAMPLE 8

Synthesis of Compound (I-21):

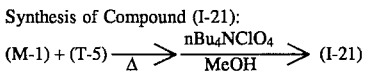

From 5.6 g of Compound (M-1) and 1.7 g of Compound (T-5), 0.6 g of the desired compound (I-21) was obtained according to the same procedures as used in Example 1. Yield 14%, $\lambda_{max}$=622.3 nm (MeOH), $\epsilon$= 3.21×10$^5$, m.pt. 282° C. (decomposed).

EXAMPLE 9

To 1,000 ml of distilled water, 32 g of lime-processed gelatin was added, and dissolved therein at 40° C. Thereto was added 3.3 g of sodium chloride, followed by heating to 60° C. Thereto, 3.2 ml of a 1% water solution of N,N'-dimethylimidazolidine-2-thione was further added. Subsequently, a solution containing 32.0 g of silver nitrate in 200 ml of distilled water and a solution containing 15.7 g of potassium bromide and 3.3 g of sodium chloride in 200 ml of distilled water were admixed with the foregoing solution over a 15-minute period as the mixture was kept at 60° C. Further, a solution containing 128.0 g of silver nitrate in 560 ml of distilled water and a solution containing 62.8 g of potassium bromide and 13.2 g of sodium chloride in 560 ml of distilled water were admixed therewith over a 20-minute period as the mixture was kept at 60° C. At the conclusion of the addition of the water solutions of silver nitrate and alkali halides, the reaction mixture was cooled to 40° C., desalted and washed with water. Furthermore, the reaction product was admixed with 90.0 g of lime-processed gelatin, adjusted to pAg 7.2 using sodium chloride. Then, 60.0 mg of each of the red-sensitive sensitizing dyes set forth in Table A and 2.0 mg of triethyl thiourea were added thereto, and it was chemically sensitized at 58° C. to the optimal extent. The thus obtained silver chlorobromide emulsions (bromide content: 70 mol %) were named Emulsions A-1 to A-10. Additionally, Emulsions A-1 to A-10 differed from one another in red-sensitive sensitizing dye alone, as shown in Table A, which was added prior to chemical sensitization.

In addition to the aforementioned emulsions, other emulsion were prepared as follows.

To 1,000 ml of distilled water, 32 g of lime-processed gelatin was added, and dissolved therein at 40° C. Thereto was added 3.3 g of sodium chloride, followed by heating to 60° C. Thereto, 3.2 ml of a 1% water solution of N,N'-dimethylimidazolidine-2-thione was added. Subsequently, a solution containing 32.0 g of silver nitrate in 200 ml of distilled water and a solution containing 11.0 g of sodium chloride in 200 ml of distilled water were admixed with the foregoing solution over a 8-minute period as the mixture was kept at 60° C. Further, a solution containing 125.6 g of silver nitrate in 560 ml of distilled water and a solution containing 41.0 g of sodium chloride in 560 ml of distilled water were admixed therewith over a 20-minute period as the mixture was kept at 60° C. After a 1-minute lapse from the end of the addition of the water solutions of silver nitrate and sodium chloride, each of the red-sensitive sensitizing dyes set forth in Table B was added in an amount of 60.0 mg. Each resulting mixture was kept at 60° C. for 10 minutes, and then cooled to 40° C. Thereto were further added over a 5-minute period a solution containing 2.4 g of silver nitrate in 20 ml of distilled water and a solution containing 1.35 g of potassium bromide and 0.17 g of sodium chloride in 20 ml of distilled water as the mixture was kept at 40° C. Thereafter, the resulting mixture was desalted and washed with water. Furthermore, the reaction product was admixed with 90.0 g of lime-processed gelatin, and adjusted to pAg 7.2 using sodium chloride. Then, the resulting mixture was admixed with 2.0 mg of triethyl thiourea and kept at 58° C. to undergo chemical sensitization to an optimal extent. The thus obtained silver chlorobromide emulsions (bromide content: 1.2 mol %) were named Emulsions B-1 to B-10. Additionally, Emulsions B-1 to B-10 differed from one another in red-sensitive sensitizing dye alone, as shown in Table B, which was added during the formation of silver halide grains.

The shape, size and size distribution of grains of the thus prepared twenty kinds of silver halide emulsions, A-1 to A-10 and B-1 to B-10, were examined using electron microscopic photographs. As a result, all the silver halide grains contained in the twenty kinds of emulsions had a cubic form. The grain size was represented by an average of diameters of the circles having the same areas as the projected areas of grains, and the grain size distribution was expressed in terms of the value obtained by dividing the standard deviation of grain sizes by the average grain size. Further, the silver halide crystals were examined by X-ray diffraction to determine the halide compositions of the crystals. These results are shown in Table A and Table B.

TABLE A

| Emulsion | Sensitizing Dye Compound No. | Shape | Grain Size (μm) | Size Distribution | Halide Composition of AgClBr Emulsion |
|---|---|---|---|---|---|
| A-1 | S-1 (Comparison) | cube | 0.15 | 0.10 | AgCl: 30% uniform throughout |
| A-2 | S-2 (Comparison) | cube | " | " | AgCl: 30% uniform throughout |
| A-3 | S-3 (Comparison) | cube | " | " | AgCl: 30% uniform throughout |
| A-4 | S-4 (Comparison) | cube | " | " | AgCl: 30% uniform throughout |
| A-5 | S-5 (Comparison) | cube | " | " | AgCl: 30% uniform throughout |
| A-6 | I-2 (Invention) | cube | " | " | AgCl: 30% uniform throughout |
| A-7 | I-9 (Invention) | cube | " | " | AgCl: 30% uniform throughout |
| A-8 | I-15 (Invention) | cube | " | " | AgCl: 30% uniform throughout |
| A-9 | I-3 (Invention) | cube | " | " | AgCl: 30% uniform throughout |
| A-10 | I-21 (Invention) | cube | " | " | AgCl: 30% uniform throughout |

TABLE B

| Emulsion | Sensitizing Dye Compound No. | Shape | Grain Size (μm) | Size Distribution | Halide Composition of AgClBr Emulsion |
|---|---|---|---|---|---|
| B-1 | S-1 (comparison) | cube | 0.52 | 0.08 | 100% AgCl phase and 10–39% AgBr localized phase |
| B-2 | S-2 (comparison) | cube | 0.52 | 0.08 | 100% AgCl phase and 10–39% AgBr localized phase |
| B-3 | S-3 (comparison) | cube | 0.52 | 0.08 | 100% AgCl phase and 10–39% AgBr localized phase |
| B-4 | S-4 (comparison) | cube | 0.52 | 0.08 | 100% AgCl phase and 10–39% AgBr localized phase |
| B-5 | S-5 (comparison) | cube | 0.52 | 0.08 | 100% AgCl phase and 10–39% AgBr localized phase |
| B-6 | I-2 (invention) | cube | 0.52 | 0.08 | 100% AgCl phase and 10–39% AgBr localized phase |
| B-7 | I-9 (invention) | cube | 0.52 | 0.08 | 100% AgCl phase and 10–39% AgBr localized phase |
| B-8 | I-15 (invention) | cube | 0.52 | 0.08 | 100% AgCl phase and 10–39% AgBr localized phase |
| B-9 | I-3 (invention) | cube | 0.52 | 0.08 | 100% AgCl phase and 10–39% AgBr localized phase |
| B-10 | I-21 (invention) | cube | 0.52 | 0.08 | 100% AgCl phase and 10–39% AgBr localized phase |

Comparative Dyes

| S-No. | $R_a$ | $R_b$ | V |
|---|---|---|---|
| S-1 | Ph | H | 5-Me |
| S-2 | Me | Me | 5-Me |
| S-3 | Me | H | 5-Me |
| S-4 | Ph | H | 5-OEt |

S-5

After the surfaces of a paper support laminated with polyethylene on both sides were subjected to a corona discharge treatment, a subbing layer made up of gelatin containing sodium dodecylbenzenesulfonate was provided thereon. Further thereon were coated various photographic constituent layers described below in this order to produce a multilayer color photographic paper. Coating solutions used were prepared in the following manners.

Preparation of Coating Solution for First Layer:

A mixture of 19.1 g of an yellow coupler (ExY), 4.4 g of a color image stabilizer (Cpd-1) and 0.7 g of a color image stabilizer (Cpd-7) was dissolved in a mixed solvent consisting of 27.2 ml of ethyl acetate, 4.1 g of a solvent (Solv-3) and 4.1 g of a solvent (Solv-7), and then dispersed in an emulsified condition into 185 ml of a 10% aqueous gelatin solution containing 8 ml of a 10% solution of sodium dodecylbenzenesulfonate. Thus, an emulsified dispersion A was prepared.

On the other hand, a blue-sensitive sensitizing dye illustrated below was added to a silver chlorobromide emulsion in an amount of $2\times10^{-4}$ mole/mole Ag.

Spectral sensitizing dyes used for the silver chlorobromide emulsion of each light-sensitive emulsion layer are illustrated below.

Sensitizing Dye A for Blue-sensitive Emulsion Layer:

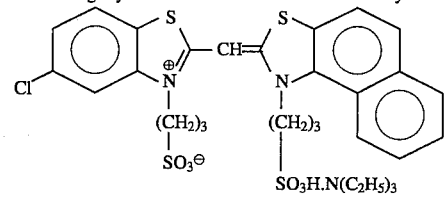

($2.0 \times 10^{-4}$ mol/mol of silver halide)

Sensitizing Dye B for Blue-sensitive Emulsion Layer:

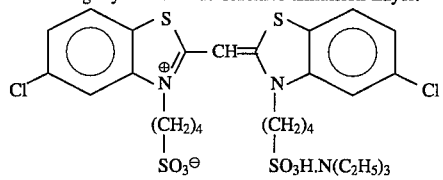

($2.0 \times 10^{-4}$ mol/mol of silver halide)

Sensitizing Dye C for Green-sensitive Emulsion Layer:

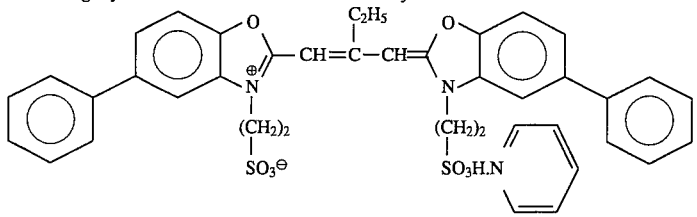

($4.0 \times 10^{-4}$ mol/mol of silver halide)

Sensitizing Dye D for Green-sensitive Emulsion Layer:

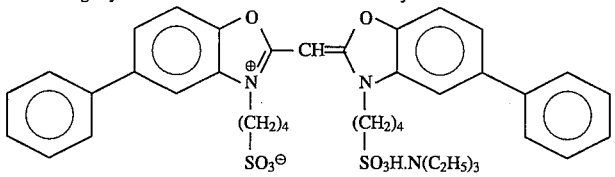

($4.0 \times 10^{-4}$ mol/mol of silver halide)

The silver chlorobromide emulsion used herein was a silver chlorobromide emulsion having a bromide content of 70 mol % (Ag content: 70 g per kg of emulsion) when the silver halide emulsion used in the fifth layer was selected from the foregoing emulsions A-1 to A-10, while it was a silver chlorobromide emulsion having a bromide content of 0.8 mol % (Ag content: 70 g per kg of emulsion) when the silver halide emulsion used in the fifth layer was selected from the foregoing emulsions B-1 to B-10.

The aforementioned emulsified dispersion A was mixed homogeneously with such a silver chlorobromide emulsion, and thereto were added other ingredients described below so as to obtain the coating solution for the first layer having the composition described below.

Coating compositions of from the second to seventh layers were prepared in a similar manner to that for the first layer. In every layer, sodium salt of 1-oxy- 3,5-dichloro-s-triazine was used as gelatin hardener.

Furthermore, preservatives (Cpd-10) and (Cpd-11) were added to every constituent layer so as to have total coverages of 25.0 mg/m² and 50.0 mg/m², respectively.

Compound (VI-9) was further added to the blue-sensitive emulsion layer and the green-sensitive emulsion layer in amounts of $8.5\times10^{-5}$ mole and $7.7\times10^{-4}$ mole, respectively, per mole of silver halide.

To the blue-sensitive and the green-sensitive emulsion layers was furthermore added 4-hydroxy-6-methyl- 1,3,3a,7-tetrazaindene in amounts of $1\times10^{-4}$ mole and $2\times10^{-4}$ mole, respectively, per mole of silver halide.

Also, the dyes illustrated below (each figure in parentheses represents the coverage of the corresponding dye) were added to each emulsion layer in order to prevent the irradiation phenomenon.

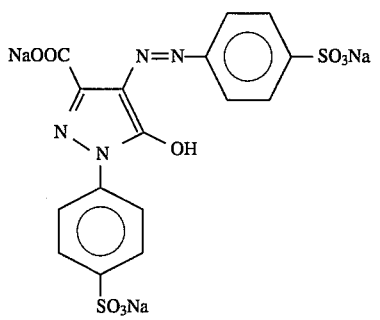

(10 mg/m²)

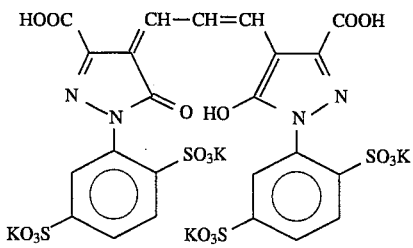

(10 mg/m²)

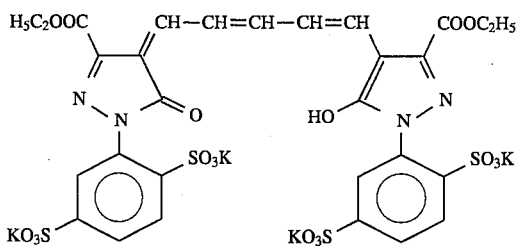

(40 mg/m²)

and

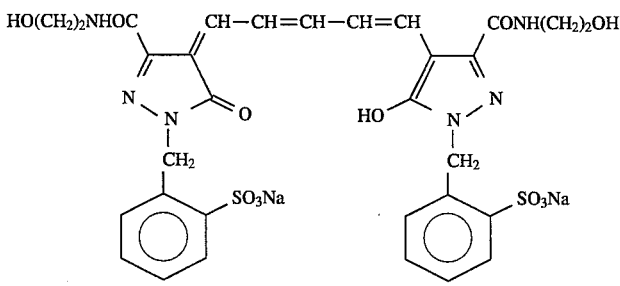

(20 mg/m²)

Layer Constitution

The composition of each constituent layer is described below. Each figure on the right side represents the coverage (g/m²) of the ingredient corresponding thereto. As for the silver halide emulsions, the figure on the right side represents the coverage based on silver.

Support:

Polyethylene-laminated paper [which contained a white pigment (TiO₂) and a bluish dye (ultramarine) in the polyethylene on the side of the first layer]

First layer (Blue-sensitive emulsion layer):

| | |
|---|---|
| Silver chlorobromide emulsion described above | 0.30 |
| Gelatin | 1.86 |
| Yellow coupler (ExY) | 0.82 |
| Color image stabilizer (Cpd-1) | 0.19 |

| | |
|---|---|
| Solvent (Solv-3) | 0.18 |
| Solvent (Solv-7) | 0.18 |
| Color image stabilizer (Cpd-7) | 0.06 |
| Second layer (Color stain inhibiting layer): | |
| Gelatin | 0.99 |
| Color stain inhibitor (Cpd-5) | 0.08 |
| Solvent (Solv-1) | 0.16 |
| Solvent (Solv-4) | 0.08 |
| Third layer (Green-sensitive emulsion layer): | |
| Silver chlorobromide emulsion described above | 0.12 |
| Gelatin | 1.24 |
| Magenta coupler (ExM) | 0.23 |
| Color image stabilizer (Cpd-2) | 0.03 |
| Color image stabilizer (Cpd-3) | 0.16 |
| Color image stabilizer (Cpd-4) | 0.02 |
| Color image stabilizer (Cpd-9) | 0.02 |
| Solvent (Solv-2) | 0.40 |
| Fourth layer (Ultraviolet absorbing layer): | |
| Gelatin | 1.58 |
| Ultraviolet absorbent (UV-1) | 0.47 |
| Color stain inhibitor (Cpd-5) | 0.05 |
| Solvent (Solv-5) | 0.24 |
| Fifth layer (Red-sensitive emulsion layer): | |
| Silver chlorobromide emulsion described above | 0.23 |
| Gelatin | 1.34 |
| Cyan coupler (ExC) | 0.32 |
| Color image stabilizer (Cpd-2) | 0.03 |
| Color image stabilizer (Cpd-4) | 0.02 |
| Color image stabilizer (Cpd-6) | 0.18 |
| Color image stabilizer (Cpd-7) | 0.40 |
| Color image stabilizer (Cpd-8) | 0.05 |
| Solvent (Solv-6) | 0.14 |
| Sixth layer (ultraviolet absorbing layer): | |
| Gelatin | 0.53 |
| Ultraviolet absorbent (UV-1) | 0.16 |
| Color stain inhibitor (Cpd-5) | 0.02 |
| Solvent (Solv-5) | 0.18 |
| Seventh layer (protective layer): | |
| Gelatin | 1.33 |
| Acryl-modified polyvinyl alcohol (modification degree: 17%) | 0.17 |
| Liquid paraffin | 0.03 |

Yellow coupler (ExY)
1:1 (by mole) mixture of that having

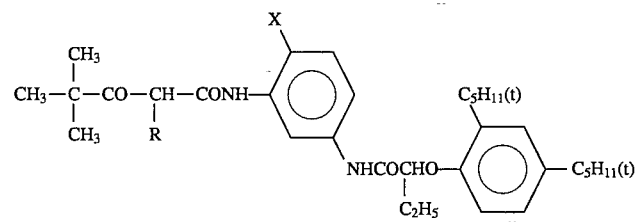

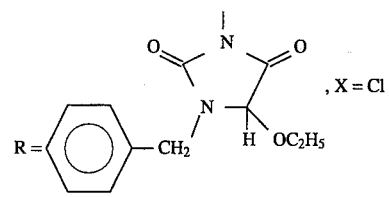

with that having

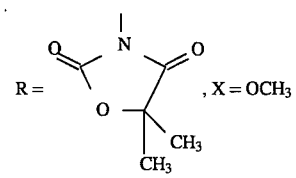, X = OCH₃
Magenta coupler (ExM)
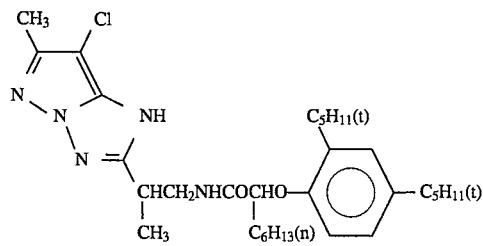
Cyan coupler (ExC)
1:1 (by mole) mixture of
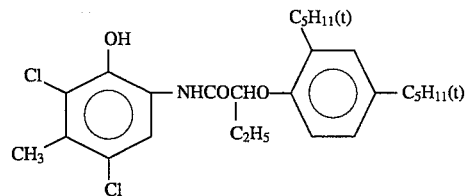
with
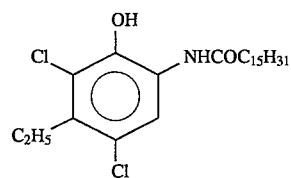
Color image stabilizer (Cpd-1)
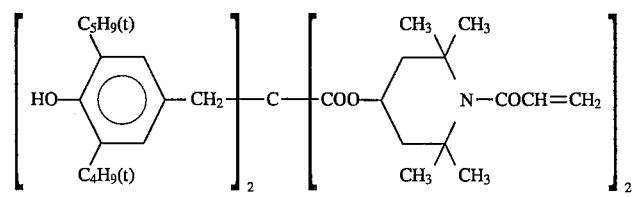
Color image stabilizer (Cpd-2)
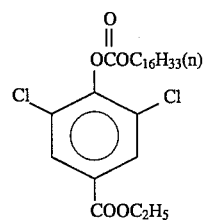

Color image stabilizer (Cpd-3)
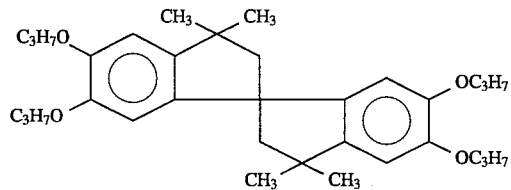
Color image stabilizer (Cpd-4)
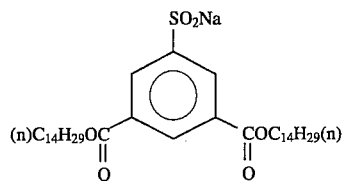
Color stain inhibitor (Cpd-5)
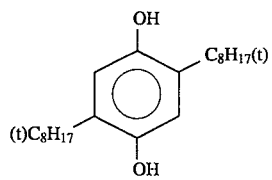
Color image stabilizer (Cpd-6)
2:4:4 (by weight) mixture of
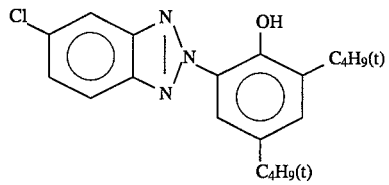
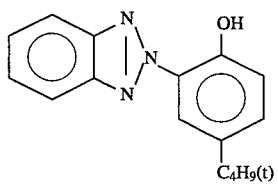
and
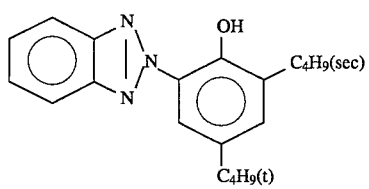
Color image stabilizer (Cpd-7)
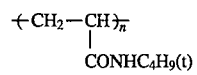
(Mean molecular weight 60,000)
Color image stabilizer (Cpd-8)

-continued
1:1 (by weight) mixture of
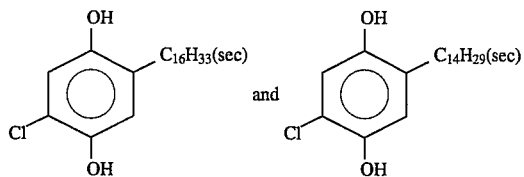
Color image stabilizer (Cpd-9)
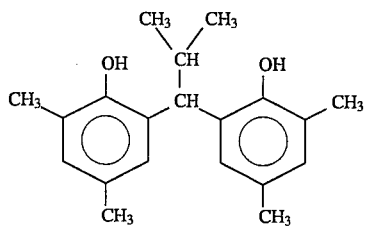
Antiseptics (Cpd-10)
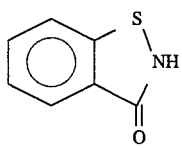
Antiseptics (Cpd-11)
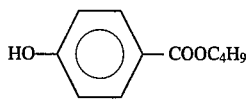
Ultraviolet absorbent (UV-1)
4:2:4 (by weight) mixture of
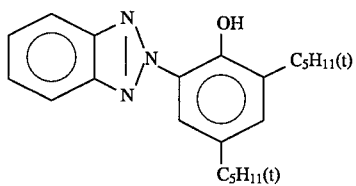
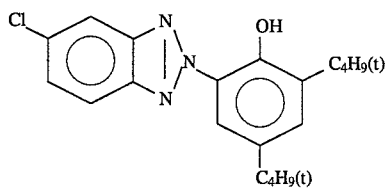
and
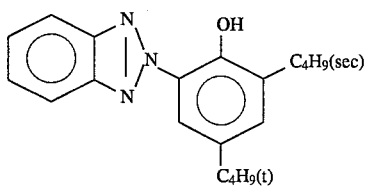

Solvent (Solv-1)

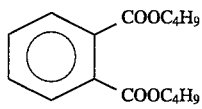

Solvent (Solv-2)
1:1 (by volume) mixture of

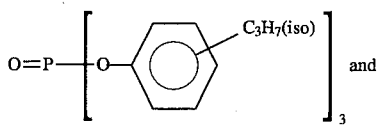 and

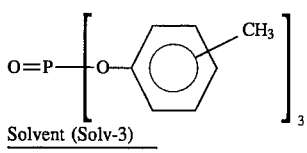

Solvent (Solv-3)

$O=P\pm O-C_9H_{19}(iso)]_3$

Solvent (Solv-4)

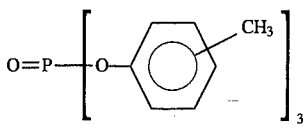

Solvent (Solv-5)

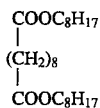

$COOC_8H_{17}$
|
$(CH_2)_8$
|
$COOC_8H_{17}$

Solvent (Solv-6)
80:20 (by volume) mixture of

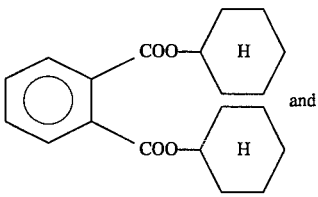 and $C_8H_{17}CHCH(CH_2)_7COOC_8H_{17}$
\\ /
O

Solvent (Solv-7)

$C_8H_{17}CHCH(CH_2)_7COOC_8H_{17}$
\\ /
O

The sensitivity, sensitivity difference attributed to ageing of coating compositions after the preparation thereof, and sensitivity difference attributed to storage of photographic paper prior to exposure of the thusly prepared multilayer color photographic papers (Sensitive material A-1M to B-10M) were examined. These examinations on sensitivity were carried out under the following conditions.

In order to evaluate the sensitivity difference attributed to aging of a coating composition after the preparation thereof, the coating composition for the red-sensitive layer was divided into two portions, and one portion was kept at 40° C. for 30 minutes and the other at 40° C. for 8 hours after the preparation. Thereafter, those portions each were coated, exposed to light for 0.5 seconds through both an optical wedge and a red filter, and then subjected to color development according to the following processing steps and using processing solutions described below.

On the other hand, in order to evaluate the sensitivity difference attributed to the storage of photographic paper, the coated samples each were allowed to stand for 3 days under an atmosphere of 60° C. to 40% RH, and further kept under 15° C. and 55% RH prior to exposure. Thereafter, the samples were subjected to exposure and color development in the same manner as described above.

Reflection densities of the thus processed samples were measured, and characteristic curves were obtained.

In evaluating photographic characteristics, two items, namely sensitivity and fog density, were measured. The sensitivity was defined by the reciprocal of the exposure required for attaining the developed cyan density of 1.0, and shown as relative value.

In determining the sensitivity difference attributed to aging of the coating composition after the preparation thereof, the density corresponding to the exposure required for giving the developed cyan color density of 1.0 to the sample prepared using the coating composition kept at 40° C. for 30 minutes was read on the characteristic curve of the sample prepared using the coating composition kept at 40° C. for 8 hours. A difference between the thus determined density and 1.0, ($\Delta D$), was defined as the sensitivity difference (resulting from aging of a coating composition).

In determining the sensitivity difference attributed to the storage, the density corresponding to the exposure required for giving the developed cyan color density of 1.0 to the sample obtained using the coating composition kept at 40° C. for 30 minutes after preparation and undergoing exposure immediately after coating was read on the characteristic curve of the sample allowed to stand for 3 days under 60° C. and 40% RH after coating. A difference between the thus determined density and 1.0, ($\Delta D$), was defined as the sensitivity difference (resulting from storage).

The results obtained are shown Table C and Table D.

Additionally, the sensitivity and the fog density of a fresh sample refer to those values of a sample obtained using the coating composition kept at 40° C. for 30 minutes without storing it before coating, and the sensitivity of Sample No.1 in Table C was taken as 100 for convenience.

Comparison between emulsions can be made using Table C and Table D (emulsions of a high chloride content), and as for the comparison between dyes, it can be made between S-1 and I-2, S-2 and I-9, S-3 and 1-15, S-4 and I-3, S-5 and 1-21.

TABLE C

| Sample No. | Emulsion | Sensitizing Dye in Red-sensitive Layer | Supersensitizer (IV) | Supersensitizer (VI) | Fresh Sensitivity | Fresh Fog | Aging of Coating Composition $\Delta D$ | Aging of Coating Composition Fog | Storage before Exposure $\Delta D$ | Storage before Exposure Fog | Note |
|---|---|---|---|---|---|---|---|---|---|---|---|
| 1 | A-1M | S-1 | — | — | 100 | 0.05 | −0.20 | 0.06 | −0.32 | 0.07 | comparison |
| 2 | A-1M | S-1 | IV-1 | — | 124 | 0.06 | −0.18 | 0.06 | −0.26 | 0.07 | " |
| 3 | A-1M | S-1 | — | VI-9 | 140 | 0.06 | −0.18 | 0.06 | −0.24 | 0.07 | " |
| 4 | A-1M | S-1 | IV-1 | VI-9 | 210 | 0.05 | −0.15 | 0.06 | −0.20 | 0.06 | " |
| 5 | A-2M | S-2 | IV-1 | VI-9 | 180 | 0.06 | −0.25 | 0.07 | −0.28 | 0.07 | " |
| 6 | A-3M | S-3 | IV-1 | VI-9 | 205 | 0.05 | −0.20 | 0.07 | −0.18 | 0.07 | " |
| 7 | A-4M | S-4 | IV-1 | VI-9 | 205 | 0.05 | −0.17 | 0.07 | −0.19 | 0.07 | " |
| 8 | A-5M | S-5 | IV-1 | VI-9 | 195 | 0.05 | −0.17 | 0.07 | −0.20 | 0.07 | " |
| 9 | A-6M | I-2 | — | — | 250 | 0.05 | −0.12 | 0.06 | −0.14 | 0.06 | Invention |
| 10 | A-6M | I-2 | IV-1 | — | 288 | 0.05 | −0.10 | 0.06 | −0.12 | 0.06 | " |
| 11 | A-6M | I-2 | — | VI-9 | 305 | 0.06 | −0.10 | 0.06 | −0.12 | 0.07 | " |
| 12 | A-6M | I-2 | IV-1 | VI-9 | 395 | 0.06 | −0.08 | 0.06 | −0.10 | 0.06 | " |
| 13 | A-7M | I-9 | IV-1 | VI-9 | 305 | 0.06 | −0.15 | 0.06 | −0.16 | 0.06 | " |
| 14 | A-8M | I-15 | IV-1 | VI-9 | 320 | 0.05 | −0.12 | 0.06 | −0.12 | 0.06 | " |
| 15 | A-9M | I-3 | IV-1 | VI-9 | 385 | 0.05 | −0.08 | 0.06 | −0.08 | 0.06 | " |
| 16 | A-10M | I-21 | IV-1 | VI-9 | 285 | 0.05 | −0.10 | 0.06 | −0.10 | 0.06 | " |

Amount of (IV) added: $2.5 \times 10^{-3}$ mol/mol Ag
Amount of (VI) added: $2.5 \times 10^{-4}$ mol/mol Ag

TABLE D

| Sample No. | Emulsion | Sensitizing Dye in Red-sensitive Layer | Supersensitizer (IV) | Supersensitizer (VI) | Fresh Sensitivity | Fresh Fog | Aging of Coating Composition $\Delta D$ | Aging of Coating Composition Fog | Storage before Exposure $\Delta D$ | Storage before Exposure Fog | Note |
|---|---|---|---|---|---|---|---|---|---|---|---|
| 17 | B-1M | S-1 | — | — | 90 | 0.05 | −0.22 | 0.06 | −0.26 | 0.06 | Comparison |
| 18 | B-1M | S-1 | IV-1 | — | 95 | 0.05 | −0.17 | 0.06 | −0.23 | 0.07 | " |
| 19 | B-1M | S-1 | — | VI-9 | 120 | 0.06 | −0.13 | 0.07 | −0.20 | 0.08 | " |
| 20 | B-1M | S-1 | IV-1 | VI-9 | 185 | 0.06 | −0.10 | 0.07 | −0.19 | 0.07 | " |
| 21 | B-2M | S-2 | IV-1 | VI-9 | 160 | 0.06 | −0.18 | 0.06 | −0.26 | 0.07 | " |
| 22 | B-3M | S-3 | IV-1 | VI-9 | 181 | 0.05 | −0.15 | 0.07 | −0.20 | 0.08 | " |
| 23 | B-4M | S-4 | IV-1 | VI-9 | 182 | 0.05 | −0.13 | 0.07 | −0.18 | 0.07 | " |

TABLE D-continued

| Sample No. | Emulsion | Sensitizing Dye in Red-sensitive Layer | Supersensitizer (IV) | Supersensitizer (VI) | Fresh Sensitivity | Fresh Fog | Aging of Coating Composition ΔD | Aging of Coating Composition Fog | Storage before Exposure ΔD | Storage before Exposure Fog | Note |
|---|---|---|---|---|---|---|---|---|---|---|---|
| 24 | B-5M | S-5 | IV-1 | VI-9 | 152 | 0.05 | −0.13 | 0.07 | −0.22 | 0.07 | " |
| 25 | B-6M | I-2 | — | — | 160 | 0.05 | −0.12 | 0.05 | −0.13 | 0.06 | Invention |
| 26 | B-6M | I-2 | IV-1 | — | 224 | 0.05 | −0.10 | 0.06 | −0.11 | 0.06 | " |
| 27 | B-6M | I-2 | — | VI-9 | 250 | 0.06 | −0.08 | 0.06 | −0.12 | 0.06 | " |
| 28 | B-6M | I-2 | IV-1 | VI-9 | 362 | 0.06 | −0.08 | 0.06 | −0.10 | 0.06 | " |
| 29 | B-7M | I-9 | IV-1 | VI-9 | 255 | 0.06 | −0.12 | 0.06 | −0.14 | 0.07 | " |
| 30 | B-8M | I-15 | IV-1 | VI-9 | 282 | 0.06 | −0.10 | 0.07 | −0.12 | 0.06 | " |
| 31 | B-9M | I-3 | IV-1 | VI-9 | 380 | 0.06 | −0.09 | 0.06 | −0.08 | 0.06 | " |
| 32 | B-10M | I-21 | IV-1 | VI-9 | 232 | 0.06 | −0.05 | 0.06 | −0.06 | 0.06 | " |

Amount of (IV) added: $2.5 \times 10^{-3}$ mol/mol Ag
Amount of (VI) added: $2.5 \times 10^{-4}$ mol/mol Ag As clearly seen from the above data, sensitivities of the fresh samples were high and both the sensitivity difference attributed to aging after preparation of a coating composition and that attributed to storage before exposure were small when the sensitizing dyes of the present invention are incorporated in multilayer color photographic papers, whether silver halide emulsions comprised therein were a silver chlorobromide emulsion or an emulsion having a high chloride content, compared with the cases where comparative dyes were used.

Each sample which had been exposed to light was subjected to a photographic processing operation by means of a paper processor using the processing solutions described below and according to the following processing process. As for the processing operation, continuous processing (running test) was performed till an amount of the replenisher used for color development became twice the volume of the developing tank used.

| Processing Step | Temperature | Time | Amount* replenished | Tank Volume |
|---|---|---|---|---|
| Color development | 35° C. | 45 sec. | 161 ml | 17 l |
| Bleach-fix | 30–35° C. | 45 sec. | 215 ml | 17 l |
| Rinsing (1) | 30–35° C. | 20 sec. | — | 10 l |
| Rinsing (2) | 30–35° C. | 20 sec. | — | 10 l |
| Rinsing (3) | 30–35° C. | 20 sec. | 350 ml | 10 l |
| Drying | 70–80° C. | 60 sec. | | |

*per m² of photographic material (The rinsing processing was carried out according to a 3-stage counter current process in the direction of from the rinsing tank 3 to the rinsing tank 1)

The composition of each processing solution used is described below.

| | Tank Solution | Replenisher |
|---|---|---|
| Color Developer: | | |
| Water | 800 ml | 800 ml |
| Ethylenediamine-N,N,N',N'-tetramethylenephosphonic acid | 1.5 g | 2.0 g |
| Potassium bromide | 0.015 g | — |
| Triethanolamine | 8.0 g | 12.0 g |
| Sodium chloride | 1.4 g | — |
| Potassium carbonate | 25 g | 25 g |
| N-Ethyl-N-(β-methanesulfon-amido ethyl)-3-methyl-4-aminoaniline sulfate | 5.0 g | 7.0 g |
| N,N-Bis(carboxymethyl)-hydrazine | 4.0 g | 5.0 g |
| Monosodium N,N-di(sulfo-ethyl)hydroxylamine | | |
| Brightening agent (WHITEX 4B, produced by Sumitomo Chemical Co., Ltd.) | 1.0 g | 2.0 g |
| Water to make | 1,000 ml | 1,000 ml |
| pH (25° C.) adjusted to | 10.05 | 10.45 |
| Bleach-Fix Bath (Tank solution = Replenisher): | | |
| Water | 400 ml | |
| Ammonium thiosulfate (700 g/l) | 100 ml | |
| Sodium sulfite | 17 g | |
| Ammonium ethylenediaminetetraacetato-ferrate(III) | 55 g | |
| Disodium ethylenediaminetetraacetate | 5 g | |
| Ammonium bromide | 40 g | |
| Water to make | 1,000 ml | |
| pH (25° C.) adjusted to | 6.0 | |

Rinsing Bath (Tank solution=Replenisher):
Ion exchange water (in which calcium and magnesium ion concentrations were each below 3 ppm).

EXAMPLE 10

To a mixture of 1,000 ml of water, 30 g of deionized ossein gelatin and 2.81 g of sodium chloride, which was placed in a reaction vessel and maintained at 60° C., 23.5 ml of 1 normal sulfuric acid was added with stirring. Thereto, both 0.210 normal water solution of silver nitrate and 0.210 normal water solution of sodium chloride were added at a constant flow rate of 4.38 ml/min over a 40-minute period. After a lapse of 10 minutes from the conclusion of the addition, both 2.206 normal of water solution of silver nitrate and 2.206 normal of water solution of sodium chloride were further added at a constant flow rate of 5.00 ml/min over a 80minute period. The thus prepared silver chloride emulsion was sedimented by adding a copolymer of iso-butene and monosodium maleate as a polymeric flocculant. The sedimented emulsion was desalted by washing with water. Thereto, deionized ossein gelatin and water were further added, and the resulting emulsion was adjusted to pH 6.3 and pAg 7.4 at 40° C. Silver chloride grains of the thus obtained emulsion had a crystal form of cube having an average edge length of 0.73 μm and a mono-disperse distribution having a variation coefficient of 6.5% (the quotient of the standard deviation divided by the average edge length of grains; s/d).

This emulsion was subjected to sulfur sensitization by adding triethyl thiourea thereto and ripening it at 50° C. so as to achieve the optimal sensitivity. The ripened emulsion was divided into twenty-four equal parts. To these parts were added at 60° C. the sensitizing dyes relating to this invention and comparative ones, respectively, as shown in Table E. Then, each part of the emulsion was admixed with 4-hydroxy- 6-methyl-1,3,3a,7-tetrazaindene (in an amount of 0.18 g per 1 Kg of the emulsion), 10% gel of deionized gelatin (in an amount of 280 g per 1 Kg of the emulsion) and water (in an amount of 1.04 l per 1 Kg of the emulsion), and coated on a triacetate film base so as to have a silver coverage of 2.5 g/m$^2$ and a gelatin coverage of 3.8 g/m$^2$. Therein, said emulsion coat was formed simultaneously with an upper layer. As for the upper layer, an aqueous gelatin solution containing as main ingredients 0.1 g/l of sodium dodecylbenzenesulfonate, 0.22 g/l of sodium p-sulfostyrene homopolymer, 3.1 g/l of sodium 2-hydroxy- 4,6-dichloro-1, 3,5-triazine and 50 g/l of gelatin was coated so that the upper layer might have a gelatin coverage of 1.0 g/l. Each of the thus obtained samples was divided into two parts, and one part was kept for 3 days under an atmosphere of 50° C. to 80% RH and the other was stored in a freezer for 3 days under a temperature of −20° C.

Thereafter, these sample coats were exposed to a tungsten light source (color temperature: 2854° K.) through the combination of a red sharp-cut filter, SC- 66, produced by Fuji Photo Film Co., Ltd. (a filter capable of transmitting light of wavelengths longer than about 640 nm) with a continuous wedge.

The exposed samples were each developed for 10 min. at a temperature of 20° C. with a developer having the composition described below, and subjected successively to stop, fixation and washing steps. Density measurements of the thus processed samples were performed using a P-type densitometer made by Fuji Photo Film Co., Ltd. to determine red filter sensitivity (RS) and fog density.

| Metol | 2.5 g |
|---|---|
| L-ascorbic acid | 10.0 g |
| Potassium bromide | 1.0 g |
| Nabox | 35.0 g |
| Water to make | 1,000 ml |
| pH (20° C.) | 9.8 |

The standard point of the optical density to determine the sensitivity was fog + 0.2, and the sensitivity was expressed in terms of the reciprocal of exposure required for achieving said optical density. The sensitivities shown in Table E are relative values, with the sample 33, which contained a comparative sensitizing dye S-1 in an amount of $5.0 \times 10^{-5}$ mol/mol Ag and stored in the freezer, being taken as 100. This figure in Table E was marked with *.

TABLE E

| Sample No. | Sensitizing dye and Amount added (x10$^{-5}$ mol/mol Ag) | | Compound used in Combination and Amount added (x10$^{-4}$ mol/mol Ag) | | Stored in Freezer | | Kept under 80% RH-50° C. | | Note |
|---|---|---|---|---|---|---|---|---|---|
| | | | | | Fog | Sensitivity | Fog | Sensitivity | |
| 33 | S-1 | 5 | — | | 0.04 | 100* | 0.05 | 42 | Comparison |
| 34 | | 10 | — | | 0.04 | 131 | 0.05 | 49 | " |
| 35 | | 10 | V-3 | 4 | 0.04 | 209 | 0.05 | 107 | " |
| 36 | S-2 | 5 | — | | 0.04 | 89 | 0.05 | 38 | " |
| 37 | | 10 | — | | 0.04 | 102 | 0.05 | 42 | " |
| 38 | | 10 | V-3 | 4 | 0.04 | 195 | 0.05 | 117 | " |
| 39 | S-3 | 5 | — | | 0.04 | 102 | 0.05 | 52 | " |
| 40 | | 10 | — | | 0.04 | 155 | 0.05 | 58 | " |
| 41 | | 10 | V-3 | 4 | 0.04 | 258 | 0.05 | 132 | " |
| 42 | S-5 | 5 | — | | 0.04 | 82 | 0.06 | 58 | " |
| 43 | | 10 | — | | 0.04 | 95 | 0.06 | 63 | " |
| 44 | | 10 | V-3 | 4 | 0.04 | 195 | 0.06 | 110 | " |
| 45 | I-2 | 5 | — | | 0.04 | 209 | 0.05 | 148 | Invention |
| 46 | | 10 | — | | 0.04 | 255 | 0.05 | 186 | " |
| 47 | | 10 | V-3 | 4 | 0.04 | 338 | 0.05 | 264 | " |
| 48 | I-9 | 5 | — | | 0.04 | 132 | 0.05 | 92 | " |
| 49 | | 10 | — | | 0.04 | 167 | 0.05 | 116 | " |
| 50 | | 10 | V-3 | 4 | 0.04 | 209 | 0.06 | 182 | " |
| 51 | I-15 | 5 | — | | 0.04 | 141 | 0.05 | 112 | " |
| 52 | | 10 | — | | 0.04 | 211 | 0.05 | 172 | " |
| 53 | | 10 | V-3 | 4 | 0.04 | 265 | 0.05 | 211 | " |
| 54 | I-21 | 5 | — | | 0.04 | 110 | 0.06 | 92 | " |
| 55 | | 10 | — | | 0.04 | 141 | 0.06 | 102 | " |
| 56 | | 10 | V-3 | 4 | 0.04 | 170 | 0.06 | 134 | " |

As can be seen from Table E, the sensitivities of the samples according to the present invention were considerably high, compared with those of the comparative samples. Upon storage under high temperature and high humidity, the comparative sensitizing dyes caused a drastic drop in sensitivity, whereas the drop in sensitivity caused by the sensitizing dyes relating to the present invention was vary small compared with the drop in sensitivity caused by the comparative ones in which the same substituent groups as the present ones were contained. Moreover, the combined use of each of the present sensitizing dyes and the supersensitizer, or the compound capable of producing a supersensitizing effect, not only brought about a marked increase in sensitivity but also contributed to the retention of sensitivity upon storage under high temperature and high humidity.

EXAMPLE 11

To a mixture of 1,000 ml of water, 40 g of deionized ossein gelatin and 0.20 g of potassium bromide, which was placed in a reaction vessel, maintained at 75° C. and stirred thoroughly, both a 0.0412 normal water solution of silver nitrate and a water solution adjusted so as to contain 0.0412 normal potassium bromide and $8.26 \times 10^{-4}$ normal potassium iodide were added simultaneously at a flow rate of 4.01 ml/min over a period of 10 minutes. Then, each flow rate was increased to 24.07 ml/min, and both solutions were further added simultaneously over a period of 7 minutes and 25 seconds. After a lapse of 2 minutes from the conclusion of the addition, a 1.18 normal water solution of silver nitrate and a water solution adjusted so as to contain 1.18 normal potassium bromide and 0.0241 normal potassium iodide were added simultaneously to the reaction vessel at a flow rate which was changed continuously from the initial value of 1.50 ml/min to the final value of 13.54 ml/min over a period of 80 minutes as a silver potential inside the reaction vessel was kept at 0 mV with reference to the saturated calomel electrode. Subsequently, the thus prepared silver iodobromide emulsion was sedimented by adding a copolymer of isobutene and monosodium maleate as a polymeric flocculant. The sedimented emulsion was desalted by washing with water. Thereto, 80 g of deionized ossein gelatin and 328 ml of water were further added, and the resulting emulsion was adjusted to pH 6.5 and pAg 8.9 at 40° C. Silver iodobromide grains of the thus obtained emulsion had a crystal form of octahedron, a monodisperse distribution (variation coefficient: 10.8%), an average iodide content of 2.0 mol % and an average grain size of 0.88 μm.

This emulsion was divided into two parts, and thereto were added at 65° C. the sensitizing dye I-3 relating to the present invention and the comparative dye S-4 in the same amount of $2.05 \times 10^{-4}$ mole (specific addition amount: 0.55) per mole of Ag, respectively. After a 30-minute lapse, to each part of the emulsion were added a water solution of sodium thiosulfate and a water solution of potassium chloroaurate-potassium thiocyanate mixture in succession in their optimal amounts, thereby ripening the emulsion so as to obtain the optimal sensitivity. Then, each part of the emulsion was admixed with 4-hydroxy-6-methyl-1,3,3a,7-tetrazaindene (in an amount of 0.18 g per 1 Kg of the emulsion), 10% gel of deionized gelatin (in an amount of 280 g per 1 Kg of the emulsion) and water (in an amount of 1.04 l per 1 Kg of the emulsion), and coated on a polyethylene terephthalate film base so as to have a silver coverage of 2.5 g/m² and a gelatin coverage of 3.8 g/m². Therein, said emulsion coat was formed simultaneously with an upper layer. As for the upper layer, an aqueous gelatin solution containing as main ingredients 0.1 g/l of sodium dodecylbenzenesulfonate, 0.22 g/l of sodium p-sulfostyrene homopolymer, 4.0 g/l of 1,3-bis(vinylsulfonyl)-2-propanol and 50 g/l of gelatin was coated so that the upper layer might have a gelatin coverage of 1.0 g/l.

These sample coats were exposed to a tungsten light source (color temperature: 2854° K) through the combination of a 750 nm interference filter (transmittance at 750 nm: 30.1%, half width: about 9.7 nm) with a continuous wedge.

The exposed samples were each developed for 4 min. at a temperature of 20° C. with a developer having the composition described below, and subjected successively to stop, fixation and washing steps. Density measurements of the thus processed samples were performed using a P-type densitometer made by Fuji Photo Film Co., Ltd. to determine sensitivity and fog density. The results obtained are shown in Table F.

TABLE F

| Sample No. | Sensitizing Dye | Photographic Characteristics | | Interference Filter used | Note |
| --- | --- | --- | --- | --- | --- |
| | | Fog | Sensitivity | | |
| 57 | I-3 | 0.04 | 100 | 750 nm | Invention |
| 58 | S-4 | 0.04 | 42 | 750 nm | Comparison |

As can be seen from Table F, the sensitizing dye of the present invention clearly produced a sensitizing effect upon exposure to light of wavelengths corresponding to J-band absorption, and the sensitivity brought about thereby was very high, compared with that by the comparative dye.

| Composition of Developer: | |
| --- | --- |
| Water | 700 ml |
| Metol | 3.1 g |
| Anhydrous sodium sulfite | 45.0 g |
| Hydroquinone | 12.0 g |
| Sodium carbonate (monohydrate) | 79.0 g |
| Potassium bromide | 1.0 g |
| Water to make | 2,000 ml |
| pH (20° C.) | 10.33 |

The standard point of the optical density to determine the sensitivity was fog + 0.2, and the sensitivity was expressed in terms of the reciprocal of exposure required for achieving said optical density. The sensitivities shown in Table F are relative values, with the sample comprising the sensitizing dye I-3 being taken as 100.

EXAMPLE 12

To a mixture of 2.5 l of water, 125 g of deionized ossein gelatin, 25.7 g of potassium bromide and 10 ml of a 5% water solution of 3,6-dithiaoctane-1,8-diol, which was placed in a reaction vessel, maintained at 75° C. and stirred thoroughly, both 65 ml of a 17.22% water solution of silver nitrate, to which 0.4 g of ammonium nitrate had been added, and 65 ml of a 12.77% water solution of potassium bromide were added simultaneously at a constant flow rate over a period of 15 seconds according to a double jet method. Then, the reaction mixture was stirred for an additional 20 minutes. Thereafter, 1.44 l of a 20.90% water solution of silver nitrate to which 9.0 g of ammonium nitrate had been added and 1.44 l of a water solution containing 246.2 g of potassium bromide, 10.5 g of potassium iodide and 1.7 g of 3,6-dithiaoctane-1,8-diol were added simultaneously over a period of 90 minutes according to the double jet method (wherein the total amount of silver nitrate added was 375.5 g).

Subsequently, the thus prepared silver iodobromide emulsion was cooled to 35° C., adjusted to pH 4.10, and sedimented by adding a copolymer of isobutene and monosodium maleate as a polymeric flocculant. The sedimented emulsion was desalted by washing with water. Thereto, 100 g of deionized ossein gelatin for dispersion use, 150 ml of a 5% water solution of phenol and 1.4 l of water were further added at 40° C., and the resulting emulsion was adjusted to pH 6.8 and pAg 8.8. The thus obtained silver halide grains had an average diameter of 1.78 μm and an average thickness of 0.12 μm (an average aspect ratio: 14.8), wherein tabular grains having an aspect ratio of at least 12 were contained in a proportion of at least 97.8% based on projected area, to the whole grains.

In preparing the foregoing emulsion, addition of $5.0 \times 10^{-4}$ mol/mol Ag of Sensitizing dye (I-18) or Comparative Sensitizing dye (S-8) was started 20 minutes before the addition of the water solution of silver nitrate was completed, and carried out over a 20-minute period. Then, the emulsion was cooled to 35° C. adjusted to pH 4.10, and sedimented by adding a copolymer of isobutene and monosodium maleate as a polymeric flocculant. The sedimented emulsion was desalted by washing with water. Thereto, 100 g of deionized ossein gelatin for dispersion use, 150 ml of a 5% water solution of phenol and 1.4 l of water were further added at 40° C., and the resulting emulsion was adjusted to pH 6.8 and pAg 8.8. Further, the emulsion was subjected to chemical sensitization by adding sodium thiosulfate pentahydrate and potassium tetrachloroaurate and ripening at 60° C. To the chemically sensitized emulsion, a coupler emulsion, gelatin and water were added, and coated on a polyethylene terephthalate film base under the coating condition described below.

(Photographic Processing)

| Step | Processing Time | Processing Temperature |
|---|---|---|
| Color Development | 2 min. 00 sec. | 40° C. |
| Bleach-Fixation | 3 min. 00 sec. | 40° C. |
| Washing (1) | 20 sec. | 35° C. |
| Washing (2) | 20 sec. | 35° C. |
| Stabilization | 20 sec. | 35° C. |
| Drying | 50 sec. | 65° C. |

In the above-described processing, the washing steps (1) and (2) were carried out according to the counter-current process from the step (2) to the step (1).

The composition of each processing solution used is described below.

Comparative Dye (S-6)

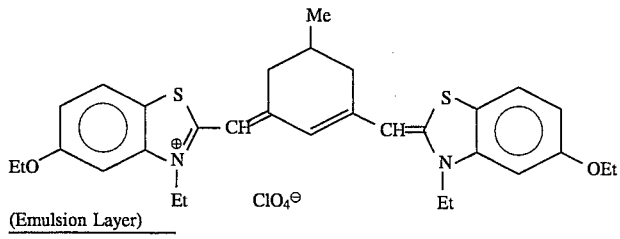

(Emulsion Layer)

| | |
|---|---|
| Coverage of silver | 1.20 g/m² |
| Coverage of coupler illustrated below | $2.4 \times 10^{-3}$ mole/m² |
| Coverage of tricresyl phosphate used for emulsifying the foregoing coupler | 0.42 g/m² |
| Coverage of gelatin | 3.8 g/m² |

Formula of Coupler

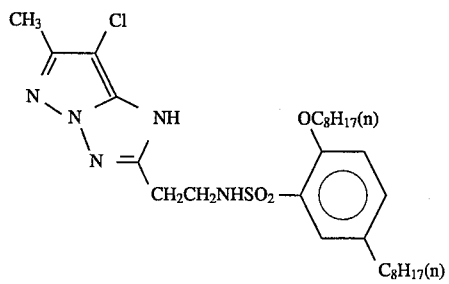

(Protective Layer)

| | |
|---|---|
| Coverage of gelatin | 1.2 g/m² |
| Coverage of sodium 1,2-bis(2-ethylhexyloxycarbonyl) ethane-sulfonate | 0.0025 g/m² |
| Coverage of sodium p-sulfostyrene homopolymer | 0.0053 g/m² |
| Coverage of sodium 2-hydroxy-4,6-dichloro-1,3,5-triazine | 0.075 g/m² |

These sample coats were exposed to a tungsten light source (color temperature: 2854° K.) through the combination of a 803 nm interference filter (transmittance at 803 nm: 11%, half width: about 13 nm) with a continuous wedge.

The exposed samples were each subjected to the following photographic processing.

Color Developer:

| | |
|---|---|
| Diethylenetriaminepentaacetic acid | 2.0 g |
| 1-Hydroxyethylidene-1,1-diphosphonic acid | 3.0 g |
| Sodium sulfite | 4.0 g |
| Potassium carbonate | 30.0 g |
| Potassium bromide | 1.4 g |

| | |
|---|---|
| Potassium iodide | 1.5 mg |
| Hydroxylamine sulfate | 2.4 g |
| 4-[N-methyl-N-β-hydroxyethylamino]-2-methylaniline sulfate | 4.5 g |
| Water to make | 1 l |
| pH adjusted to | 10.05 |

Bleach-fix Bath:

| | |
|---|---|
| Ammonium ethylenediaminetetraacetonato-ferrate(III) | 90.0 g |
| Disodium ethylenediaminetetraacetate | 5.0 g |
| Sodium sulfite | 12.0 g |
| Aqueous solution of ammonium thiosulfate (700 g/l) | 260.0 ml |
| Acetic acid (98%) | 5.0 ml |
| 3-Mercapto-1,2,4-triazole (bleach accelerator) | 0.01 mol |
| Water to make | 1.0 l |
| pH adjusted to | 6.0 |

The pH was adjusted by using acetic acid or aqueous ammonia.

Washing Water:

City water was passed through a column of mixed-bed system in which H-type strong acid cation-exchange resin (Amberlite IR-120B, produced by Rhom & Haas Co.) and OH-type anion-exchange resin (Amberlite IR-400, produced by Rhom & Haas Co.) were charged, resulting in reduction of calcium and magnesium ion concentrations to 3 mg/l or less. To the thus purified water were added 20 mg/l of sodium dichloroisocyanurate and 1.5 g/l of sodium sulfate. The pH of this solution was within the range of 6.5 to 7.5.

Stabilizing Bath:

| | |
|---|---|
| Formaldehyde (37% W/V) | 2.0 ml |
| Polyoxyethylene-p-monononylphenylether (average polymerization degree: 10) | 0.3 g |
| Disodium ethylenediaminetetraacetate | 0.05 g |
| Water to make | 1.0 l |
| pH adjusted to | 5.0–8.0 |

The density of the developed magenta color of each processed sample was examined using a P-type densitometer, made by Fuji Photo Film Co., Ltd. to determine the sensitivity and fog density. The standard point of the optical density to determine the sensitivity was fog + 0.2, and the sensitivity was expressed in terms of the reciprocal of exposure required for achieving said optical density. The sensitivities shown in Table G are relative values, with the sample 59, which received the addition of sensitizing dye (I-18) during the grain formation, being taken as 100.

TABLE G

| Sample No. | Sensitizing Dye | Photographic Characteristics | | Interference Filter used | note |
|---|---|---|---|---|---|
| | | Fog | Sensitivity | | |
| 59 | I-18 | 0.10 | 100 | 803 nm | invention |
| 60 | S-6 | 0.15 | 28 | 803 nm | comparison |

The experimental results revealed that Sensitizing Dye I-18 relating to the present invention showed a sharp absorption due to the J-aggregates at 800 nm, and so high photographic sensitivity attributable to the J-aggregates was obtained. In contrast, the comparative dye S-6 was found to show slight absorption at 800 mn and, as a result thereof, to induce only low sensitivity.

EXAMPLE 13

A red-sensitive sensitizing dye illustrated below was added to a silver chlorobromide emulsion (A) prepared in the same manner as in Example 9. A coating composition for the first layer was prepared using the resulting emulsion in the same manner as in Example 9.

Other coating compositions for from the second layer to the seventh layer were prepared in the same manner as in Example 9, except that Comparative Dye (C- 1) was incorporated in the third layer, the infrared dye illustrated below in the fifth layer and the dyes illustrated below as an irradiation preventing dye in the emulsion layers. Using these coating compositions, a photosensitive material (Sample No. 61) was prepared in the same manner as in Example 9. In the course of preparation of the sample, Compound IV-1 also was added in an amount of $1.8 \times 10^{-3}$ mol/mol Ag.

Dye for Red-Sensitive Emulsion in First Layer:
(First layer: Red-sensitive yellow color forming layer)

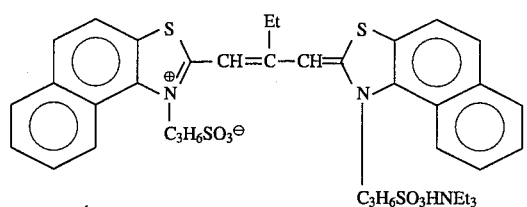

(S-7)

$1.0 \times 10^{-1}$ mol per mol of silver halide

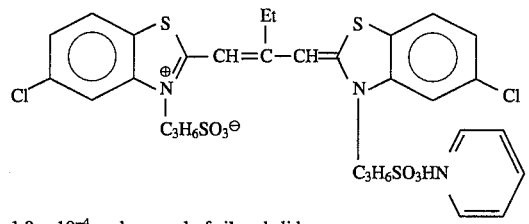

(S-8)

$1.0 \times 10^{-4}$ mol per mol of silver halide

Dye for Infrared-Sensitive Emulsion in Fifth Layer:
(Fifth layer: Infrared-sensitive cyan color forming layer)
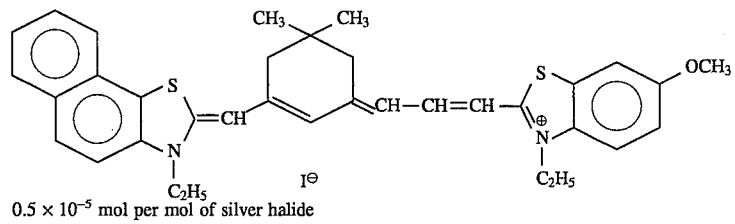
(S-9)
$0.5 \times 10^{-5}$ mol per mol of silver halide
Dyes for Prevention of Irradiation
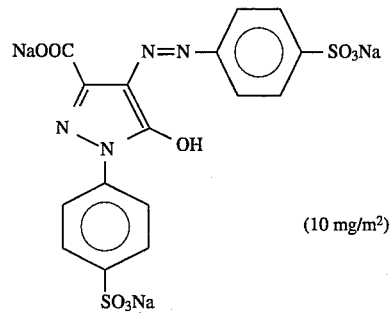
(10 mg/m$^2$)
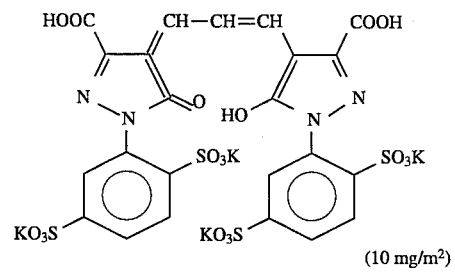
(10 mg/m$^2$)
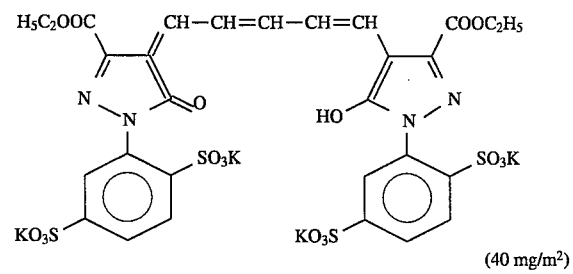
(40 mg/m$^2$)
and
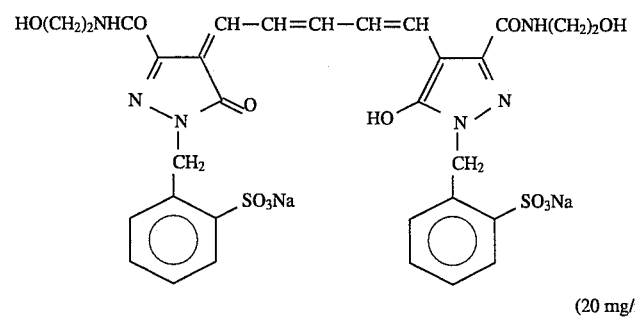
(20 mg/m$^2$)

-continued

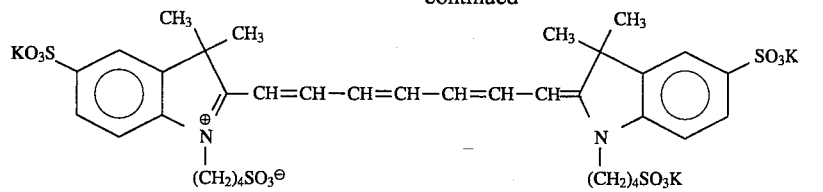

(10 mg/m²)

and

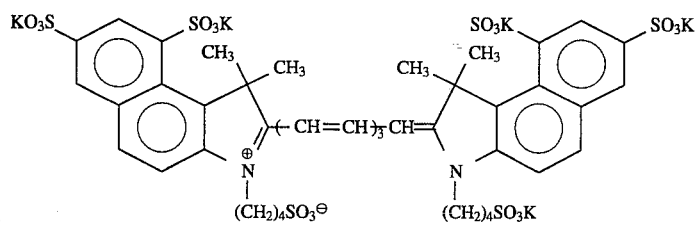

(5 mg/m²)

and

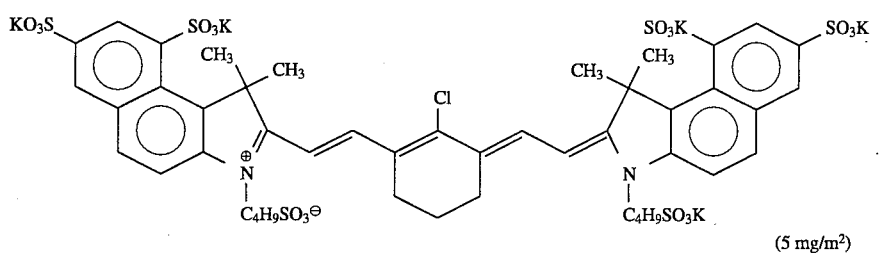

(5 mg/m²)

Further, other photosensitive materials (Sample Nos. from 62 to 70) were prepared in the same manner as that of Sample No. 61, except that sensitizing dyes set forth in Table H were used in place of Comparative Dye (C-1) in the third layer, respectively.

TABLE H

| Sample No. | Compound added and Amount thereof (×10⁻⁵ mol/mol Ag) | | Storage at −30° C. in Argon-replaced Atmosphere | | 3-Day storage under 80% RH-50° C. | | 7-Day Storage under Oxygen Partial Pressure of 10 atm. | note |
|---|---|---|---|---|---|---|---|---|
| | | | Sensitivity | Fog | Sensitivity | Fog | Sensitivity | |
| 61 | C-1 | 1.1 | 100 (standard) | 0.03 | 70 | 0.05 | 61 | comparison |
| 62 | C-2 | 1.1 | 195 | 0.03 | 79 | 0.05 | 65 | comparison |
| 63 | I-1 | 1.1 | 220 | 0.03 | 95 | 0.04 | 90 | invention |
| 64 | I-3 | 1.1 | 250 | 0.03 | 92 | 0.04 | 86 | invention |
| 65 | C-3 | 1.1 | 100 | 0.04 | 65 | 0.04 | 62 | comparison |
| 66 | I-8 | 1.1 | 105 | 0.04 | 98 | 0.04 | 86 | invention |
| 67 | C-4 | 1.1 | 160 | 0.04 | 75 | 0.05 | 62 | comparison |
| 68 | I-14 | 1.1 | 185 | 0.04 | 94 | 0.04 | 88 | invention |
| 69 | C-5 | 1.0 | 95 | 0.03 | 80 | 0.04 | 70 | comparison |
| 70 | I-18 | 1.0 | 100 | 0.03 | 95 | 0.03 | 85 | invention |

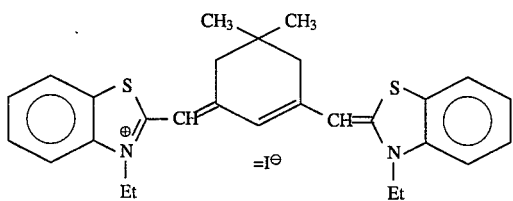

C-1

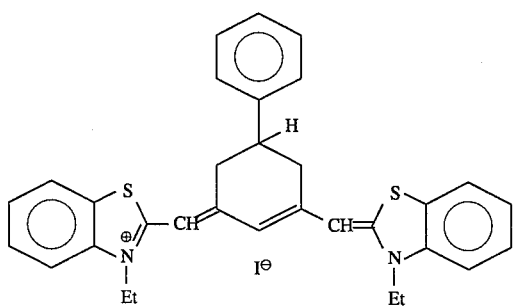

C-2

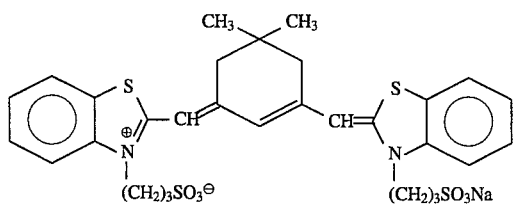

C-3

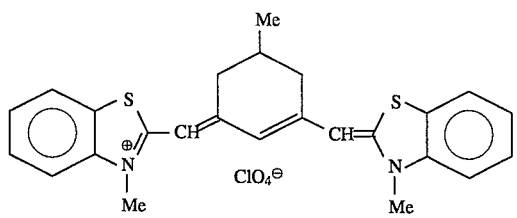

C-4

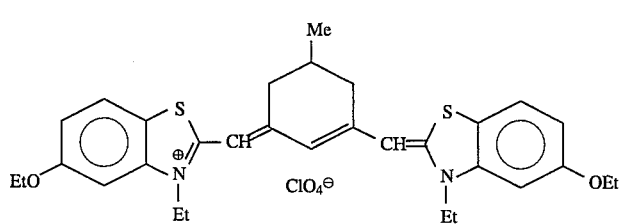

C-5

Each of the coated samples was divided into three parts. One part of every sample was sealed in an oxygen-impermeable bag the air in which had been replaced with argon gas, and stored for 3 days under a temperature of −30° C. Another part was allowed to stand for 3 days in an atmosphere of 80% RH-50° C., and the other for 7 days at room temperature under an atmosphere having an oxygen partial pressure of 10 atom.

Each of the resulting photosensitive materials was exposed to light using two kinds of exposure devices.

(1) 10 Seconds' wedgewise exposure for sensitometry was carried out using a sensitometer (Model FWH, made by Fuji Photo Film Co., Ltd.) equipped with a light source having a color temperature of 3200° K. To the light source were attached 670 nm, 750 nm and 830 nm interference filters of evaporated film type.

(2) AlGaInP (oscillation wavelength: about 670 nm), GaAlAs (oscillation wavelength: about 750 nm) and GaAlAs (oscillation wavelength: about 810 nm) semiconductor laser devices were used as light sources of the apparatus. The apparatus was designed so that by means of a rotating polyhedron the laser beams might scan in series a sample moving in the direction perpendicular to the scanning direction of laser beams. By changing quantities of the laser beam using this apparatus, the relationship between the developed color density (D) of each photosensitive material and the quantity of each laser beam (D-logE) was determined. The quantity of each semiconductor laser beam was controlled by the combined use of the pulse width modulation system, in which the quantity of a laser beam is modulated by changing the amount of time an electric current is fed to a semiconductor laser device, and the intensity modulation system in which the quantity of a laser beam is modulated by changing the quantity of an electric current fed thereto. The scanning exposure as described above was carried out under 400 dpi, and therein an average exposure time per picture element was about $10^{-7}$ second.

After the exposure, each sample was subjected to the same photographic processing as in Example 9.

The results obtained by carrying out the exposure by means of the foregoing exposure apparatus (1) and then the foregoing photographic processing are shown in Table H.

The standard point of the optical density to determine the sensitivity was the sum of fog and 0.5 with respect to the density of developed magenta color, and the sensitivity was expressed in terms of the reciprocal of exposure required for achieving said optical density. In case of the storage at $-30°$ C. in the argon-replaced atmosphere, the sensitivities shown in Table H are relative values, with the photosensitive material of sample number 61 being taken as 100.

On the other hand, in cases of the storage in the atmosphere of 80% RH-50° C. and that under the oxygen partial pressure of 10 atm., the sensitivities are also relative values, with each photosensitive material underwent the storage at $-30°$ C. in the argon-replaced atmosphere being taken as 100.

Further, similar results to the above were obtained when the semiconductor laser beam-scanning exposure using the foregoing exposure apparatus (2) was carried out.

EXAMPLE 14

The same photosensitive materials as prepared in Example 13 were processed and tested in the same manner as in Example 13, except that the photographic processing (II) constituted of the following processing steps were carried out using an automatic developing machine, and thereby were obtained results similar to those in Example 13.

Photographic Processing (II):

| Processing Step | Processing Temperature | Processing Time |
| --- | --- | --- |
| Color development | 38° C. | 20 sec. |
| Bleach-Fix | 38° C. | 20 sec. |
| Rinsing (1) | 38° C. | 7 sec. |
| Rinsing (2) | 38° C. | 7 sec. |
| Rinsing (3) | 38° C. | 7 sec. |
| Rinsing (4) | 38° C. | 7 sec. |
| Rinsing (5) | 38° C. | 7 sec. |
| Drying | 65° C. | 15 sec. |

The rinsing steps were carried out according to 5-stage counter current process in the direction of from tank (5) to tank (1).

Every processing time set forth above was intended to include not only dip time, or time spent in dipping a photosensitive material in a processing solution, but also aerial conveyance time, or time needed for conveying the material in the air from the processing solution to the next processing solution after it left there. The proportion of an aerial conveyance time to a processing time in each step, though depended on the size of a developing machine used, was in the range of 5% to 40% in the present invention.

The composition of each processing solution used was as follows.

| Color developer | Tank Solution | Replenisher |
| --- | --- | --- |
| Water | 700 ml | 700 ml |
| Sodium triisopropyl-naphthalene-(β)-sulfonate | 0.1 g | 0.1 g |
| Ethylenediamine tetraacetic acid | 3.0 g | 3.0 g |
| Disaodium 1,2-dihydroxy-benzene-4,6-disulfonate | 0.5 g | 0.5 g |

| Color developer | Tank Solution | Replenisher |
| --- | --- | --- |
| Triethanolamine | 12.5 g | 12.0 g |
| Potassium chloride | 6.5 g | — |
| Potassium bromide | 0.03 g | — |
| Sodium sulfite | 0.1 g | 0.1 g |
| Potassium carbonate | 27.0 g | 27.0 g |
| 4-Amino-N-ethyl-N-(3-hydroxypropyl)-3-methylaniline | 12.8 g | 27.8 g |
| Disodium N,N-bis(sulfonatoethyl)hydroxylamine | 10.0 g | 13.0 g |
| Brightening agent (UVITEX-CK, produced by Ciba Geigy) | 2.0 g | 6.0 g |
| Water to make | 1,000 ml | 1,000 ml |
| pH (25° C.) | 10.05 | 10.95 |

The foregoing replenisher was fed in an amount of 35 ml per $m^2$ of the photosensitive material.

| Bleach-Fix Bath | Tank Solution | Replenisher |
| --- | --- | --- |
| Water | 400 ml | 400 ml |
| Ammonium thiosulfate (70%) | 100 ml | 250 m |
| Ethylenediaminetetrate (70%) acid | 3.4 g | 8.5 g |
| Ammoniumethylene diamine-tetraacetonatoferrate(III) dihydrate | 73.0 g | 183 g |
| Ammonium sulfite | 40 g | 100 g |
| Ammonium bromide | 20.0 g | 50.0 g |
| Nitric acid (67%) | 9.6 g | 24 g |
| Water to make | 1,000 ml | 1,000 ml |
| pH (25° C.) | 5.80 | 5.10 |

The foregoing replenisher was fed in an amount of 35 ml per $m^2$ of the photosensitive material.

Rinsing Baths (Tank solution= Replenisher):

Ion exchange water was used, and each rinsing bath was replenished with 60 ml of ion exchange water per $m^2$ of the photosensitive material.

EXAMPLE 15

Using the above automatic developing machine, the photographic material obtained in Example 13 was processed with the development processing in Example 14 except that N-ethyl-N-(β-methanesulfone-amidoethyl)-3-methyl-4-aminoamiline sulfate was added in 5.0 g of tank solution and 11.5 g of replenisher, instead of 4-amino-N-ethyl-N-(3-hydroxypropyl)-3-methylaniline and disodium-N,N-bis-(sulfonatoethyl)hydroxylamine. The results obtained were similar to those of Example 13. From Examples 13 to 15, it is understood that the inventive dye is highly sensitive and remarkably stable under severe conditions.

EXAMPLE 16

To a water solution containing 72 g of gelatin and 16 g of NaCl, a water solution containing 1 Kg of $AgNO_3$ and a water solution containing 161 g of KBr and 205 g of NaCl were added simultaneously at a constant flow rate over a period of 32 minutes (Br content: 23 mol %). In the fist half of the foregoing addition period, rhodium chloride and $K_3IrCl_6$ were added for 10 minutes so that the quantity of each salt added might amount to $5\times10^{-7}$ mole per mole of Ag.

Subsequently, soluble salts were removed from the thus prepared silver chlorobromide emulsion, and gelatin was added thereto. Then, the emulsion was adjusted to pH 6.0 and pAg 7.5, and thereto were added chloroauric acid and hypo. The resulting emulsion was kept at 60° C. to result in chemical sensitization. The time at which the most highest sensitivity was inducible was selected as chemical sensitization time. The thus sensitized emulsion was admixed with 4-hydroxy-6-methyl- 1,3,3a,7-tetrazaindene as a stabilizer and phenoxyethanol as a preservative.

The thus obtained emulsion was divided into sixteen 1 Kg portions, and thereto were added 110 ml of a 0.05% methanol solution of sensitizing dye, a 0.3% methanol solution of a compound represented by formula (IV) and a 0.5% methanol solution of compound represented by formula (V) in accordance with the formulae shown in Table I. Thereafter, each portion was admixed with 100 mg/m$^2$ of hydroquinone, 85 mg/m$^2$ of 2-bis(vinylsulfonylacetamido)ethane as a hardener and a polyethylacrylate latex as a plasticizer in a proportion of 25% to gelatin contained in each portion, and coated on a polyester support so as to have a silver coverage of 3.7 g/m$^2$ and a gelatin coverage of 2.0 g/m$^2$. Thereon was formed a protective layer containing 0.8 g/m$^2$ of gelatin, 40 mg/m$^2$ of polymethylmethacrylate particles (average particle size: 2.5 μm) as matting agent, 30 mg/m$^2$ of colloidal silica (average particle size: 4 μm), 80 mg/m$^2$ of silicone oil, 80 mg/m$^2$ of sodium dodecylbenzenesulfonate as coating aids, 2 mg/m$^2$ of a surfactant ( 1 ) having the following structural formula, 150 g/m$^2$ of a polyethylacrylate latex and 6 mg/m$^2$ of potassium salt of 1,1'-disulfobutyl-3,3,3',3'-tetramethyl- 5,5'-disulfoindotricarbocyanine.

On the opposite side of the polyester support, each of the thus formed samples was provided with a backing layer and a back protecting layer. The compositions of these layers are described below.

| Backing Layer | |
|---|---|
| Gelatin | 2.4 g/m$^2$ |
| Sodium dodecylbenzenesulfonate | 60 mg/m$^2$ |
| Dye (2) | 80 mg/m$^2$ |
| Dye (3) | 30 mg/m$^2$ |
| Potassium salt of 1,1'-disulfobutyl-3,3,3',3'-tetramethyl-5,5'-disulfo-indotricarbocyanine | 80 mg/m$^2$ |
| Potassium 1,3-divinylsulfonyl-2-propanol | 60 mg/m$^2$ |
| Potassium polyvinylbenzenesulfonate | 30 mg/m$^2$ |
| Back Protecting Layer | |
| Gelatin | 0.75 g/m$^2$ |
| Polymethylmethacrylate (average particle size: 3.5 μm) | 40 mg/m$^2$ |
| Sodium dodecylbenzenesulfonate | 20 mg/m$^2$ |
| Surfactant (1) | 2 mg/m$^2$ |
| Silicone oil | 100 mg/m$^2$ |

Surfactant (1)
C$_8$F$_{17}$SO$_2$N(C$_3$H$_7$)CH$_2$COOK

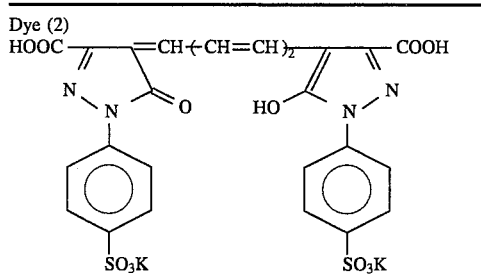

Dye (2)

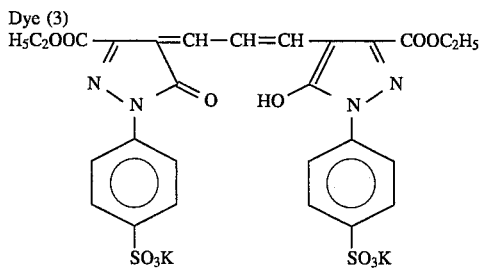

Dye (3)

The thus obtained samples each was subjected to scanning exposure using a semiconductor laser device capable of emitting light of 780 nm, and then successively to 14 seconds' development at 38° C., fixation, washing and drying by means of an automatic developing apparatus, Auto Processor Model FG-310PTS, made by Fuji Photo Film Co., Ltd., using a developer and fixer having the following compositions, thereby performing sensitometry.

The sensitivity defined as the reciprocal of the exposure required for attaining a density of 3.0 and for the fog density of the samples was examined and results thereof are shown in Table I. The sensitivities shown in Table I are relative values.

| Contents of Developer | |
|---|---|
| Water | 720 ml |
| Disodium ethylenediaminetetraacetate | 4 g |
| Sodium hydroxide | 44 g |
| Sodium sulfite | 45 g |
| 2-Methylimidazole | 2 g |
| Sodium carbonate | 26.4 g |
| Boric acid | 1.6 g |
| Potassium bromide | 1 g |
| Hydroquinone | 36 g |
| Diethylene glycol | 39 g |
| 5-Methyl-benzotriazole | 0.2 g |
| Pyrazon | 0.7 g |
| Water to make | 1 l |
| Contents of Fixer | |
| Ammonium thiosulfate | 170 g |
| Sodium sulfite (anhydrous) | 15 g |
| Boric acid | 7 g |
| Glacial acetic acid | 15 ml |
| Potassium alum | 20 g |
| Ethylenediaminetetraacetic acid | 0.1 g |
| Tartaric acid | 3.5 g |
| Water to make | 1 l |

TABLE I

| Sample No. | Sensitizing Dye No. | Amount added ml/Kg emulsion | Compound of Formula (IV) | Compound of Formula (V) | Relative Sensitivity | Fog | Note |
|---|---|---|---|---|---|---|---|
| 71 | I-3 | 70 | — | — | 100* | 0.05 | Invention |
| 72 | " | 100 | — | — | 83 | 0.05 | " |
| 73 | " | 70 | IV-1 | V-2 + V-6 | 245 | 0.05 | " |
| 74 | " | 100 | " | " | 275 | 0.05 | " |
| 75 | S-4 | 70 | — | — | 79 | 0.05 | Comparison |
| 76 | " | 100 | — | — | 68 | 0.05 | " |
| 77 | " | 70 | IV-1 | V-2 + V-6 | 134 | 0.05 | " |
| 78 | " | 100 | " | " | 155 | 0.05 | " |
| 79 | I-18 | 70 | — | — | 83 | 0.05 | Invention |
| 80 | " | 100 | — | — | 74 | 0.05 | " |
| 81 | " | 70 | IV-1 | V-2 + V-6 | 168 | 0.05 | " |
| 82 | " | 100 | " | " | 174 | 0.05 | " |
| 83 | S-6 | 70 | — | — | 68 | 0.05 | Comparison |
| 84 | " | 100 | — | — | 54 | 0.05 | " |
| 85 | " | 70 | IV-1 | V-2 + V-6 | 110 | 0.05 | " |
| 86 | " | 100 | " | " | 109 | 0.05 | " |

*Standard

As can be clearly seen from Table I, the sensitizing dyes of the present invention produced great sensitizing effect.

EXAMPLE 17

Preparation of Antihalation Layer

To a solution containing 80 g of gelatin in 1 l of water were added 80 ml of a 5% water solution of poly(diethylaminoethylmethacrylate), 15 ml of a 20% water solution of saponin, 100 ml of a 1% water solution of chrome alum and 30 ml of a 3% water solution of Methine Dye I-19 to prepare a dye-gelatin solution.

The dye-gelatin solution was coated on a cellulose acetate photographic support to form an antihalation layer.

Thereon was coated a silver chlorobromide emulsion (silver bromide content: 17 mol %) which had undergone panchromatic spectral sensitization using anhydro-1,1-ethyl-3,3'-bis(sulfopropyl)-naphtho[1,2-d] thiacarbocyanine hydroxide and 9-ethyl-3,3'-bis(sulfobutyl)selenacarbocyanine hydroxide in combination. On the thus formed emulsion layer, a protective gelatin solution was provided to prepare a photographic material for graphic arts.

A contact screen (133 lines/inch) was brought into close contact with the thus obtained photographic material, and subjected to optical wedge exposure. Then, the photographic material was developed at 20° C. for 3 min. using a developer having the following composition, and further subjected successively to fixation, washing and drying operations.

| Composition of Developer | |
|---|---|
| Water | 500 ml |
| Anhydrous sodium sulfite | 30 g |
| Paraformaldehyde | 7.5 g |
| Sodium hydrogen sulfite | 2.2 g |
| Boric acid | 7.5 g |
| Hydroquinone | 22.0 g |
| Potassium bromide | 1.6 g |
| Water to make | 1 l |

Stains were rarely found in the unexposed area of the thus processed photographic material. In addition, a halftone image having excellent edge gradient was obtained.

EXAMPLE 18

A heat developable color photosensitive material was prepared in accordance with an embodiment of the present invention.

Preparation of Emulsion (C):

To a vigorously stirred aqueous gelatin solution (the composition of which are shown in Table J), the solutions (I) and (II) (the compositions of which are shown in Table K) were added simultaneously over a 18-minute period. After a 5-minute lapse from the conclusion of the addition, the solutions (III) and (IV) (the compositions of which are also shown in Table K) were further added simultaneously over a 42-minute period. After desalting with a sedimenting agent illustrated below and subsequent washing steps (pH=4.1), the obtained emulsion was mixed with 22 g of gelatin, adjusted to pH 6.1 and pAg 7.6 (measured at 40° C.) using aqueous NaCl and NaOH solutions, and then chemically sensitized to the optimum extent by the addition of triethylurea and 4-hydroxy-6-methyl-1,3,3a,7-tetrazaindene. The expression "the optimum extent" as used herein means the condition under which the sensitivity induced is highest, provided that no fog is generated. Thus, 635 g of a monodisperse cubic silver chlorobromide emulsion having an average grain size of 0.26 μm and a variation coefficient of 8.5% was obtained.

Sedimenting Agent

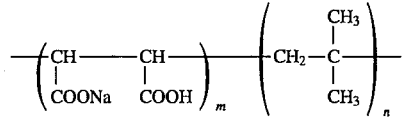

TABLE J

| Composition of Gelatin Aqueous Solution | |
|---|---|
| $H_2O$ | 620 ml |
| Gelatin | 20 g |
| KBr | 0.03 g |
| NaCl | 2.00 g |
| $H_2SO_4$ (1N) | 16 ml |
| Compound (Cpd-11) | 0.015 g |
| pH | 3.9 |
| Temperature | 45° C. |

Compound (Cpd-11)

TABLE J-continued

Composition of Gelatin Aqueous Solution

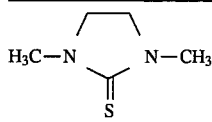

TABLE K

|  | Solution I | Solution II | Solution III | Solution IV |
|---|---|---|---|---|
| $AgNO_3$ | 30.0 g | — | 70.0 g | — |
| KBr | — | 13.7 g | — | 44.1 g |
| NaCl | — | 3.6 g | — | 2.4 g |
| $K_2IrCl_6$ | — | — | — | $4.0 \times 10^{-5}$ g |
| Water to make | 150.0 ml | 150.6 ml | 350.2 ml | 360.1 ml |

Preparation of Emulsion (D):

Another emulsion (D) was prepared in the same manner as the emulsion (C) described above, except that 80 ml of a 0.5% methanol solution of Sensitizing Dye (S- 7) was added in all at the conclusion of the addition of the solutions I and II, and that sodium thiosulfate was used in place of triethylthiourea as sulfur sensitizer. Thus, 635 g of a monodisperse emulsion comprising silver chlorobromide grains having the crystal shape of a slightly distorted cube, faces of which were near to a rectangle, an average grain size of 0.31 μm and a variation coefficient of 10.2% was obtained.

Next, gelatin dispersions of dye-providing compounds were prepared in the following manners:

14.64 g of a magenta dye-providing compound (DeM), 0.81 g of a reducing agent (Cpd-15), 0.20 g of a mercapto compound (Cpd-13), 0.38 g of a surfactant (Cpd- 18) and 5.1 g of a high boiling solvent (Solv-8) were weighed out, and thereto was added 70 ml of ethyl acetate. The mixture was heated to about 60° C. to prepare a homogeneous solution. The solution was mixed with 100 g of a 10% aqueous solution of lime-processed gelatin and 60 ml of water, and stirred. Thereafter, the mixture was further mechanically dispersed for 10 min. with a homogenizer rotating at 10,000 rpm. Thus, a dispersion of magenta dye-providing compound was obtained.

7.3 g of a cyan dye-providing compound (DEC1), 10.6 g of a cyan dye-providing compound (DEC2), 1.0 g of a reducing agent (Cpd-15), 0.30 g of a mercapto compound (Cpd-13), 0.38 g of a surfactant (Cpd-18) and 9.8 g of a high boiling solvent (Solv-3) were weighed out, and thereto was added 50 ml of ethyl acetate. The mixture was heated to about 60° C. to prepare a homogeneous solution. The solution was mixed with 100 g of a 10% aqueous solution of lime-processed gelatin and 60 ml of water, and stirred. Thereafter, the mixture was further mechanically dispersed for 10 min. with a homogenizer rotating at 10,000 rpm. Thus, a dispersion of cyan dye-providing compounds was obtained.

18.75 g of a yellow dye-providing compound (DeY), 1.0 g of a reducing agent (Cpd-15), 0.12 g of a mercapto compound (Cpd-13), 1.5 g of a surfactant (Cpd- 18), 7.5 g of a high boiling solvent (Solv-8) and 2.1 g of a dye (F) were weighed out, and thereto was added 45 ml of ethyl acetate. The mixture was heated to about 60° C. to prepare a homogeneous solution. The solution was mixed with 100 g of a 10% aqueous solution of lime-processed gelatin and 60 ml of water, and stirred. Thereafter, the mixture was further mechanically dispersed for 10 min. with a homogenizer rotating at 10,000 rpm. Thus, a dispersion of yellow dye-providing compound was obtained.

Using these emulsions and dispersions, a heat developable color photosensitive material 87 having a constitution set forth in Table L was prepared. Therein, sensitizing dyes were added to their respective emulsions, other than that for forming the fifth layer, at the time of preparation of coating compositions. To the emulsion for the fifth layer, the sensitizing dye corresponding thereto was added at the time of grain formation. Those sensitizing dyes were added in their respective amounts determined as optimum for inducing the highest sensitivity.

TABLE L

Constitution of Photosensitive Material 87

| Ordinal Number of Layer | Name of Layer | Ingredient | Coverage (g/m²) |
|---|---|---|---|
| 7th | Protective layer | Gelatin | 0.264 |
|  |  | Matting agent | 0.018 |
|  |  | Zinc hydroxide | 0.964 |
|  |  | Surfactant (Cpd-16) | 0.028 |
|  |  | Surfactant (Cpd-17) | 0.011 |
|  |  | Water-soluble polymer (P-1) | 0.004 |
| 6th | Interlayer | Gelatin | 0.762 |
|  |  | Surfactant (Cpd-16) | 0.007 |
|  |  | Surfactant (Cpd-17) | 0.022 |
|  |  | Water-soluble polymer (P-1) | 0.016 |
| 5th | Red-sensitive (670 nm) emulsion layer | Emulsion (D) | 0.321* |
|  |  | Sensitizing dye (S-7) | 0.0013 |
|  |  | Magenta dye-providing compound (DeM) | 0.2845 |
|  |  | High boiling solvent (Solv-8) | 0.100 |
|  |  | Reducing agent (Cpd-15) | 0.016 |
|  |  | Mercapto cpd. (Cpd-14) | 0.0003 |
|  |  | Mercapto cpd. (Cpd-13) | 0.004 |
|  |  | Surfactant (Cpd-18) | 0.007 |
|  |  | Gelatin | 0.297 |
|  |  | Antifoggant (1) | 0.003 |
|  |  | Water-soluble polymer (P-1) | 0.007 |
| 4th | Interlayer | Hardener (Cpd-20) | 0.058 |
|  |  | Gelatin | 0.629 |
|  |  | Surfactant (Cpd-16) | 0.009 |
|  |  | Surfactant (Cpd-19) | 0.046 |
|  |  | Water-soluble polymer (P-1) | 0.012 |
| 3rd | Near infrared-sensitive (750 nm) emulsion layer | Emulsion (C) | 0.320* |
|  |  | Sensitizing dye (S-10) | $5.8 \times 10^{-5}$ |
|  |  | Cyan dye-providing compound (DeC1) | 0.132 |
|  |  | Cyan dye-providing compound (DeC2) | 0.193 |
|  |  | High boiling solvent (Solv-3) | 0.178 |
|  |  | Reducing agent (Cpd-15) | 0.018 |
|  |  | Mercapto cpd. (Cpd-13) | 0.005 |
|  |  | Surfactant (Cpd-18) | 0.007 |
|  |  | Gelatin | 0.284 |
|  |  | Mercapto cpd. (Cpd-14) | 0.0003 |
|  |  | Stabilizer (IV-1) | 0.0043 |
|  |  | Water-soluble polymer (P-1) | 0.010 |
| 2nd | Interlayer | Gelatin | 0.629 |
|  |  | Surfactant (Cpd-16) | 0.006 |
|  |  | Surfactant (Cpd-19) | 0.057 |
|  |  | Water-soluble polymer (P-1) | 0.009 |
| 1st | Infrared-sensitive (810 nm) layer | Emulsion (C) | 0.340 |
|  |  | Mercapto cpd. (Cpd-14) | $8.4 \times 10^{-4}$ |
|  |  | Sensitizing dye (S-11) | $1.1 \times 10^{-4}$ |
|  |  | Yellow dye-providing | 0.429 |

TABLE L-continued

Constitution of Photosensitive Material 87

| Ordinal Number of Layer | Name of Layer | Ingredient | Coverage (g/m²) |
|---|---|---|---|
| | | compound (DeY) | |
| | | Dye (F) | 0.049 |
| | | High boiling solvent (Solv-3) | 0.172 |
| | | Reducing agent (Cpd-15) | 0.023 |
| | | Mercapto cpd. (Cpd-13) | 0.003 |
| | | Surfactant (Cpd-18) | 0.034 |
| | | Gelatin | 0.338 |
| | | Stabilizer (IV-1) | 0.0054 |
| | | Water-soluble polymer (P-1) | 0.014 |

Support: (120 μm-thick neutralized paper laminated with polyethylene)
*coverage based on silver.

Structural formulae of the compounds set forth in Table L, including those used for preparation of the gelatin dispersions of dye providing compounds, are illustrated below.

Magenta dye-providing compound (DeM)

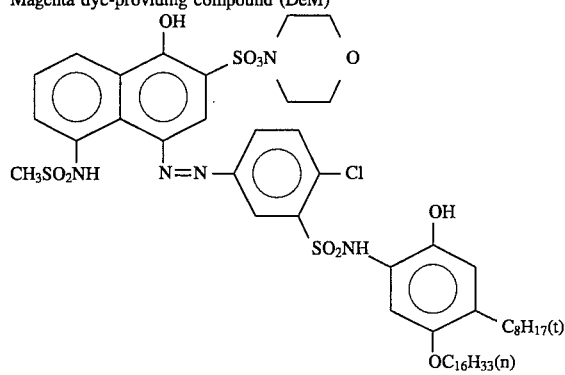

Cyan dye-providing compound (DeC1)

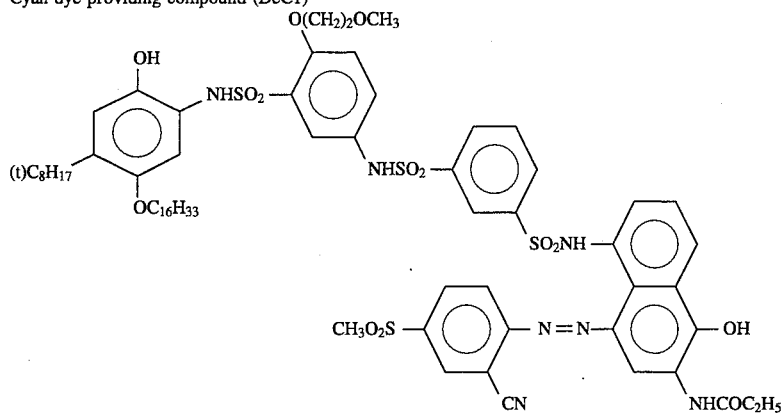

Cyan dye-providing compound (DeC2)

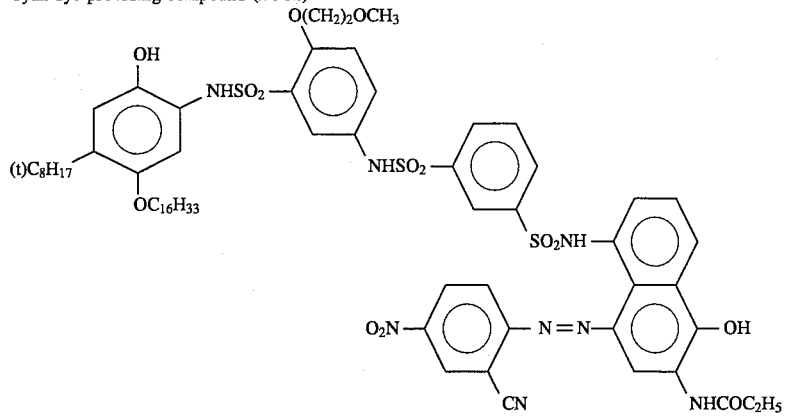

Yellow dye-providing compound (DeY)

-continued

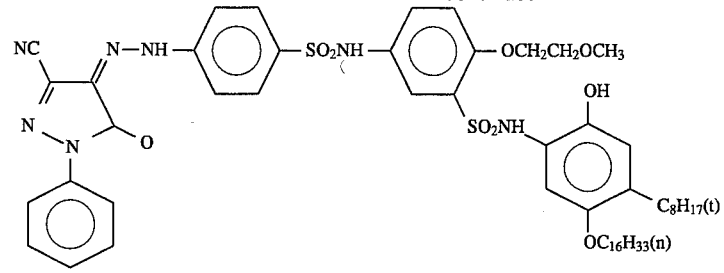

Mercapto compound (Cpd-13)　　Mercapto compound (Cpd-14)　　Reducing agent (Cpd-15)

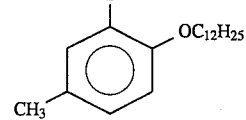 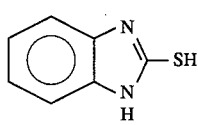 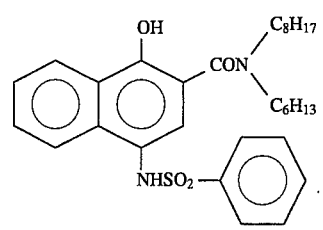

Surfactant (Cpd-16)　　Surfactant (Cpd-17)　　Surfactant (Cpd-18)

Aerosol OT　　$C_{13}H_{27}CONHCH_2CH_2CH_2-\overset{\overset{\displaystyle CH_3}{|}}{\underset{\underset{\displaystyle CH_3}{|}}{N^{\oplus}}}-CH_2COO^{\ominus}$　　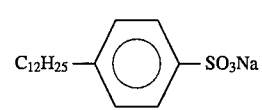

Surfactant (Cpd-19)　　Hardener (Cpd-20)

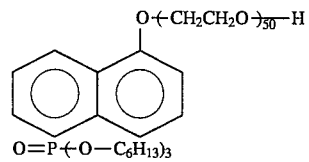　　$CH_2=CHSO_2CH_2\underset{\underset{\displaystyle OH}{|}}{CHCH}_2SO_2SO_2CH=CH_2$ High boiling solvent (Solv-8)

Sensitizing dye (S-10)

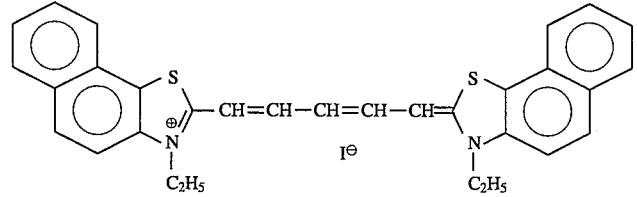

Sensitizing dye (S-11)

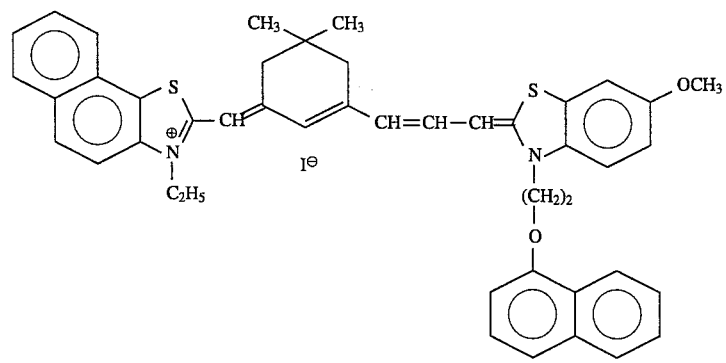

Dye (F)

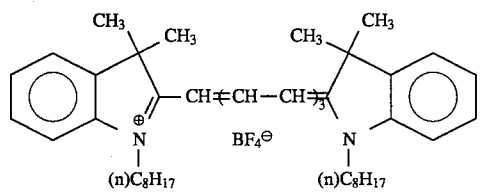

-continued

Water-soluble polymer (P-1)

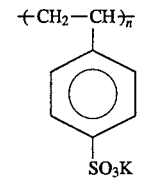

Additionally, Antifoggant (1) was benzotriazole, and the matting agent used was colloidal silica (average grain size: 3 μm).

Another comparative photosensitive material 88 was prepared in the same manner as the photosensitive material 87 described above, except that the sensitizing dye (S-4) illustrated hereinbefore was added after the addition of triethylthiourea and 4-hydroxy-6-methyl-( 1,3,3a,7)-tetrazaindene and stirred for 30 minutes at 70° C., but the sensitizing dye (S-10) was not added upon coating. The coverage of the sensitizing dye (S-4) was $8.5 \times 10^{-4}$ g/m².

In accordance with an embodiment of the present invention, a photosensitive material 89 was prepared as follow.

The photosensitive material was prepared in the same manner as the photosensitive material 88, except that the sensitizing dye I-3 was incorporated in the emulsion for the third layer in place of the sensitizing dye S-4. Therein, a coverage of the sensitizing dye (I-3) was $8.5 \times 10^{-4}$ g/m².

Separately, a dye-fixing material having the constitution described in Table M on a paper support laminated with polyethylene was prepared.

TABLE M

| | Ingredient | Coverage (g/m²) |
|---|---|---|
| 3rd Layer | Gelatin | 0.05 |
| | Silicone oil *1 | 0.04 |
| | Surfactant *2 | 0.001 |
| | Surfactant *3 | 0.02 |
| | Surfactant *4 | 0.10 |
| | Guanidine picolinate | 0.45 |
| | Polymer *5 | 0.24 |
| 2nd Layer | Mordant *6 | 2.35 |
| | Polymer *7 | 0.60 |
| | Gelatin | 1.40 |
| | Polymer *5 | 0.21 |
| | High boiling solvent *8 | 1.40 |
| | Guanidine picolinate | 1.80 |
| | Surfactant *2 | 0.02 |
| 1st Layer | Gelatin | 0.45 |
| | Surfactant *4 | 0.01 |
| | Polymer *5 | 0.04 |
| | Hardener *9 | 0.30 |
| Support 170 μm-thick paper laminated with polyethylene | | |
| 1st Backing Layer | Gelatin | 3.25 |
| | Hardener *9 | 0.25 |
| 2nd Backing Layer | Gelatin | 0.44 |
| | Silicone oil *1 | 0.08 |
| | Surfactant *2 | 0.022 |
| | Matting agent *10 | 0.09 |
| | Surfactant *11 | 0.01 |

The compounds used for constituting the dye-fixing material are illustrated below.

Silicone oil*1

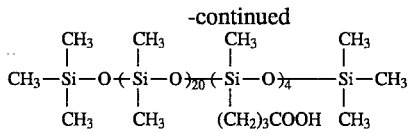

Surfactant*2
Aerosol OT

Surfactant*3

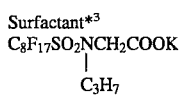

Surfactant*4

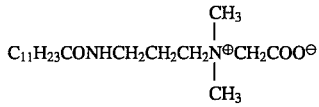

Surfactant*11

C₃H₇
|
C₈F₁₇SO₂N(CH₂CH₂O)ₙ(CH₂)₄SO₃Na (n: about 4)

Mordant*6

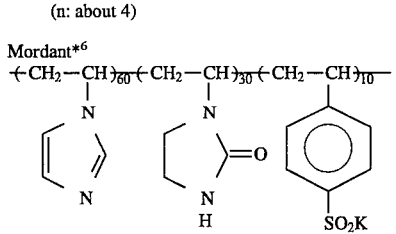

Hardener*9

(CH₂)₄(O—CH₂—CH——CH₂)₂
         \O/

Additionally, the polymers, the high boiling solvent and the matting agent used therein were as follows:
Polymer *5: Vinyl alcohol-sodium acrylate copolymer (75/25 by mole)
Polymer *7: Dextran (molecular weight: 70,000)
High boiling solvent *8: Reofos 95 (products of Ajinomoto Co., Ltd.)
Matting agent *10: Benzoguanamine resin (proportion of grains having a size greater than 10 μm: 18 vol %)

Each of the thus prepared color photosensitive materials 87, 88 and 89 was evaluated by carrying out the following exposure and photographic processing.

Exposure was carried out using the laser exposure apparatus disclosed in JP-A-02-129625 under the condition shown in Table N.

To the emulsion face of each of the exposed photosensitive materials, 12 ml/m² of water was supplied using a wire bar. Immediately thereafter, the water-supplied face and the image-fixing material described above were superposed so as to be in face-to-face contact with each other. The superposed materials were heated for 20 sec. using a heat drum a temperature of which was controlled so that a temperature of the water-absorbed layer might become 90° C., and then the photosensitive material was peeled apart from the image-fixing material. Thus, images were obtained on the image-receiving material.

TABLE N

| | |
|---|---|
| Beam intensity on the surface of a photosensitive material | 1 mW |
| Scanning line density | 800 dpi (32 rasters/mm) |
| Beam diameter | 100 ± 10 μm in the main scanning direction 80 ± 10 μm in the subscanning direction |
| Exposure time | 0.9 msec per raster |
| Exposure wavelengths | 670, 750 and 810 μm (laser beams) |
| Exposure | change by 1 logE per 2.5 cm in the sub-scanning direction (max.: 80 erg/cm², min.: 1.2 erg/cm²) |
| Method of changing exposure | light-emission time modulation |

The transfer density was measured with an automatic densitometer, and fog and sensitivity (defined as the reciprocal of the exposure required for attaining the density fog + 1.0) were determined.

Spectral sensitivities were examined by exposing each photosensitive material for 5 seconds to a series of monochromatic rays through an optical wedge and carrying out the above-described photographic processing operations.

For the purpose of evaluating the extent of cyan stain generated in the yellow color region due to exposure to the ray of 810 nm, a ratio of the spectral sensitivity of the cyan color forming layer to the ray of 750 nm, $S_{750}$, to the spectral sensitivity thereof to the ray of 810 nm, $S_{810}$, that is, a $S_{750}/S_{810}$ ratio, was examined. The greater this ratio, the less the stain, namely the better the color separation.

The evaluation of freshness keeping quality was made by comparing photographic characteristics of a fresh sample with those of the sample aged by standing in an atmosphere of 60° C. to 60% RH for 3 days after coating.

Therein, both fresh and aged samples were examined for sensitivity and fog, and the sensitivity of the fresh sample of the photosensitive material 87 was taken as 100.

In accordance with the above-described manner, the photosensitive materials 87, 88 and 89 were examined for the wavelength at which the cyan color-forming layer had the maximum spectral sensitivity, the spectral sensitivity ratio $S_{750}/S_{810}$, sensitivity and fog. The results obtained are shown in Table O.

TABLE O

| Sensitive material | Maximum spectral sensitivity wavelength | $S_{750}/S_{810}$ | Just after coating | | After 3-day standing | |
|---|---|---|---|---|---|---|
| | | | Sensitivity | Fog | Sensitivity | Fog |
| 87 (Comparison) | 735 nm | 178 | 100 | 0.12 | 125 | 0.18 |
| 88 (Comparison) | 710 nm | —* | 47 | 0.12 | 33 | 0.12 |
| 89 (Invention) | 740 nm | 3548 | 152 | 0.12 | 159 | 0.12 |

*: Spectral sensitivity to 810 nm was too low to measure

It can be seen from Table O that the photosensitive material of the present invention had high sensitivity, excellent freshness keeping quality, and highly satisfactory color separation.

In a system of using silver halide photographic emulsions, the compounds represented by formula (I) are useful as spectral sensitizer, and can also be used as dyes.

The combined use of the compounds of formula (I) with particular supersensitizers can induce very high spectral sensitivities in silver halide photographic emulsion systems, and the photographic sensitivity and the stability (especially those relating to spectral sensitivity and fog) achieved by the silver halide photographic materials containing the compounds of the formula (I) are superior to results obtained by conventional materials.

While the invention has been described in detail and with reference to specific embodiments thereof, it will be apparent to one skilled in the art that various changes and modifications can be made therein without departing from the spirit and scope thereof.

What is claimed is:

1. A silver halide photographic material comprising on a support at least one silver halide emulsion and comprising at least one methine dye represented by formula (II):

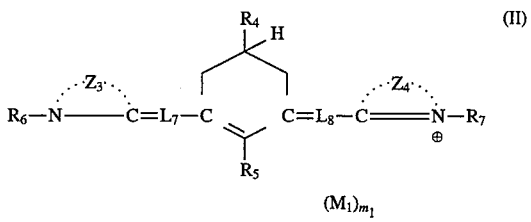

wherein $Z_3$ and $Z_4$ each represents atoms necessary to complete a benzothiazole or naphthothiazole ring, provided that when both of $Z_3$ and $Z_4$ are benzothiazole rings, both of said benzothiazole rings contain an electron donating substituent group at the 5- and/or 6-position of the benzothiazole ring; $R_4$ and $R_5$ each represents an alkyl group, an aryl group or a heterocyclic group; $R_6$ and $R_7$ each represents an alkyl group; $L_7$ and $L_8$ each represents a methine group; $M_1$ represents an ion for neutralizing electric charges; and $m_1$ is a number of the ion, including 0, necessary for neutralizing electric charges in a dye molecule.

2. A silver halide photographic material as in claim 1, wherein the material further comprises a compound represented by formula (IV):

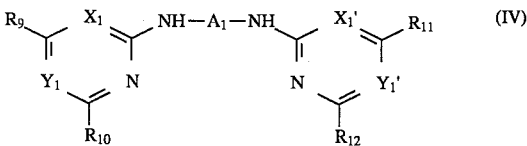

wherein $A_1$ represents a divalent aromatic group; $R_9$, $R_{10}$, $R_{11}$, and $R_{12}$ each represents a hydrogen atom, a hydroxyl group, an alkyl group, an alkoxy group, an aryloxy group, a halogen atom, a heterocyclic ring nucleus, an alkylthio group, a heterocyclylthio group, an arylthio group, an amino group, an alkylamino group, an arylamino group, a heterocyclylamino group, an aralkylamino group, an aryl group or a mercapto group; $X_1$ and $Y_1$, $X_1'$ and $Y_1'$ each represents —CH= or —N=, provided that at least one of $X_1$ or $Y_1$ and at least one of $X_1'$ or $Y_1'$ represents —N=.

3. A silver halide photographic material as in claim 2, wherein the material further comprises a compound of formula (V):

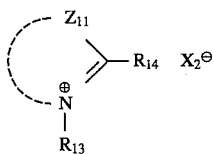 (V)

wherein $Z_{11}$ represents a group of non-metal atoms necessary to complete a 5- or 6-membered nitrogen-containing heterocyclic ring; $R_{13}$ represents a hydrogen atom, an alkyl group or an alkenyl group; $R_{14}$ represents a hydrogen atom, a methyl group or an ethyl group; and $X_2$ represents an acid anion.

4. A silver halide photographic material as in claim 2, wherein the material further comprises a compound of formula (VI):

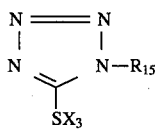 (VI)

wherein $R_{15}$ represents an alkyl group, an alkenyl group or an aryl group; and $X_3$ represents a hydrogen atom, an alkali metal atom, an ammonio group or a group that can be converted to a hydrogen atom or to an alkali metal under alkaline conditions.

5. A silver halide photographic material as in claim 1, wherein the material further comprises a compound of formula (V):

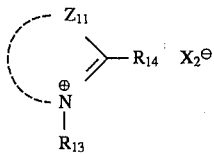 (V)

wherein $Z_{11}$ represents a group of non-metal atoms necessary to complete a 5- or 6-membered nitrogen-containing heterocyclic ring; $R_{13}$ represents a hydrogen atom, an alkyl group or an alkenyl group; $R_{14}$ represents a hydrogen atom, a methyl group or an ethyl group; and $X_2$ represents an acid anion.

6. A silver halide photographic material as in claim 1, wherein the material further comprises a compound of formula (VI):

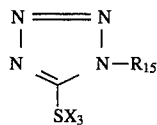 (VI)

wherein $R_{15}$ represents an alkyl group, an alkenyl group or an aryl group; and $X_3$ represents a hydrogen atom, an alkali metal atom, an ammonio group or a group that can be converted to a hydrogen atom or to an alkali metal under alkaline conditions.

7. A silver halide photographic material as in claim 1, wherein the material further comprises a compound of formula (VII):

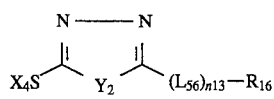 (VII)

wherein $Y_2$ represents an oxygen atom, a sulfur atom, >NH, or >N-$(L_{57})_{n14}$—$R_{17}$; $L_{56}$ and $L_{57}$ each represents a divalent linkage group; $R_{16}$ and $R_{17}$ each represents a hydrogen atom, an alkyl group, an alkenyl group or an aryl group; $X_4$ represents a hydrogen atom, an alkali metal atom, an ammonio group or a group that can be converted to a hydrogen atom or to an alkali metal under alkali conditions; and $n_{13}$ and $n_{14}$ each represents 0 or 1.

8. A silver halide photographic material as in claim 1, wherein the electron donating substituent group is methyl, methoxy or ethoxy.

9. A silver halide photographic material as in claim 8, wherein $Z_3$ and $Z_4$ each represents atoms necessary to complete a benzothiazole ring having the electron donating substituent group at the 5- and/or 6-position of the benzothiazole ring.

* * * * *